(12) United States Patent
Lin

(10) Patent No.: US 7,831,895 B2
(45) Date of Patent: Nov. 9, 2010

(54) UNIVERSAL ERROR CONTROL CODING SYSTEM FOR DIGITAL COMMUNICATION AND DATA STORAGE SYSTEMS

(75) Inventor: Shu Lin, Cerritos, CA (US)

(73) Assignee: Communications Coding Corporation, Cerritos, CA (US)

( * ) Notice: Subject to any disclaimer, the term of this patent is extended or adjusted under 35 U.S.C. 154(b) by 1141 days.

(21) Appl. No.: 11/492,383

(22) Filed: Jul. 25, 2006

(65) Prior Publication Data

US 2008/0126908 A1     May 29, 2008

(51) Int. Cl.
G06F 11/00 (2006.01)
H03M 13/00 (2006.01)

(52) U.S. Cl. ..................................... 714/800
(58) Field of Classification Search .................. 714/752, 714/755, 786, 800
See application file for complete search history.

(56) References Cited

U.S. PATENT DOCUMENTS 7,543,212 B2 * 6/2009 Miles et al. .................. 714/752

OTHER PUBLICATIONS

Marc P. Fossorier, Quasi-Cyclic low density parity check codes from circulant permutation matrices, Aug. 2004, IEEE Trans. on Info. Theory, vol. 50, No. 8, pp. 1788-1793.*
Jayabalan et al., An improved Quasi0Cyclic low density parity check codes for memory channels, 2004, IEEE, pp. 2544-2548.*
Tanner et al., LDPC block and convolutional codes based on Circulant matrices, Dec. 2004, IEEE, Trans. on Info. Theory, vol. 50, No. 12, pp. 2966-2984.*

* cited by examiner

*Primary Examiner*—Shelly A Chase
(74) *Attorney, Agent, or Firm*—Patton Boggs LLP

(57) ABSTRACT

The universal forward error-correction coding system provides adjustable code rates and coding gains to greatly benefit the design of many modern digital communications (data storage) systems. The channel encoding and decoding methods are universal such that a single encoder and a single decoder can be used to implement all the forward error-correction codes of different code rates. This universal forward error-correction coding system also includes a novel systematic code generation procedure that has the capability of generating many classes of codes that provide the best balance between coding gain performance and implementation complexity.

17 Claims, 17 Drawing Sheets

UNIVERSAL ERROR CONTROL CODING SYSTEM FOR DIGITAL COMMUNICATION AND DATA STORAGE SYSTEMS

FIELD OF THE INVENTION

This invention relates to error control coding of data in data communication and data storage systems.

BACKGROUND OF THE INVENTION

It is a problem in the field of data communication and data storage systems that the demand for efficiency and reliability is driven by the need to exchange and store the vast amounts of data generated in modern information societies. The transmission of information across a wired or wireless communication channel, as well as the storage and retrieval of information using a magnetic or optical medium, are processes where the information is always subject to corruption by distortion and noise. Signals conveying the information can be so contaminated in this process that errors occur in the recovered information. Since the distortions and noise encountered over any communication channel or storage medium cannot be completely eliminated, these systems must be designed to control the effect of the errors so that the information transmitted or stored can be reliably recovered.

In 1948, Shannon's landmark channel coding theorem showed that, with proper channel encoding and decoding, the probability of errors induced by a noisy transmission channel or storage medium can be reduced to any desired level, provided that the information transmission rate is less than an upper limit defined by the channel, called the channel capacity. Channel encoding allows a certain level of errors caused by the noise to be correctable by the channel decoder and is often referred to as forward error-correction coding (FEC). The need for powerful forward error-correction coding techniques having a high level of error correction capability, as well as efficient encoding and decoding implementations, has become critically important in the design of modern digital communications and storage systems.

Because of their many similarities, typical digital communications and data storage systems can be specified in terms of the block diagram shown in FIG. 1. A sequence of information bits is transmitted across a channel or written into a storage medium. The channel encoder transforms this sequence of information bits into an encoded bit sequence or code sequence to enable the correction of errors. This is done by introducing redundant bits into the code sequence in a controlled manner. There are basically two classes of channel codes: block codes and convolutional codes. In a block code, the sequence of information bits is divided into successive non-overlapping blocks of length k, and each information block is encoded independently into a codeword of length n bits, resulting in a code rate of $r=k/n$. The set of $2^k$ codewords, each of blocklength equal to n, is called an (n,k) block code. Block codes that have been widely used include Golay, BCH, and Reed-Solomon codes, as well as low density parity check (LDPC) codes. In a convolutional code, the encoder also processes a sequence of successive blocks of k information bits and produces a code sequence consisting of a sequence of successive n-bit code blocks. However, each encoded block of n bits depends not only on the corresponding k-bit information block occurring at the same time but also on m previous information blocks. Hence, the encoder has a memory of order m, which is often specified in terms of a code constraint length $K=m+1$. The code rate is again equal to $r=k/n$. Thus, the encoder maps the entire sequence of information bits into a single code sequence. While the sequence of information bits to be encoded may be of variable length in convolutional coding, it can also be set to a fixed length. In the latter case, the convolutional code can be viewed as a (possibly long block-length) block code. A rate $-½$ and constraint length $K=7$ convolutional code has been used in many applications, as well as the more powerful turbo coding method using either parallel or serial concatenated convolutional codes.

Discrete symbols are generally not suitable for transmission over a wireline or wireless channel or for recording directly on a magnetic or optical storage medium. The role of the digital modulator (or data recording unit for storage) is to transfer the code sequence at the output of the channel encoder into a sequence of analog waveforms of some fixed duration T that is suitable for transmission (or for recording). Single carrier modulation waveforms are often used, such as binary phase shift keying (BPSK) and quadrature phase shift keying (QPSK), which modulate only the phase of a sinusoidal carrier, and quadrature amplitude modulation (QAM), which modulates both the carrier amplitude and phase. The digital modulator may also be used to map code sequences into multi-carrier modulation waveforms. In these systems, an Inverse Fast Fourier Transform (IFFT) processing is performed by the digital modulator to generate the transmission waveforms. In optical fiber networks, transmission waveforms are generated at the digital modulator by modulating a laser light source on and off. In storage applications, the recording unit generates the binary signal waveforms that are written on the storage medium.

The waveform output of the digital modulator enters the physical transmission channel for propagation to the receiver (or recorded on the storage medium). Waveforms transmitted across either wireline or wireless channels are subject to corruption in a variety of ways, for example, by thermal noise, inter-symbol interference, crosstalk interference from other transmissions, multi-path propagation, signal fading, etc. Storage media can be contaminated by media surface defects as well as dust particles, and may also experience intersymbol interference and recording noise at high storage bit densities. These disturbances introduced by the transmission channel (or storage medium) cause errors, which must be corrected by the channel decoder using the error correction capability of the forward error-correction code.

The channel decoder must employ digital processing to be able to efficiently correct errors introduced by the channel in an optimum manner to minimize the probability of decoding error. The role of the digital demodulator (or storage data reading unit) is to convert the analog waveform output of the channel (or storage medium) into a digital form that can be processed by the channel decoder. A hard-decision demodulator attempts to directly reconstruct the transmitted code sequence and outputs this reconstructed code sequence to the channel decoder. A soft-decision demodulator outputs a quantitized digital version of a reconstructed transmitted modulation signal to the channel decoder. This reconstruction process can be designed to maximize signal-to-noise ratio and may include signal equalization to remove intersymbol interference introduced by the channel (or storage medium). In multi-carrier systems, such as orthogonal frequency division multiplexed (OFDM) and discrete multi-tone (DMT) modulations, the digital demodulator also includes the Fast Fourier Transform (FFT) processing that inverts the IFFT operation performed at the digital modulator. The corresponding channel decoders use either hard-decision or soft-decision decoding algorithms to correct channel errors. Soft-decision channel decoding generally performs better than their hard-decision counterpart, however, often at the cost of much higher implementation complexity.

The block diagram in FIG. 1 represents a one-way communication system in which information transmission occurs strictly in one direction, from transmitter to receiver. In this instance, error control can only be provided through the use of forward error-correction coding. In some cases, a communication system can support a two-way exchange of information between transmitter and receiver across the channel. Error control in a two-way communication system can use an error detection and retransmission scheme called automatic repeat request (ARQ). In an automatic repeat request system, a request is sent by the receiver to the transmitter to repeat the transmission of the information when errors are detected. The major advantage of automatic repeat request systems over forward error-correction coding is that error detection requires much simpler decoding complexity than error correction at the channel decoder. Also, an automatic repeat request system adapts to channel conditions in the sense that information is only re-transmitted when channel errors occur. However, high channel error rates can result in a large number of retransmissions and, therefore, low system information throughput rates. A better alternative is a hybrid combination of an automatic repeat request system with forward error-correction coding so that frequent channel error patterns are correctable by the forward error-correction code and retransmissions only occur for infrequent severe channel error conditions when the forward error-correction coding error correction capability is exceeded.

From the viewpoint of the communications system designer, the communications channel consists of the part of the system that cannot be changed. The choice of digital modulation waveforms is often fixed and governed by system bandwidth and power specifications. The choice of digital demodulators, whether soft-decision or hard-decision, is often fixed by practical system complexity constraints. For example, while soft-decision demodulation is viable for asymmetrical digital subscriber loop (ADSL) systems, it cannot be economically implemented for high-speed 10 Gbps OC-192 SONET networks. Consequently, the digital modulator (or data recording unit), the physical channel (or storage medium), and the digital demodulator (or data reading unit) can be combined to form a fixed coding channel for the purposes of designing forward error-correction coding systems. This is shown in the block diagram of FIG. 2. Design of forward error-correction coding systems involves only the design of the channel code and the channel encoder and channel decoder blocks. This model given by the block diagram of FIG. 2 also applies to the design and implementation of network layer coding methods.

The performance of a coded communication system is generally measured in terms of its probability of decoding error and its coding gain over an uncoded system that transmits information at the same rate. There are two types of error probabilities that are commonly considered to evaluate forward error-correction coding methods. One is the block error rate (BLER), which is the probability that a block of information bits is decoded in error at the output of the channel decoder. The other is the bit error rate (BER), which is the probability that an information bit is decoded in error at the output of the channel decoder. Forward error-correction coding methods are designed in coded communication systems to minimize these error probabilities to the extent possible under the constraints of signal power, bandwidth, and implementation complexity. The error probability is often measured as a function of a receiver signal-to-noise ratio, which is often taken to be equal to $E_b/N_0$, which is the ratio of the signal energy per information bit to the noise power spectral density level at the input of the digital demodulator. The other performance measure that is frequently used to measure the performance of a forward error-correction coding method is the coding gain, which is defined to be the reduction in $E_b/N_0$ required to achieve a specified error probability level (BER or BLER) for a coded communication system compared to an uncoded system. Coding gain, which is usually expressed in terms of decibels (dBs), measures the power efficiency gain of a forward error-correction coded communication system compared to an uncoded system.

The design of a forward error-correction coding method for a coded digital communication (or data storage) system often requires a trade-off between the following factors:

1. Coding Gain—Although higher coding gains result in better error probability performance, this may come at a cost of higher data bandwidth expansion from a lower code rate and/or higher implementation complexity using longer codes.
2. Code Rate—Lower code rates can result in higher coding gains at the cost of higher transmission bandwidth requirements.
3. Implementation Complexity—Implementation complexity generally increases when longer blocklength block codes and convolutional codes with larger encoding memory are used to increase coding gain. Implementation complexity also increases when soft-decision decoding is used instead of hard-decision decoding to improve error probability performance.

Digital communication (data storage) systems often employ multiple forward error-correction coding methods to provide programmable error control configurations that balance some of the above-mentioned factors. The motivation for implementing multiple forward error-correction codes in wireline and wireless digital communications systems is to provide programmability to adapt to changing channel noise conditions. The multiple forward error-correction codes implemented in these systems can then be programmed to dynamically adapt to changing channel conditions. Some magnetic hard disk read channel integrated circuit (IC) vendors have marketed products that incorporate multiple forward error-correction codes with different coding rates. In this application, the programmable forward error-correction coding allows hard disk manufacturers to optimize data integrity for particular disk drive configurations. In another application, larger magnetic hard disk sector sizes can accommodate forward error-correction codes with longer blocklengths to provide higher coding gains. Programmable forward error-correction coding read channel ICs for this application enables a tradeoff between data integrity and disk drive sector size storage efficiency.

However, there is presently a lack of a system that provides adjustable code rates and coding gains that is capable of being dynamically adjusted to adapt to changing channel (storage medium) conditions. In addition, there is presently a lack of a system in which a single encoder and a single decoder can be used to implement all the forward error-correction codes of different code rates.

BRIEF SUMMARY OF THE INVENTION

The above-described problems are solved and a technical advance achieved by the present universal forward error-correction coding system, which provides adjustable code rates and coding gains to greatly benefit the design of many modern digital communications (data storage) systems. This universal forward error-correction coding system is capable of being adjusted dynamically to provide code rates and coding gains that adapt to changing channel (storage medium) conditions. The channel encoding and decoding methods in the present universal forward error-correction coding system are universal such that a single encoder and a single decoder can be used to implement all the forward error-correction codes of different code rates. This serves to greatly reduce the complexity, chip area, and chip power consumption in IC implementations. This universal forward error-correction coding system also includes a novel systematic code generation procedure that has the capability of generating many classes of codes that provide the best balance between coding gain performance and implementation complexity. In particular, an innovative low complexity channel encoder implementation is applicable to all codes generated by this systematic method. Codes generated by this systematic method are also shown to be consistently superior using a variety of hard-decision and soft-decision decoding algorithms of different implementation complexities.

DETAILED DESCRIPTION OF THE INVENTION

Binary Linear Block Codes

Figure 1:
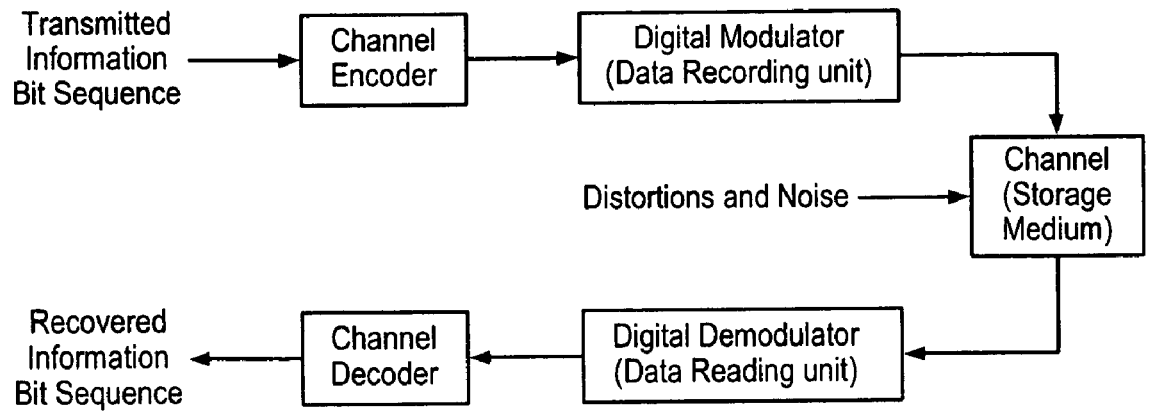
FIG. 1 illustrates the basic architecture of a system for interacting with a digital communications or data storage system.
Figure 2:
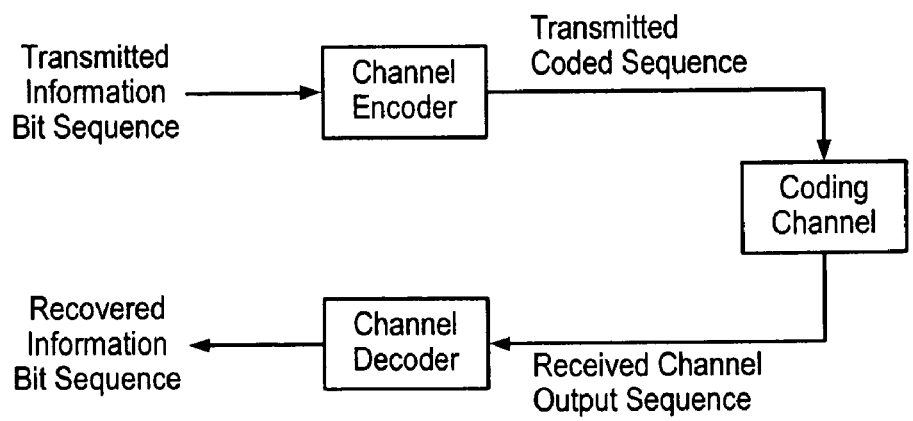
FIG. 2 illustrates the basic architecture of a system for interacting with a digital communications or data storage system using forward error-correction coding.

In a binary block code, an information bit stream is first segmented into message blocks of fixed length consisting of k information bits. Denote each message block as $u=(u_0, \ldots u_{k-1})$. The channel encoder maps each of the $2^k$ message blocks into a unique codeword which consists of a block of n bits, where k<n. Denote each codeword as $v=(v_0, \ldots v_{n-1})$. The set of $2^k$ codewords v is called a binary block code of blocklength n and of code rate equal to k/n. A binary block code C with $2^k$ codewords v, each of blocklength n, is called a (n,k) linear code if the set of codewords v forms a k-dimensional subspace of the vector space of all the n-tuples over the binary Galois field GF(2). Since the code C is of dimension k, it is possible to find k linearly independent vectors $g_0, \ldots, g_{k-1}$ that serve as a basis for this subspace. That is, every codeword v is a linear combination of these k basis vectors:

$$v = u_0 g_0 + u_1 g_1 + \ldots + u_{k-1} g_{k-1} \quad (1)$$

Each of these basis vectors $g_i$ is also a codeword in C. The k×n matrix G, which is formed using these linearly independent vectors $g_0, \ldots, g_{k-1}$ as its rows:

$$G = \begin{bmatrix} g_0 \\ \vdots \\ g_{k-1} \end{bmatrix} \quad (2)$$

is called a generator matrix, G, for this code C. This generator matrix G can then be used to specify the mapping given by equation (1) from message blocks, u, to codewords, v, as follows:

$$v = uG \quad (3)$$

So the set of $2^k$ codewords v in code C is the row space of the generator matrix G. Since the set of basis vectors $g_0, \ldots, g_{k-1}$ is not unique, the generator matrix G for a code C is also not unique. Different generator matrices G for a given linear code C has the same set of codewords v, but different mappings between the message blocks u and the codewords v.

For any k×n generator matrix G, there is a (n−k)×n matrix H with (n−k) linearly independent rows such that:

$$G H^T = 0 \quad (4)$$

That is, every vector in the row space of the generator matrix G is orthogonal to the rows of H. So an n-dimensional vector v is a codeword in code C if and only if:

$$v H^T = 0 \quad (5)$$

or, equivalently, if and only if the n-dimensional vector v is in the null space of the matrix H. This matrix H is called a parity check matrix of the code C. Since generator matrices G are not unique for a linear code C, parity check matrices H are also not unique. So a linear code C can be specified either in terms of the row space of a generator matrix G or in terms of the null space of a corresponding parity-check matrix H. The channel encoder can be implemented to carry out the mapping defined by (3) using the generator matrix G. The parity-check matrix H plays a major role in the implementation of various decoding algorithms for the channel decoder. These issues will be discussed below. The linear code C is called a systematic code if its generator matrix G is of the following form:

$$G = [IP] \quad (6)$$

where I is a k×k identity matrix and P is a k×(n−k) matrix. Using (3), it can be seen that the codewords v of a systematic code have the property that their first k components are the k information bits of the message block: $v_0 = u_0$, $v_1 = u_1$, ..., $v_{k-1} = u_{k-1}$. Systematic codes have a decoding advantage of directly yielding the message block when a codeword has been decoded.

Finally, the weight of a codeword v is equal to the number of "1s" in the codeword v. The error correction capability of a block code can be specified in terms of the minimum distance of the code C. For linear codes, the code minimum distance is equal to the minimum weight over all possible non-zero codewords.

Binary Low Density Parity Check Codes

This universal forward error-correction coding system is based on using Low Density Parity Check (LDPC) codes of a particular quasi-cyclic structure for generating the codes and implementing the corresponding universal channel encoder and decoder for these codes. Low Density Parity Check codes can achieve a coding performance very close to the theoretically achievable performance quantified by the Shannon limit. The binary Low Density Parity Check codes are (n,k) linear codes that are usually specified in terms of their parity check matrices H. In particular, a binary (γ, ρ)-regular Low Density Parity Check code is defined as the null space of a sparse parity check matrix H with the following structural properties: (1) each row consists of ρ "1s"; (2) each column consists of γ "1s"; (3) the number of "1s" in common between any two columns, denoted by λ, is no greater than one; that is, λ=0 or 1; and (4) both ρ and γ are small compared with the blocklength n of the code and the number of rows in H. Properties (1) and (2) say that the parity check matrix H has constant row and column weights ρ and γ, respectively. Property (3) also implies that no two rows have more than one "1" in common, and is often referred to as the Row-Column (RC) constraint. Property (4) implies that the matrix H has a small density of "1s"; hence, it is a sparse matrix. For this reason, the code specified by H is called a Low Density Parity Check code. The rows of H are not necessarily linearly independent over GF(2), so H is not necessarily of full rank. In these cases, the dimension of the code must be determined by determining the rank of H which is equal to n−k. An example of a parity check matrix H for a binary (2,3)-regular Low Density Parity Check code is:

EXAMPLE 1

Consider the parity check matrix:

$$H = \begin{bmatrix} 100 & 100 & 100 \\ 010 & 010 & 010 \\ 001 & 001 & 001 \\ 100 & 010 & 001 \\ 010 & 001 & 100 \\ 001 & 100 & 010 \end{bmatrix}$$

The rank of this parity check matrix H=5. So the null space of H is a (9,4) linear code.

If all the columns (or all the rows) of the parity check matrix H do not have the same weight, the code is called an irregular Low Density Parity Check code. The lack of structure in irregular Low Density Parity Check codes results in complex encoder implementations, which reduces their desirability for many applications.

Binary Quasi-Cyclic Low Density Parity Check Codes

Cyclic codes have the property that the cyclic shift of any codeword by any number of bit positions results in another codeword. This property allows easy implementations of channel encoders and syndrome calculations for channel decoding by employing shift registers with feedback connections. Many important cyclic codes, including BCH codes and Reed Solomon codes, have a rich algebraic structure that allows for practically implementable channel decoding algorithms as well. Quasi-Cyclic (QC) codes only have a partial cyclic structure that still allows for encoder implementations with simple shift registers. In particular, a Quasi-Cyclic code is a linear code for which shifting a codeword a fixed number $n_0 \ne 1$ (or a multiple of $n_0$) of bit positions results in another codeword. A Quasi-Cyclic code also has another form. A codeword can be divided into $n_0$ sections of the same length. Simultaneously, cyclically shifting all of the no sections one place to the right (or to the left) results in another codeword. We shall use a class of binary Quasi-Cyclic Low Density Parity Check (QC-Low Density Parity Check) codes as the basis for our universal coding scheme in which the parity check matrix H of each code in the class is given as an array of sparse circulant matrices of the same dimension. Binary Quasi-Cyclic Low Density Parity Check codes generated this way are of the second form. Well-designed Quasi-Cyclic Low Density Parity Check codes have been shown to perform as well as computer-generated random Low Density Parity Check codes, regular or irregular in terms of bit-error performance, block-error performance, rate of decoding convergence, and error-floor, collectively. Therefore, in practical applications, they are strong competitors to the random Low Density Parity Check codes due to their simple encoding, fast decoding convergence, and low error-floors. These codes also have advantages in VLSI IC decoder implementations due to their cyclic symmetry which results in simple regular wiring and modular structure. This universal forward error-correction coding system has made use of these properties to devise universal coding schemes with flexible code rates and coding gains as well as universal encoder and universal decoder implementations.

A circulant is a square matrix (with binary elements) in which each row is the cyclic shift (one place to the right) of the row above it and the first row is the cyclic shift of the last row. For such a circulant, each column is the downward cyclic shift of the column on its left and the first column is the cyclic shift of the last column. The row and column weights of a circulant are the same, say w. For simplicity, we say that the circulant has weight w. If w=1, then the circulant is a permutation matrix, called a circulant permutation matrix. For a circulant, the set of columns (reading from the top down) is the same as the set of rows (reading from right to left). A circulant is completely characterized by its first row (or first column) which is called the generator of the circulant.

All the rows of a b×b circulant A over GF(2) are linearly independent if its rank is equal to b. If its rank $r_A$ is less than b, then any consecutive $r_A$ rows (or columns) of A may be regarded as being linearly independent and the other $b-r_A$ rows (or columns) are linearly dependent. This is due to the cyclic structure of A. For simplicity, we always take the first (or the last) $r_A$ rows (or columns) of A as the independent rows (or columns). A binary Quasi-Cyclic Low Density Parity Check code is given by the null space of an array of sparse circulants of the same size. For two positive integers c and t with $c \le t$, consider the following c×t array of b×b circulants over GF(2):

$$H_{qc} = \begin{bmatrix} A_{1,1} & A_{1,2} & \cdots & A_{1,t} \\ A_{2,1} & A_{2,2} & \cdots & A_{2,t} \\ \vdots & \vdots & \ddots & \vdots \\ A_{c,1} & A_{c,2} & \cdots & A_{c,t} \end{bmatrix} \quad (7)$$

which has the following structural properties: (1) the weight of each circulant $A_{i,j}$ is small compared to its size b; and (2) no two rows (or two columns) of $H_{qc}$ have more than one 1-component in common (the Row-Column constraint). Property (1) simply implies that each circulant in $H_{qc}$ is a sparse circulant; hence, $H_{qc}$ is a sparse matrix. Property (2), the Row-Column constraint, ensures that there are no four 1-entries at the four corners of a rectangle in $H_{qc}$. Then the null space of $H_{qc}$ gives a binary Quasi-Cyclic Low Density Parity Check code $C_{qc}$ of length n=tb. If all the circulants in $H_{qc}$ have the same weight w, then $H_{qc}$ has constant column weight cw and constant row weight tw. In this case, $C_{qc}$ is a regular Quasi-Cyclic Low Density Parity Check code. The Row-Column constraint on $H_{qc}$ ensures that there are cw check-sums orthogonal on every code bit; hence, the minimum distance of $C_{qc}$ is at least cw+1. If the weight distribution of the circulants in $H_{qc}$ results in multiple column weights or multiple row weights in $H_{qc}$, then $C_{qc}$ is an irregular Quasi-Cyclic Low Density Parity Check code.

The structure of a binary Quasi-Cyclic Low Density Parity Check code can be viewed from its parity-check matrix in circulant form given by equation (7). Based on this form, every codeword v in $C_{qc}$ can be divided into t sections, $v=(v_1, v_2, \ldots, v_t)$, and each section $v_j$ consists of b consecutive components of v. For $1 \le j \le t$, the b components of the j-th section $v_j$ correspond to the b columns of the j-th column of circulants of $H_{qc}$. For $0 \le l \le b$, let $v_j^{(l)}$ denote the vector obtained by cyclically shifting each of the b components of the j-th section $v_j$ to the right one place. It is clear that $v_j^{(0)} = v_j^{(b)} = v_j$. We call $v_j^{(l)}$ the l-th (right) cyclic-shift of $v_j$. Then it follows from the circulant structure of $H_{qc}$ that the vector $v^* = (v_1^{(l)}, v_2^{(l)}, \ldots, v_t^{(l)})$ is also a codeword in $C_{qc}$. This says that the code $C_{qc}$ has sectionized cyclic structure. If the parity-check matrix $H_{qc}$ consists of a single circulant or a single column of circulants, then $C_{qc}$ is a cyclic code. Therefore, binary cyclic Low Density Parity Check codes form a subclass of binary Quasi-Cyclic Low Density Parity Check codes.

Universal Coding Based on Families of Structurally Compatible Binary Quasi-Cyclic-Low Density Parity Check Codes This section describes a family of binary Quasi-Cyclic Low Density Parity Check codes of various blocklengths, rates, and error performances that can be obtained from a base Quasi-Cyclic Low Density Parity Check code. These codes are suitable for implementing coding schemes that can adapt to varying communications channel (storage medium) conditions and varying data transmission rates. This family of binary Quasi-Cyclic Low Density Parity Check codes are structurally compatible so that a single universal encoder can be implemented that can adapt to serve as an encoder for every code in this family. Each code in this family can also be decoded with one universal decoder. Therefore, this new universal forward error-correction coding system gives a method to realize and instrument a flexible universal coding scheme that can adapt to data rate and error performance requirements.

The family of structurally compatible binary Quasi-Cyclic Low Density Parity Check codes is obtained as follows. Consider first a binary Quasi-Cyclic Low Density Parity Check code C(c,t) defined as the null space of a parity check matrix $H_{qc}(c, t)$, which is a c×t array of b×b circulants over GF(2) of the form given by equation (7). This is a code with block-length equal to tb, which we shall refer to as the base code. To obtain the rest of the codes in this family, choose any sequence of m distinct pairs of positive integers, $(c_i, t_i)$, with $1 \le i \le m$, such that $1 \le c_1 \le c_2 \le \ldots \le c_m \le c$, and $1 \le t_1 \le t_2 \le \ldots \le t_m \le t$. Let $H_{qc}(c_i, t_i)$ be the $c_i \times t_i$ subarray of the base array $H_{qc}(c, t)$ of circulants obtained by deleting the last $t-t_i$ columns and the last $c-c_i$ rows of b×b circulant matrices. Therefore, each matrix $H_{qc}(c_i, t_i)$ is a $c_i \times t_i$ array of b×b circulant matrices. Let $C(c_i, t_i)$ be the null space of the matrix $H_{qc}(c_i, t_i)$. It then follows from the definition given in the last section that $C(c_i, t_i)$ is a binary Quasi-Cyclic Low Density Parity Check code of blocklength equal to $t_i b$. Therefore, $C(c,t), C(c_1,t_1), C(c_2,t_2), \ldots, C(c_m,t_m)$ form a family of m+1 binary Quasi-Cyclic Low Density Parity Check codes that has single universal encoder and universal decoder implementations.

The following simple example illustrates the universal coding concept when m=1 to obtain a family of two codes.

EXAMPLE 2

Consider a case where c=3 and t=4 and $c_1$=2 and $t_1$=3. Suppose the parity check matrix of the base code is the following 3×4 array of 3×3 circulants:

$$H(3,4) = \begin{bmatrix} 0 & 0 & 1 & 0 & 0 & 0 & 1 & 0 & 0 & 0 & 1 & 0 \\ 1 & 0 & 0 & 0 & 0 & 0 & 0 & 1 & 0 & 0 & 0 & 1 \\ 0 & 1 & 0 & 0 & 0 & 0 & 0 & 0 & 1 & 1 & 0 & 0 \\ 0 & 1 & 0 & 1 & 0 & 0 & 0 & 0 & 0 & 0 & 0 & 1 \\ 0 & 0 & 1 & 0 & 1 & 0 & 0 & 0 & 0 & 1 & 0 & 0 \\ 1 & 0 & 0 & 0 & 0 & 1 & 0 & 0 & 0 & 0 & 1 & 0 \\ 1 & 0 & 0 & 0 & 1 & 0 & 0 & 0 & 1 & 0 & 0 & 0 \\ 0 & 1 & 0 & 0 & 0 & 1 & 1 & 0 & 0 & 0 & 0 & 0 \\ 0 & 0 & 1 & 1 & 0 & 0 & 0 & 1 & 0 & 0 & 0 & 0 \end{bmatrix}$$

and the parity check matrix derived by deleting the last row and the last column of 3×3 circulants from H(3,4) is:

$$H(2,3) = \begin{bmatrix} 0 & 0 & 1 & 0 & 0 & 0 & 1 & 0 & 0 \\ 1 & 0 & 0 & 0 & 0 & 0 & 0 & 1 & 0 \\ 0 & 1 & 0 & 0 & 0 & 0 & 0 & 0 & 1 \\ 0 & 1 & 0 & 1 & 0 & 0 & 0 & 0 & 0 \\ 0 & 0 & 1 & 0 & 1 & 0 & 0 & 0 & 0 \\ 1 & 0 & 0 & 0 & 0 & 1 & 0 & 0 & 0 \end{bmatrix}$$

Both binary Quasi-Cyclic Low Density Parity Check codes are regular with equal column and row weights. The parity check matrix H(3,4) has rank 7, so its null space is a (12,5) code C(3,4) of code rate equal to 5/12, while the parity check matrix H(2,3) is of full rank 6, so its null space is a (9,3) code C(2,3) of code rate equal to 1/3.

Efficient Channel Encoder Implementations for Binary Quasi-Cyclic Low Density Parity Check Codes Although a binary Quasi-Cyclic Low Density Parity Check code is specified as the null space of a parity check matrix $H_{qc}$ of the form given by equation (7), the corresponding generator matrix $G_{qc}$ must be determined to implement channel encoders for these codes that employ equation (3) to map message blocks u into codewords v. This universal forward error-correction coding system includes the description of a general approach to determine a generator matrix in systematic-circulant form (similar to equation (6)), as well as the development of digital circuit architectures for implementing the corresponding encoders. Various encoding circuit architectures are designed to allow a tradeoff between encoder circuit complexity in terms of chip area and encoding speed for VLSI IC implementations. We present two methods for constructing the generator matrices of binary Quasi-Cyclic Low Density Parity Check codes in systematic-circulant form from their parity-check matrices for two different cases. The first, Case I, is when the rank $r_H$ of the parity-check matrix $H_{qc}$ given by equation (7) is equal to the number cb of rows of $H_{qc}$ and there exists a c×c subarray in $H_{qc}$ with rank $r_H$. The second case, Case II, is when $r_H$<cb, or when $r_H$=cb and there does not exist a c×c subarray in $H_{qc}$ with rank $r_H$.

Single-Stage Encoder Implementation for Case I

Consider a binary Quasi-Cyclic Low Density Parity Check code $C_{qc}$ given by the null space of a parity-check matrix $H_{qc}$ of the form given by equation (7). Suppose the rank $r_H$ of $H_{qc}$ is equal to cb. We assume that the columns of circulants of $H_{qc}$ are arranged in such a way that the rank of the following c×c subarray of $H_{qc}$:

$$D = \begin{bmatrix} A_{1,t-c+1} & A_{1,t-c+2} & \cdots & A_{1,t} \\ A_{2,t-c+1} & A_{2,t-c+2} & \cdots & A_{2,t} \\ \vdots & \vdots & \ddots & \vdots \\ A_{c,t-c+1} & A_{c,t-c+2} & \cdots & A_{c,t} \end{bmatrix}, \quad (8)$$

is equal to cb, the same as the rank $r_H$ of $H_{qc}$. We also assume that the first (t−c)b columns of $H_{qc}$ correspond to the (t−c)b information bits. Then the desired generator matrix of the code $C_{qc}$ has the following systematic form (similar to equation (6)):

$$G_{qc} = \begin{bmatrix} G_1 \\ G_2 \\ \vdots \\ G_{t-c} \end{bmatrix} \quad (9)$$

$$= \begin{bmatrix} I & O & \cdots & O & | & G_{1,1} & G_{1,2} & \cdots & G_{1,c} \\ O & I & \cdots & O & | & G_{2,1} & G_{2,2} & \cdots & G_{2,c} \\ \vdots & \vdots & \ddots & \vdots & | & \vdots & \vdots & \ddots & \vdots \\ O & O & \cdots & I & | & G_{t-c,1} & G_{t-c,2} & \cdots & G_{t-c,c} \end{bmatrix}$$

$$= [I_{(t-c)b} P],$$

where I is a b×b identity matrix, O is a b×b zero matrix, and $G_{i,j}$ with $1 \le i \le t-c$ and $1 \le j \le c$ is a b×b circulant. The generator matrix $G_{qc}$ with the form given by equation (9) is said to be in systematic-circulant (SC) form. It consists of two parts, the left part $I_{(t-c)b}$ and the right part P. The left part $I_{(t-1)b}$ of $G_{qc}$ with (t−c) (b×b)-dimension identity matrices on its main diagonal is actually a (t−c)b×(t−c)b identity matrix, and the right part P of $G_{qc}$ is a (t−c)×c array of b×b circulants. In coding theory, the right part P of $G_{qc}$ is called the P-matrix that corresponds to the parity-check section of a codeword in systematic form. We say that $G_{qc}$ is in systematic-circulant form because its P-matrix is an array of circulants. The systematic-circulant form allows us to encode a binary Quasi-Cyclic Low Density Parity Check code with simple shift-register circuits.

The necessary and sufficient condition for $G_{qc}$ to be a generator matrix of $C_{qc}$ is that $H_{qc} G_{qc}^T = [O]$, where [O] is a cb×(t−c)b zero matrix. For $1 \le i \le t-c$ and $1 \le j \le c$, let $g_{i,j}$ be the generator of the circulant $G_{i,j}$. Once we know the set of the $g_{i,j}$'s, we can form the set of all of the circulants $G_{i,j}$'s of $G_{qc}$. Therefore, $G_{qc}$ is completely characterized by a set of c(t−c) circulant generators, which are called the generators of the code $C_{qc}$.

Let $u=(1\ 0\ \ldots\ 0)$ be the unit b-tuple with a "1" at the first position and let $0=(0\ 0\ \ldots\ 0)$ be the all-zero b-tuple. For $1 \leq i \leq t-c$, the first row of the submatrix $G_i$ in equation (9) is $$g_i = (0 \ldots 0 u 0 \ldots 0 g_{i,1} g_{i,2} \ldots g_{i,c}), \quad (10)$$

where the unit b-tuple u is at the i-th position of $g_i$. Then, in order for $G_{qc}$ to be a generator matrix of the code $C_{qc}$, we must have $H_{qc} g^T = 0$ for $1 \leq i \leq t-c$. Let $z_i = (g_{i,1}\ g_{i,2}\ \ldots\ g_{i,c})$ (be the last c sections of $g_i$) and $M_i = [A_{1,i}^T \ldots A_{c,i}^T]^T$, (be the i-th column of circulants of $H_{qc}$). Then $H_{qc} g^T = 0$ gives the following equality:

$$M_i u^T + D z_i^T = 0 \quad (11)$$

Since D is a square matrix and has full rank, it is nonsingular and has an inverse $D^{-1}$. Then it follows from equation (11) that:

$$z_i^T = D^{-1} M_i u^T \quad (12)$$

Solving equation (12) for $1 \leq i \leq t-c$, we obtain $z_1, z_2, \ldots, z_{t-c}$. From $z_1, z_2, \ldots, z_{t-c}$, we obtain all the generators, $g_{i,j}$'s, of the circulants in $G_{qc}$. Then $G_{qc}$ can be readily constructed.

An encoding circuit for the code $C_{qc}$ can be devised based on the generators of the circulants in the P-matrix of $G_{qc}$. Let $a = (a_1, a_2, \ldots, a_{(t-c)b})$ be the information sequence of $(t-c)b$ bits to be encoded. Divide this sequence into $(t-c)$ sections of equal length, $a = (a_1, a_2, \ldots, a_{(t-c)})$, where for $1 \leq i \leq t-c$, the i-th section $a_i$ consists of b consecutive information bits, $a_i = (a_{(i-1)b+1}, a_{(i-1)b+2}, \ldots, a_{ib})$. Then the codeword for the information sequence a is $v = a\, G_{qc}$, which has the following systematic form: $v = (a, p_1, p_2, \ldots, p_c)$, where for $1 \leq j \leq c$, $p_j = (p_{j,1}, p_{j,2}, \ldots, p_{j,b})$ is a section of b parity-check bits. It follows from $v = a\, G_{qc}$ that:

$$p_j = \sum_{i=1}^{t-c} a_i G_{i,j} \quad (13)$$

for $1 \leq j \leq c$. For $0 \leq l \leq b$, let $g_{i,j}^{(l)}$ be the l-th (right) cyclic shift of the generator $g_{i,j}$, with $g_{i,j}^{(0)} = g_{i,j}^{(b)} = g_{i,j}$. Then for $1 \leq i \leq t-c$:

$$a_i G_{i,j} = a_{(i-1)b+1} g_{i,j}^{(0)} + a_{(i-1)b+2} g_{i,j}^{(1)} + \ldots + a_{ib} g_{i,j}^{(b-1)} \quad (14)$$

It follows from equations (13) and (14) that the j-th parity check section $p_j$ can be computed, step by step, as the information sequence a is shifted into the encoder. For $1 \leq k \leq t-c$, at the k-th step, the accumulated sum, $s_{k,j} = a_1 G_{1,j} + a_2 G_{2,j} + \ldots + a_k G_{k,j}$ is formed and stored in a register (called an accumulator). At the (k+1)-th step, the partial sum $a_{k+1} G_{k+1,j}$ is computed from equation (14) and added to $s_{k,j}$ to form the next accumulated sum $s_{k+1,j}$. At the end of (t−c)-th step, the accumulated sum $s_{t-c,j}$ gives the j-th parity section $p_j$.

Figure 3:
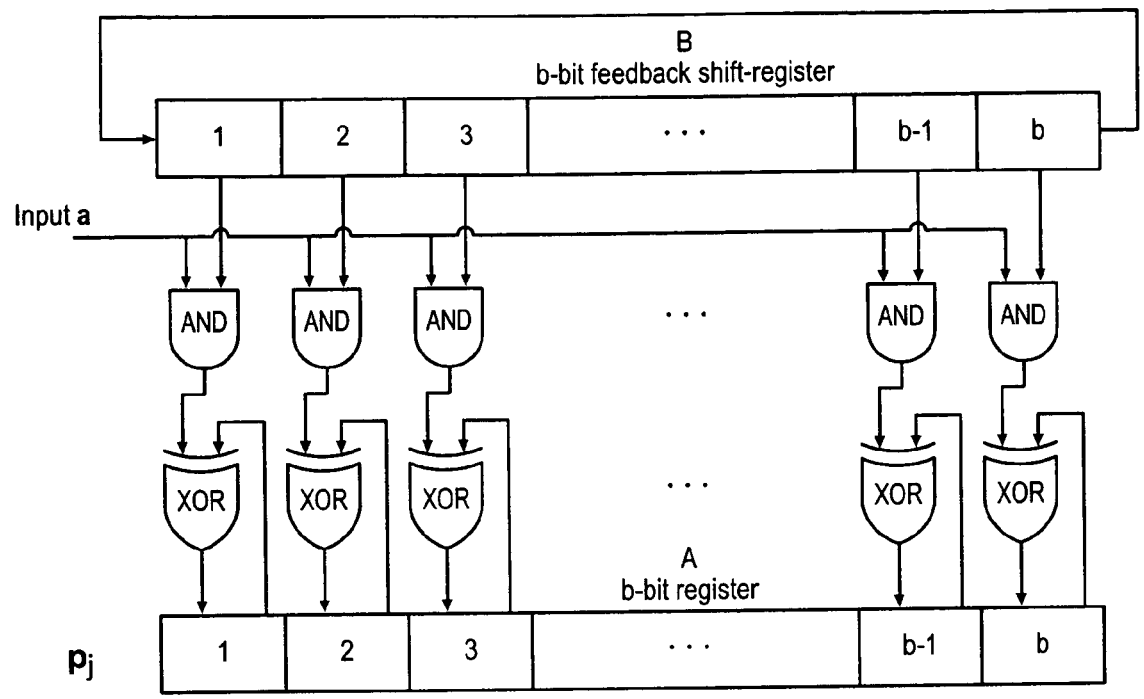
FIG. 3 illustrates a Shift-Register-Adder-Accumulator encoder circuit.

Based on the above encoding process and the expression given by equation (14), the j-th parity check section $p_j$ can be formed with a Shift-Register-Adder-Accumulator circuit as shown in FIG. 3. At the beginning of the first step, $g_{1,j}^{(0)} = g_{1,j}$ is stored in the feedback shift-register B and the contents of the (accumulator) register A are set to zero. When the information bit $a_1$ is shifted into the encoder and the channel, the product $a_1 g_{1,j}^{(0)}$ is formed at the outputs of the AND-gates and is added to the contents stored in the register A (zero at this time). The sum is then stored in the register A. The feedback shift-register B is shifted once to the right. The new content in B is $g_{1,j}^{(1)}$. When the next information bit $a_2$ is shifted into the encoder, the product $a_2 g_{1,j}^{(1)}$ is formed at the outputs of the AND-gates. This product is then added to the sum $a_1 g_{1,j}^{(0)}$ in the accumulator register A. The sum $a_1 g_{1,j}^{(0)} + a_2 g_{1,j}^{(1)}$ is then stored in A. The above shift-add-store process continues. When the information bit $a_b$ has been shifted into the encoder, register A stores the partial sum $a_1 G_{1,j}$, which is the contribution to the parity section $p_j$ from the information section $a_1$. At this time, the generator $g_{2,j}$ of the circulant $G_{2,j}$ is loaded into B. The shift-add-store process repeats. When the information section $a_2$ has been completely shifted into the encoder, register A contains the accumulated sum $a_1 G_{1,j} + a_2 G_{2,j}$, which is the contribution to the parity section $p_j$ from the first two information sections, $a_1$ and $a_2$. The above process repeats until the entire information sequence a has been shifted into the encoder. At this time, register A contains the parity section $p_j$. To form c parity sections, we need c Shift-Register-Adder-Accumulator circuits, one for computing each parity section.

Figure 4:
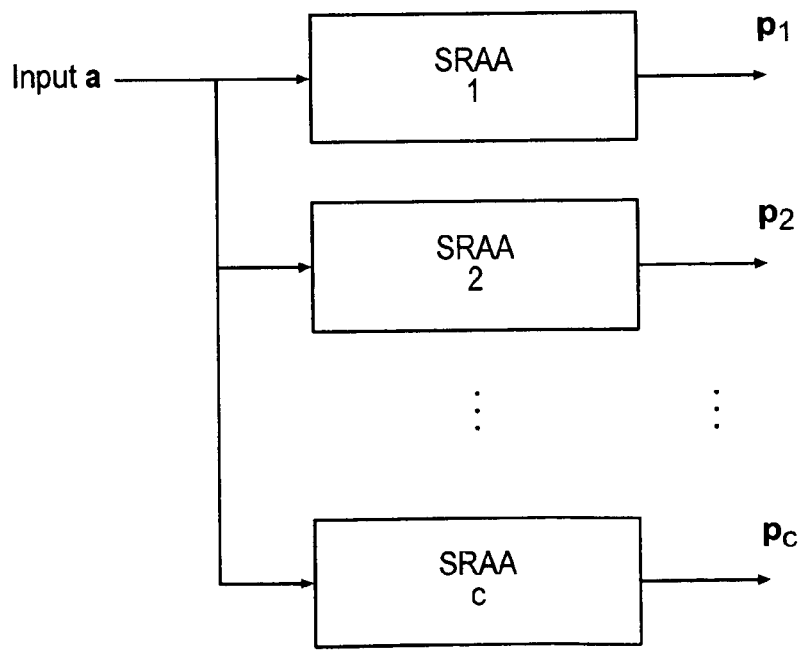
FIG. 4 illustrates a Shift-Register-Adder-Accumulator based binary Quasi-Cyclic Low Density Parity Check serial encoder circuit.

A block diagram for the entire Shift-Register-Adder-Accumulator based Quasi-Cyclic Low Density Parity Check serial encoder circuit is shown in FIG. 4. The information sequence a is encoded serially. All the c parity sections are formed at the same time in parallel and then shifted into the channel serially. The encoding circuit consists of c Shift-Register-Adder-Accumulator circuits with a total of 2cb flip-flops, cb AND-gates, and cb two-input XOR-gates (or modulo-2 adders). The encoding is accomplished in linear time with complexity linearly proportional to the number of parity check bits, cb of the code. The encoding is accomplished in (t−c)b clock cycles where (t−c)b is the length of the information sequence.

Figure 5:
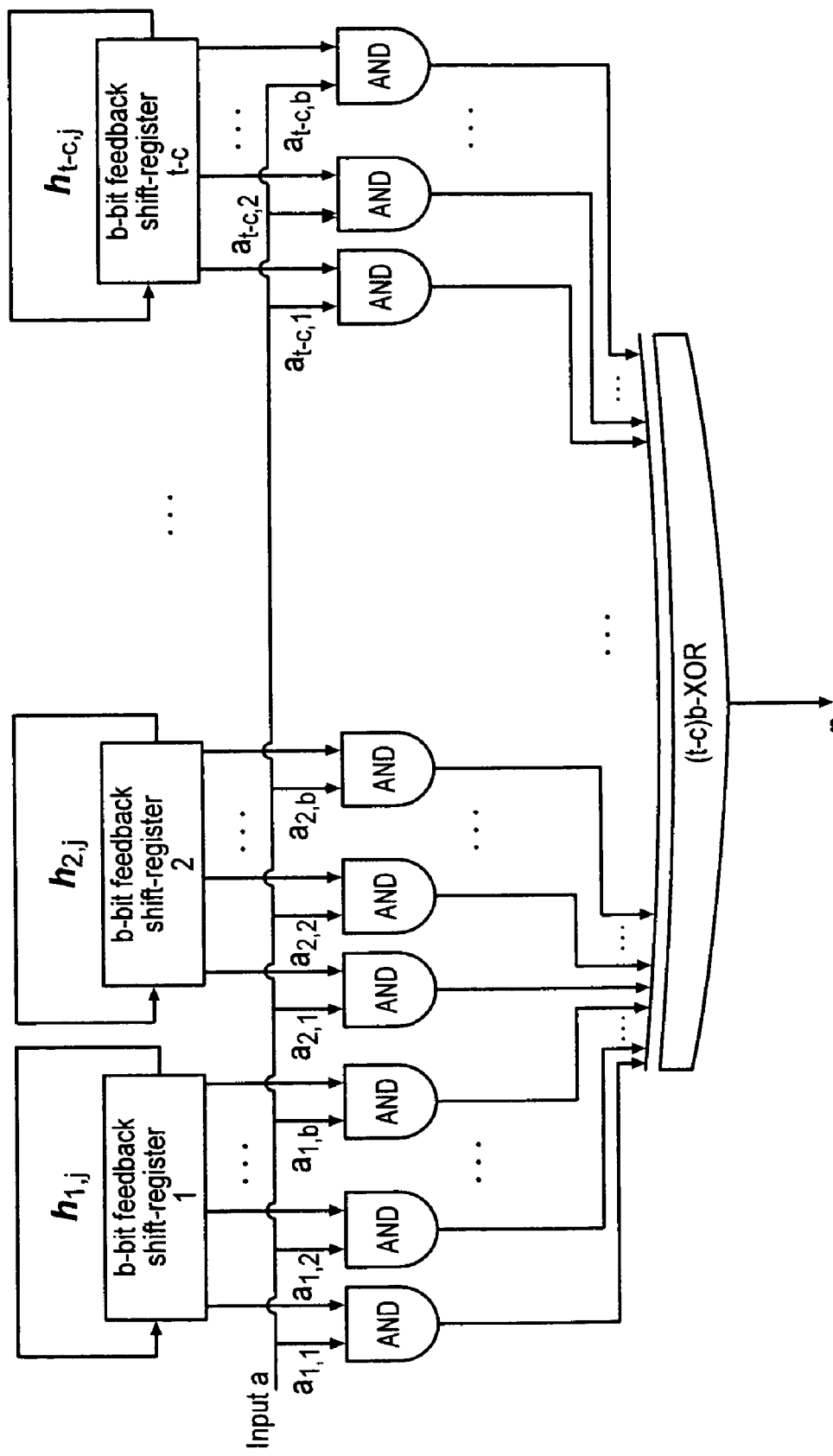
FIG. 5 illustrates a Shift-Register-Adder-Accumulator based binary Quasi-Cyclic Low Density Parity Check parallel encoder circuit.

A Shift-Register-Adder-Accumulator based Quasi-Cyclic Low Density Parity Check parallel encoder circuit that completes encoding in cb clock cycles can be implemented with t−c feedback shift-registers, each with b flip-flops as shown in FIG. 5. All of the (t−c)b information bits are applied to the encoder in parallel. For $1 \leq i \leq t-c$ and $1 \leq j \leq c$, let $h_{i,j}$ be the first column of the circulant $G_{i,j}$. For $0 \leq l \leq b$, let $h_{i,j}^{(l)}$ denote the l-th downward cyclic-shift of $h_{i,j}$. It is clear that $h_{i,j}^{(0)} = h_{i,j}$, $h_{i,j}^{(b)} = h_{i,j}$. Then for $0 \leq l \leq b$, the l-th parity check bit $p_{j,l}$ of the j-th parity section $p_j$ is given by:

$$p_{j,l} = a_1 h_{1,j}^{(l-1)} + a_2 h_{2,j}^{(l-1)} + \ldots + a_{t-c} h_{t-c,j}^{(l-1)}. \quad (15)$$

From this expression given by equation (15), we see that $p_{j,1}$ can be formed with (t−c)b two-input AND-gates and (t−c)b−1 two-input XOR-gates. The parity-check bits are generated serially, bit by bit, and one section at a time. For $1 \leq j \leq c$, in order to form the b parity bits of the j-th parity section $p_j$, the columns, $h_{1,j}, \ldots, h_{t-c,j}$ are loaded into the t−c feedback shift-registers in parallel, and the first parity check bit $p_{j,1}$ of $p_j$ is formed. Then cyclically shift these feedback shift-registers b−1 times to generate the other b−1 bits of $p_j$. With this implementation, encoding is completed in cb clock cycles. The total number of flip-flops required is equal to (t−c)b. The total number of XOR-gates required is equal to (t−c)b−1 and the total number of AND-gates required is equal to (t−c)b. The encoder complexity is linearly proportional to the number (t−c)b of information bits.

If all the parity sections are generated in parallel at the same time, a circuit that completes encoding in b clock cycles can be implemented. In this case, c(t−c) feedback shift-registers are needed. To start the encoding, all the first columns $h_{i,j}$'s of the c(t−c) circulants in the P-matrix of $G_{qc}$ are loaded into the feedback shift-registers in one clock cycle, and the first bits, $p_{1,1}, p_{2,1}, \ldots, p_{c,1}$, of all the c parity sections are formed. Then by cyclically shifting all the feedback registers b−1 times in parallel, the other c(b−1) parity bits can be generated. In this way, the encoding is completed in b clock cycles. This implementation requires a total of c(t−c)b flip-flops, c((t−c)b−1)

XOR-gates, and c(t−c)b AND-gates. Other encoding circuits with encoding speeds between cb or (t−c)b and b clock cycles can be implemented in an obvious similar manner. This offers a wide range of trade-offs between encoding speed and encoding complexity.

Two Stage Encoder Implementation for Case I

A two-stage encoder can also be implemented. Assume that the first b×b circulant $A_{1,t-c+1}$ of the array D given by equation (8) has rank b. This can be achieved by arranging the columns and rows of circulants of $H_{qc}$ such that D has rank cb. It follows that $D^{-1}$ can be formed based on the circulants in D. It is known that the inverses, products, and sums of circulants are also circulants. Consequently, $D^{-1}$ is also a c×c array of b×b circulants.

$$D^{-1} = \begin{bmatrix} B_{1,1} & \cdots & B_{1,c} \\ \vdots & \ddots & \vdots \\ B_{c,1} & \cdots & B_{c,c} \end{bmatrix}. \tag{16}$$

It follows from equations (10), (12), and (16) that for $1 \leq i \leq t-c$, we have:

$$\begin{bmatrix} G_{i,1}^T \\ \vdots \\ G_{i,c}^T \end{bmatrix} = \begin{bmatrix} B_{1,1} & \cdots & B_{1,c} \\ \vdots & \ddots & \vdots \\ B_{c,1} & \cdots & B_{c,c} \end{bmatrix} \cdot \begin{bmatrix} B_{1,i} \\ \vdots \\ B_{c,i} \end{bmatrix} \tag{17}$$

For $1 \leq j \leq c$, let $B_j = [B_{j,1} \ldots B_{j,c}]$ (denote the j-th row of $D^{-1}$). Multiplying out the right side of equation (17), we obtain the circulants $G_{i,j}$'s in $G_{qc}$:

$$G_{i,j} = M_i^T B_j^T = \sum_{k=1}^{c} A_{k,i}^T B_{j,k}^T, \tag{18}$$

for $1 \leq i \leq t-c$ and $1 \leq j \leq c$. It follows from equations (9) and (18) that the generator matrix of the code $C_{qc}$ can be put in the following SC-form:

$$G_{qc} = \begin{bmatrix} I & O & \cdots & O & M_1^T B_1^T & M_1^T B_2^T & \cdots & M_1^T B_c^T \\ \vdots & \vdots & \ddots & \vdots & \vdots & \vdots & \ddots & \vdots \\ O & O & \cdots & I & M_{t-c}^T B_1^T & M_{t-c}^T B_2^T & \cdots & M_{t-c}^T B_c^T \end{bmatrix}. \tag{19}$$

Again, let $a=(a_1, a_2, \ldots, a_{t-c})$ be the information sequence to be encoded and $v=(a, p_1, p_2, \ldots, p_c)$ be its codeword. From equation (19) and $v^T = G_{qc}^T a^T$, we find the j-th parity section $p_j$ is:

$$p_j^T = B_j \sum_{k=1}^{t-c} M_k a_k^T = B_j [M_1 \ M_2 \ \cdots \ M_{t-c}] a^T. \tag{20}$$

From equation (20), we can compute the j-th parity section $p_j$ in two stages. First, we compute the cb-bit vector:

$$y^T = [M_1 M_2 \ldots M_{t-c}] a^T. \tag{21}$$

and then compute the j-th b-bit parity section $p_j = B_j y^T$. Divide the vector y into c sections, $y = (y_1 y_2 \ldots y_c)$, where for $1 \leq k \leq c$, the k-th section $y_k = (y_{k,1}, y_{k,2}, \ldots, y_{k,b})$. Recall that for $1 \leq i \leq t-c$, $M_i$ is the i-th column of circulants of $H_{qc}$ given by equation (7). It follows from equation (21) that the k-th section $y_k$ is given by:

$$y_k^T = \sum_{i=1}^{t-c} A_{k,i} a_i^T. \tag{22}$$

Figure 6:
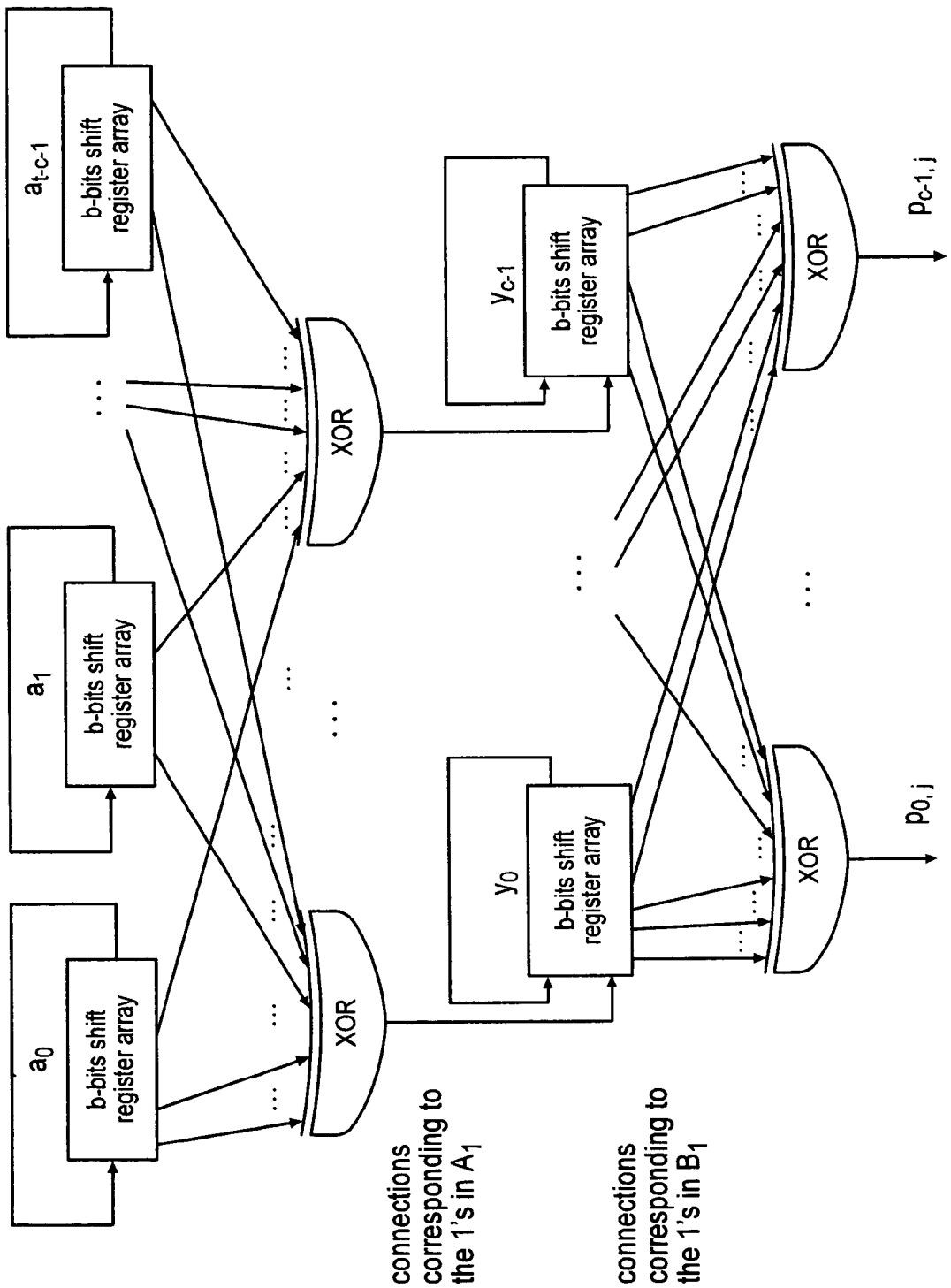
FIG. 6 illustrates a two-stage binary Quasi-Cyclic Low Density Parity Check encoder circuit.

For $1 \leq l \leq b$, let $a_i^{(l)}$ denote the l-th (left) cyclic-shift of $a_i$ (i.e., cyclically shifting each component of $a_i$ to the left l places). From equation (22), we find that for $1 \leq l \leq b$, the l-th bit of $y_k$ can be expressed as follows:

$$y_{k,l} = \sum_{m=1}^{t-c} q_{k,m} (a_m^{(l-1)})^T, \tag{23}$$

where $q_{k,i}$ is the generator (first row) of the circulant $A_{k,i}$, and $(a_i^{(l-1)})^T$ is the transpose of $a_i^{(l-1)}$ for $1 \leq i \leq t-c$. In equation (23), we have expressed the bit $y_{k,l}$ in terms of the cyclic-shifts of the information sections, $a_1, a_2, \ldots, a_{t-c}$. Assume that the weight of each generator $q_{k,i}$ is w. Then each term in equation (23) is the sum of w information bits. Based on equation (23), y can be formed with a circuit that is the upper part of the two-stage Quasi-Cyclic Low Density Parity Check encoder circuit shown in FIG. 6. All the t−c information sections are read into the t−c feedback shift-registers, $FR_1, FR_2, \ldots, FR_{t-c}$, in one clock cycle. As soon as the information sections have been read into these feedback shift-registers, the bits $y_{1,1}, y_{2,1}, \ldots, y_{c,1}$ are formed based on equation (23) and appear at the outputs of the c banks of XOR-gates. These bits are then shifted into c buffer registers, $BR_1, BR_2, \ldots, BR_c$, as shown in the lower half of the circuit in FIG. 6. Cyclically shifting $FR_1, FR_2, \ldots, FR_{t-c}$ (shift to left) in parallel b−1 times, we generate all the other bits of y. At the end of the b-th clock cycle, all the c sections of y are stored in $BR_1$, $BR_2, \ldots, BR_c$. This completes the first stage of encoding. This encoding stage requires a total of tb flip-flops and (t−c) w−1 XOR-gates.

The next stage is to form the c parity sections based on $P_j^T = B_j y^T$. This can be done using another c banks of XOR-gates. If the parity-check bits of each parity section are generated serially one bit at a time, we simply cyclically shift the buffer registers, $BR_1, BR_2, \ldots, BR_c$, b times (left shift). The parity-check bits are generated in the same manner as the bits of y-vector. In this way, the number of XOR-gates required in each bank is of the order of cb/2 (we assume that the average row weight of each circulant in $B_j$ is b/2). Consequently, the total number of XOR-gates used to form the parity bits is in the order of $c^2$ b/2, denoted $O(c^2$ b/2). This two-stage encoding circuit completes the encoding of (t−c)b information bits in 2b clock cycles, and requires a total of tb flip-flops and a total of $O(c^2$ b/2)+(t−c)w−1 XOR-gates. Note that the above two-stage encoding implementation is based on the circulants $A_{i,j}$ in the c×c subarray D of the parity-check matrix $H_{qc}$.

If we generate two bits of each section $y_k$ at a time and two parity bits of each parity section $p_j$ at a time, we can complete the encoding in b clock cycles. In this case, the total number of XOR-gates required to form the cb parity bits is $O(c^2$ b)+2((t−c)w−1). The total number of flip-flops required is still equal to tb. Since each circulant in the parity check matrix $H_{qc}$ is a sparse matrix and w is normally very small, say equal to 1 or 2, then 2((t−c)w−1) is much smaller than $c^2$ b; hence, the total number of XOR-gates used in the encoding circuit is $O(c^2 b)$. In summary, for high-speed encoding, the complexity of the two-stage encoding is linearly proportional to the code length tb. Table I gives the speeds and complexities of various encoding circuits where the parity-check matrix $H_{qc}$ given by equation (7) is a c×t array of b×b circulants $A_{i,j}$. Other encoding circuits can be implemented to provide various trade-offs between speed and complexity.

TABLE I

| Encoding scheme | Encoding speed (Clock cycles) | Flip-flops | Two-input XOR-gates | Two-input AND-gates |
|---|---|---|---|---|
| Shift Register Adder Accumulator(1) | (t − c) b | 2cb | cb | cb |
| Shift Register Adder Accumulator(2) | cb | (t − c) b | (t − c) b − 1 | (t − c) b |
| Two-stage | b | tb | $O(c^2 b)$ | 0 |

Encoder Implementations for Case II

In the last two sections, we considered the simple case for which the rank $r_H$ of the parity-check matrix $H_{qc}$ of a binary Quasi-Cyclic Low Density Parity Check code given by equation (7) is equal to the number of rows of $H_{qc}$, i.e., cb, and there exists a c×c subarray D in $H_{qc}$ with rank $r_H$. Now we consider the case for which $r_H < cb$, or when $r_H = cb$, and there does not exist a c×c subarray D in $H_{qc}$ with rank $r_H$. For this case, we first find the least number of columns of circulants in $H_{qc}$, say l with $c \leq l \leq t$, such that these l columns of circulants form a c-l subarray D* whose rank is equal to the rank $r_H$ of $H_{qc}$. We permute the columns of circulants of $H_{qc}$ to form a new c×t array $H_{qc}^*$ of circulants such that the last (or the right most) l columns of circulants of $H_{qc}^*$ form the array D*. Let:

$$D^* = \begin{bmatrix} A_{1,t-l+1} & A_{1,t-l+2} & \cdots & A_{1,t} \\ A_{2,t-l+1} & A_{2,t-l+2} & \cdots & A_{2,t} \\ \vdots & \vdots & \ddots & \vdots \\ A_{c,t-l+1} & A_{c,t-l+2} & \cdots & A_{c,t} \end{bmatrix}. \quad (24)$$

Then the desired generator matrix corresponding to the parity check matrix $H_{qc}^*$ is a $(tb-r_H) \times tb$ matrix and has the following form:

$$G_{qc}^* = \begin{bmatrix} G \\ Q \end{bmatrix}, \quad (25)$$

which consists of two submatrices G and Q. The G submatrix is a (t-l)×t array of the following form:

$$G = \begin{bmatrix} I & O & \cdots & O & G_{1,1} & \cdots & G_{1,l} \\ O & I & \cdots & O & G_{2,1} & \cdots & G_{2,l} \\ \vdots & \vdots & \ddots & \vdots & \vdots & \ddots & \vdots \\ O & O & \cdots & I & G_{t-l,1} & \cdots & G_{t-l,l} \end{bmatrix}, \quad (26)$$

where I is a b×b identity matrix, O is a b×b zero matrix, and $G_{i,j}$ is a b×b circulant for $1 \leq i \leq t-l$ and $1 \leq j \leq l$. The matrix G is in SC-form and can be obtained by solving equation (11) by setting the $lb-r_H$ linearly dependent elements in $z_i = (g_{i,1}, g_{i,2} \ldots g_{i,l})$ to zeros with $1 \leq i \leq t-l$ (these elements correspond to the linearly dependent columns of D*), where $g_{ij}$ is the generator of circulant $G_{i,j}$ with $1 \leq j \leq l$.

The submatrix Q of $G_{qc}^*$ is an $(lb-r_H) \times tb$ matrix whose rows are linearly independent and also linearly independent of the rows of the submatrix G of $G_{qc}^*$. For $G_{qc}^*$ to be a generator matrix of the code $C_{qc}$ that is the null space of $H_{qc}^*$, Q must satisfy the condition $H_{cq}^* Q^T = [O]$ where [O] is a cb×(lb-$r_H$) zero matrix. To obtain the Q submatrix of $G_{qc}^*$, let $d_1, d_2, \ldots, d_l$ be the number of linearly dependent columns in the 1st, 2nd, ..., l-th columns of circulants in D* respectively, so that $$\sum_{i=1}^{l} d_i = lb - r_H.$$

Due to the cyclic structure of circulants described above, the last b-$d_i$ columns of the i-th column of circulants in D* can be regarded as being the linearly independent columns. Then the first $d_1, d_2, \ldots, d_l$ columns of the 1st, 2nd, l-th columns of circulants of D* are linearly dependent columns. Let:

$$Q = \begin{bmatrix} O_{1,1} & O_{1,2} & \cdots & O_{1,t-l} & Q_{1,1} & Q_{1,2} & \cdots & Q_{1,l} \\ \vdots & \vdots & \ddots & \vdots & \vdots & \vdots & \ddots & \vdots \\ O_{l,1} & O_{l,2} & \cdots & O_{l,t-l} & Q_{l,1} & Q_{l,2} & \cdots & Q_{l,l} \end{bmatrix} \quad (27)$$

where each $O_{i,j}$ is a $d_i \times b$ zero matrix for $1 \leq i \leq l$, and $1 \leq k \leq t-l$ and $Q_{i,j}$ is a $d_i \times b$ matrix over GF(2) for $1 \leq j \leq l$. Each non-zero submatrix $Q_{i,j}$ is a partial circulant obtained by cyclically shifting the first row of $Q_{i,j}$ (one place to the right) $d_i - 1$ times to form the other $d_i - 1$ rows. Therefore, Q also has a circulant structure. For $1 \leq i \leq l$, let $q_i = (0 \, 0 \ldots 0 \, q_{i,1} \, q_{i,2} \ldots q_{i,lb})$ be the first row of the i-th row of submatrices, $[O_{i,1} \ldots O_{i,t-l} Q_{i,1} \ldots Q_{i,l}]$, of Q, which has the following structure: (1) the first (t-l)b components are zeros; and (2) the lb-$r_H$ bits of $w_i = (q_{i,1} q_{i,2} \ldots q_{i,lb})$ that correspond to the linearly dependent columns of D*, called the dependent bits, have the form, $(0_1 \ldots 0_{i-1} u_i 0_{i+1} \ldots 0_l)$ where for $s \neq i$, 0s is a zero $d_s$-tuple and $u_i = (1, 0, \ldots, 0)$ is a unit $d_i$-tuple. Based on the structure of $w_i$, there are $r_H$ unknown components of $w_i$, the same number as the rank of D*. The condition $H_{qc}^* Q^T = [O]$ gives the following equation for $1 \leq i \leq l$:

$$D^* \cdot w_i^T = \begin{bmatrix} A_{1,t-l+1} & A_{1,t-l+2} & \cdots & A_{1,t} \\ A_{2,t-l+1} & A_{2,t-l+2} & \cdots & A_{2,t} \\ \vdots & \vdots & \ddots & \vdots \\ A_{c,t-l+1} & A_{c,t-l+2} & \cdots & A_{c,t} \end{bmatrix} \cdot \begin{bmatrix} q_{i,1} \\ q_{i,2} \\ \vdots \\ q_{i,bl} \end{bmatrix} = 0 \quad (28)$$

By solving equation (28), we find $w_i = (q_{i,1} q_{i,2} \ldots q_{i,lb})$ for $1 \leq i \leq l$. Divide the vector $w_i$ into l sections, denoted $w_{i,1}, w_{i,2}, \ldots, w_{i,l}$, each consisting of b consecutive components of $w_i$. For $1 < j \leq l$, $Q_{i,j}$ is obtained by using $w_{i,j}$ as the first row and then cyclically shifting it $d_i - 1$ times to form the other $d_i - 1$ rows. We form the matrix Q from the $Q_{i,j}$'s with $1 \leq i, j \leq l$.

Based on the generator matrix $G_{qc}^*$ given by equation (25), an encoder with two sub-encoders can be implemented. The first sub-encoder is implemented based on the submatrix G, and the second one is implemented based on the submatrix Q. An information sequence a of length $(tb-r_H)$ bits is divided into two parts, $a^{(1)}$ and $a^{(2)}$, where $a^{(1)}$ consists of the first $(t-1)b$ information bits and $a^{(2)}$ consists of the last $lb-r_H$ information bits. The first sub-encoder encodes $a^{(1)}$ into a codeword in the subcode $C^{(1)}$ generated by G, and the second sub-encoder encodes $a^{(2)}$ into a codeword in the subcode $C^{(2)}$ generated by Q. Adding the outputs of the two sub-encoders, we obtain the codeword for the information sequence a.

The first sub-encoder based on the submatrix G of $G_{qc}^*$ can be implemented in exactly the same way as described for the single stage encoder implementation of Case I. To encode the second part $a^{(2)}$ of the information sequence a into a codeword in the subcode $C^{(2)}$ generated by the submatrix Q of $G_{qc}^*$, we divide $a^{(2)}$ into l sections, $a_1^{(2)}, a_2^{(2)}, \ldots, a_l^{(2)}$ with $d_1, d_2, \ldots, d_l$ bits, respectively. Then the codeword for $a^{(2)}$ is of the form:

$$v^{(2)} = (0\ 0\ \ldots\ 0 v_1^{(2)} \ldots v_l^{(2)}), \tag{29}$$

which consists of $t-l$ zero-sections and $l$ non-zero sections, $v_1^{(2)}, \ldots, v_l^{(2)}$, with each section consisting of b bits. For $1 \leq j \leq l$:

$$v_j^{(2)} = \sum_{m=1}^{l} a_m^{(2)} Q_{m,j}. \tag{30}$$

Since each $Q_{i,j}$ in Q with $1 \leq i, j \leq l$ is a partial circulant with $d_j$ rows, the second sub-encoder can be implemented with l Shift-Register-Adder-Accumulator circuits of the type shown in FIG. 3. In the encoding procedure, the j-th Shift-Register-Adder-Accumulator circuit uses $a_1^{(2)}, a_2^{(2)}, \ldots, a_l^{(2)}$ as the inputs has the contents $w_{1,j}, w_{2,j}, \ldots, w_{l,j}$ stored in the shift-register B in turn cyclically shifted $d_1, d_2, \ldots, d_l$ times, respectively. At the end of the shifts, $v_j^{(2)}$ is stored in the accumulator register A. If the first sub-encoder is also implemented with l Shift-Register-Adder-Accumulator circuits, these same l Shift-Register-Adder-Accumulator circuits can be used to encode the second part $a^{(2)}$ of the information sequence a (after encoding of $a^{(1)}$).

With the above encoding, the output codeword for the information sequence is not completely systematic. Only the first $(t-1)b$ bits are identical to information bits.

Universal Encoder for Families of Structurally Compatible Binary Quasi-Cyclic Low Density Block Check Codes Consider the structurally compatible families of binary Quasi-Cyclic Low Density Parity Check codes described previously. An encoder can be designed for the base code in this family using the encoder implementation techniques described above. Since the parity check matrix of each code in this structurally compatible family is obtained by deleting columns and rows of circulant matrices in the base code parity check matrix, the encoder of the base code can be used to serve as an encoder for each code of the family with appropriate circuit blocks disabled. We illustrate this by considering the two codes given previously in Example 2. Recall that the parity check matrix H(3,4) of the base code C(3,4) is given by:

$$H(3,4) = \begin{bmatrix} 0 & 0 & 1 & 0 & 0 & 0 & 1 & 0 & 0 & 0 & 1 & 0 \\ 1 & 0 & 0 & 0 & 0 & 0 & 0 & 1 & 0 & 0 & 0 & 1 \\ 0 & 1 & 0 & 0 & 0 & 0 & 0 & 0 & 1 & 1 & 0 & 0 \\ 0 & 1 & 0 & 1 & 0 & 0 & 0 & 0 & 0 & 0 & 0 & 1 \\ 0 & 0 & 1 & 0 & 1 & 0 & 0 & 0 & 0 & 1 & 0 & 0 \\ 1 & 0 & 0 & 0 & 0 & 1 & 0 & 0 & 0 & 0 & 1 & 0 \\ 1 & 0 & 0 & 0 & 1 & 0 & 0 & 0 & 1 & 0 & 0 & 0 \\ 0 & 1 & 0 & 0 & 0 & 1 & 1 & 0 & 0 & 0 & 0 & 0 \\ 0 & 0 & 1 & 1 & 0 & 0 & 0 & 1 & 0 & 0 & 0 & 0 \end{bmatrix}$$

and the derived structurally compatible code C(2,3) that is obtained by deleting the last row and the last column of 3×3 circulants has parity check matrix H(2,3) given by:

$$H(2,3) = \begin{bmatrix} 0 & 0 & 1 & 0 & 0 & 0 & 1 & 0 & 0 \\ 1 & 0 & 0 & 0 & 0 & 0 & 0 & 1 & 0 \\ 0 & 1 & 0 & 0 & 0 & 0 & 0 & 0 & 1 \\ 0 & 1 & 0 & 1 & 0 & 0 & 0 & 0 & 0 \\ 0 & 0 & 1 & 0 & 1 & 0 & 0 & 0 & 0 \\ 1 & 0 & 0 & 0 & 0 & 1 & 0 & 0 & 0 \end{bmatrix}$$

Using the methods described above, we find the generator matrix G(3,4) in circulant form corresponding to the parity check matrix H(3,4) to be:

$$G(3,4) = \begin{bmatrix} I & G_{1,1} & G_{1,2} & G_{1,3} \\ 0 & Q_{1,1} & Q_{1,2} & Q_{1,3} \end{bmatrix}$$

$$= \begin{bmatrix} 1 & 0 & 0 & 0 & 1 & 1 & 1 & 0 & 0 & 1 & 0 & 0 \\ 0 & 1 & 0 & 1 & 0 & 1 & 0 & 1 & 0 & 0 & 1 & 0 \\ 0 & 0 & 1 & 1 & 1 & 0 & 0 & 0 & 1 & 0 & 0 & 1 \\ 0 & 0 & 0 & 1 & 0 & 1 & 0 & 1 & 1 & 1 & 1 & 0 \\ 0 & 0 & 0 & 1 & 1 & 0 & 1 & 0 & 1 & 0 & 1 & 1 \end{bmatrix}$$

Note that $Q_{1,1}, Q_{1,2}$, and $Q_{1,3}$ are partial circulants, not full circulants. Moreover, using the methods described above, we find the generator matrix G(2,3) in circulant form corresponding to the parity check matrix H(2,3) to be:

$$G(2,3) = [I\ G_{1,1}\ G_{1,2}] = \begin{bmatrix} 1 & 0 & 0 & 0 & 0 & 1 & 0 & 1 & 0 \\ 0 & 1 & 0 & 1 & 0 & 0 & 0 & 0 & 1 \\ 0 & 0 & 1 & 0 & 1 & 0 & 1 & 0 & 0 \end{bmatrix}$$

Consider the generator matrix G(3,4) first for the code C(3,4). Suppose that the information sequence of 5 bits to be encoded is $a = (a_1, a_2) = (a_1 a_2 a_3, a_4 a_5)$ and the information sequence a is divided into two sections, $a_1$ and $a_2$. Then the codeword for the information sequence a is $v = aG(3,4)$, which has the following form: $v = (p_1, p_2, p_3, a_1)$ where $p_i = (p_{i1} p_{i2} p_{i3})$ is a section of 3 parity-check bits. Let $g_{i,j}$ be the first row of $G_{i,j}$, and let $q_{i,j}$ be the first row of $Q_{i,j}$ as described previously. Moreover, denote $g_{i,k}^{(k)}$ to be the k-th cyclic shift of $g_{i,j}$. Then:

$$p_j = a_1 g_{1,j}^{(0)} + a_2 g_{1,j}^{(1)} + a_3 g_{1,j}^{(2)} + a_4 q_{1,j}^{(0)} + a_5 q_{1,j}^{(1)}$$

Figure 7:
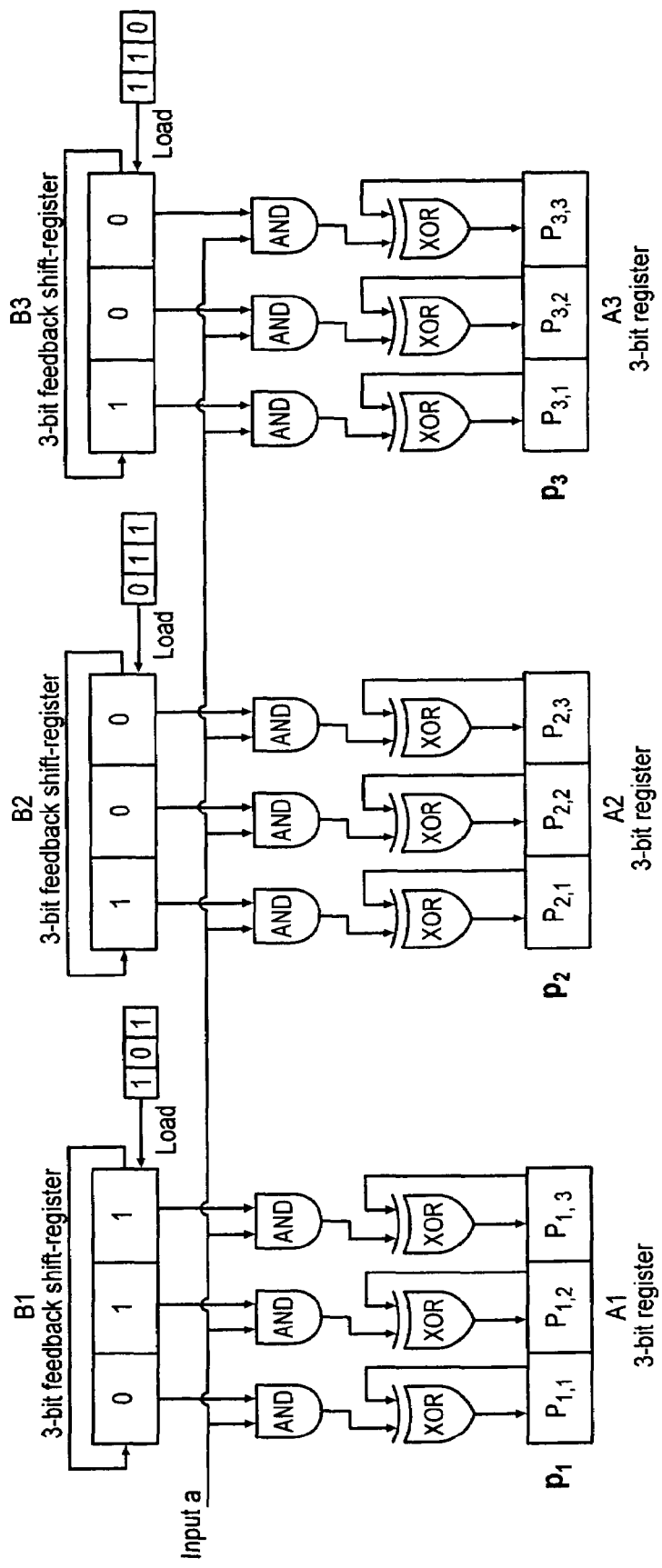
FIG. 7 illustrates an encoder for the binary Quasi-Cyclic Low Density Parity Check code C(3,4)

Based on this expression, an encoder circuit for code C(3, 4) can be obtained as shown in FIG. 7. This circuit consists of three Shift-Register-Adder-Accumulator circuits. The j-th Shift-Register-Adder-Accumulator circuit corresponds to the j-th column of circulants of the generator matrix G(3,4) and is used to produce the j-th section of parity-check bits $p_j$. For example, consider the leftmost Shift-Register-Adder-Accumulator circuit corresponding to the first column of circulants of generator matrix G(3,4). At the start, $g_{1,1}^{(0)}$=(011) is stored in the 3-bit feedback shift-register B1 and the contents of the 3-bit accumulator register A1 are set to zero. When the information bit $a_1$ is shifted into the encoder, the product $a_1 g_{1,1}^{(0)}$ is formed at the outputs of the AND-gates and is added to the contents stored in the register A1 (zero at this time). The sum is then stored in the register A1. The feedback register B1 is shifted once to the right. The new contents of B1 are then $g_{1,1}^{(1)}$. When the next information bit $a_2$ is shifted into the encoder, the product $a_2 g_{1,1}^{(1)}$ is formed at the outputs of the AND-gates. This product is then added to the sum $a_1 g_{1,1}^{(0)}$ in the accumulator register A1. The sum $a_1 g_{1,1}^{(0)} + a_2 g_{1,1}^{(1)}$ is then stored in A1. The above shift-add-store process continues until the last bit of section $a_1$ enters the encoder; after which the register A1 stores the partial sum $a_1 G_{1,1}$, which is the contribution to the parity section p from the information section $a_1$. At this time, the generator $q_{1,1}^{(0)}$=(101) of the circulant $Q_{1,1}$ is loaded into B1. The shift-add-store process repeats. When the information section $a_2$ has been completely shifted into the encoder, register A1 contains the accumulated sum $p_j = a_1 g_{1,1}^{(0)} + a_2 g_{1,1}^{(1)+a} {}_3 g_{1,1}^{(2)+a} {}_4 q_{1,1}^{(0)} + a_5 q_{1,1}^{(1)}$. At the same time, register A2 and A3 contain the parity section $p_2$ and $p_3$, respectively. The encoding process ends after all the parity-check bits have been formed.

Figure 9:
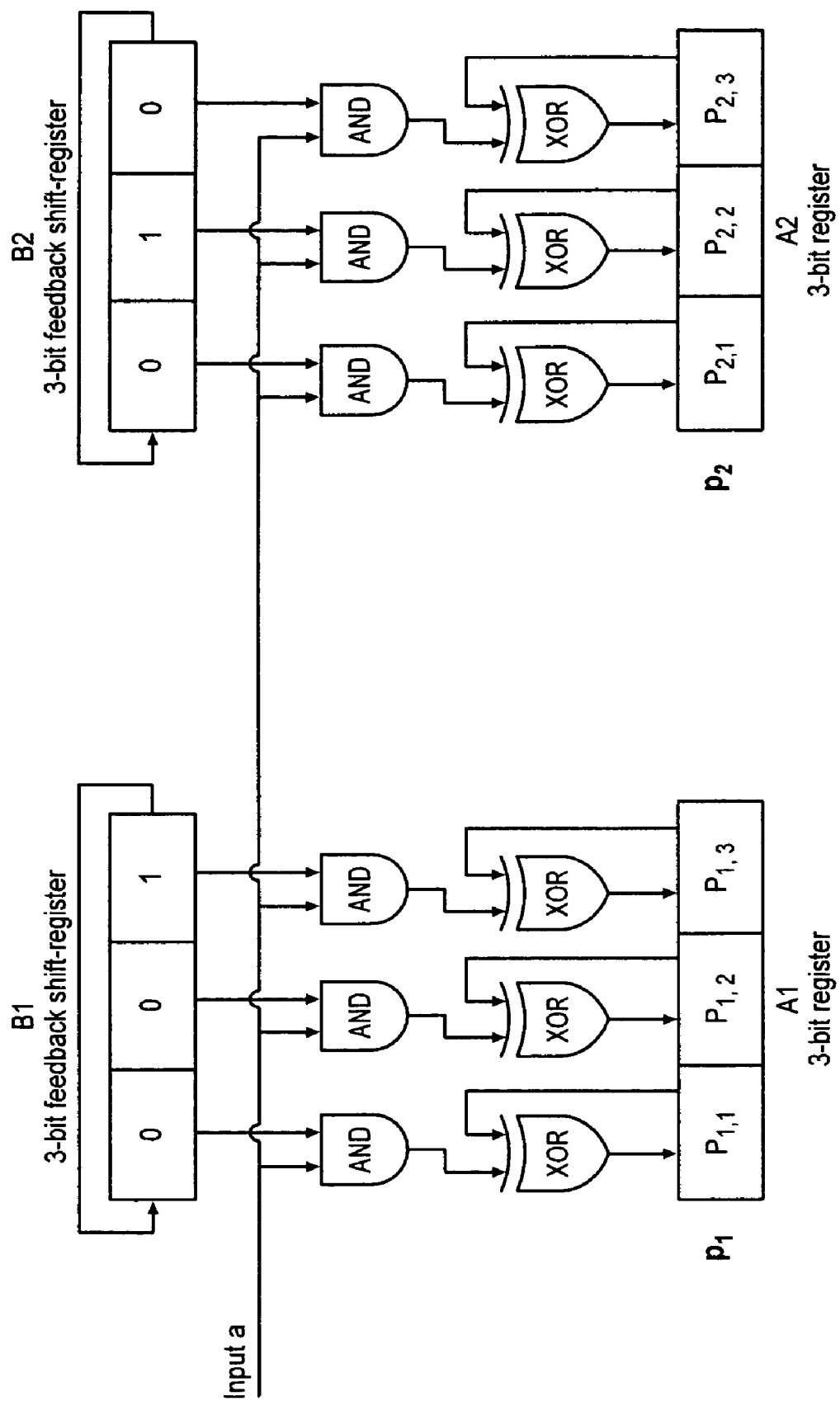
FIG. 9 illustrates an encoder for the binary Quasi-Cyclic Low Density Parity Check code C(2,3)

The encoder circuit for the code C(3,4) shown in FIG. 7 can also be used as an encoder for the code C(2,3). The only modification is to turn off the 3$^{rd}$ Shift-Register-Adder-Accumulator circuit and update the contents stored in the feedback shift registers B1 and B2 using G(2,3). FIG. 9 shows the encoder circuit for the code C(2,3).

Channel Decoding Algorithms for Binary Regular Low Density Parity Check Codes

Binary regular Low Density Parity Check codes can be efficiently decoded in various ways. Even though many regular Low Density Parity Check codes have been devised primarily for Soft-Input Soft-Output (SISO) iterative decoding based on belief propagation, such as Sum-Product Algorithm decoding, other decoding methods of less complexity can also be employed. These include the hard-decision One-Step Majority-Logic (OSML) and Bit Flipping (BF) methods that require only simple logical operations in implementations. OSML decoding has the least decoding delay and very high decoding speed can be achieved. A $(\gamma, \rho)$-regular Low Density Parity Check code decoded with OSML decoding can correct any error pattern with $\lfloor \gamma/2 \rfloor$ or fewer random errors. Therefore, for a code to be effective with the OSML decoding, $\gamma$ must be relatively large. While BF decoding can result in better performance than OSML, the soft-decision decoding scheme such as Sum-Product Algorithm decoding provides the best error probability performances. However, Sum-Product Algorithm decoding requires extensive computations; hence, they require highly complexity implementations. Intermediate in complexity between the hard-decision and soft-decision methods are the weighted OSML and weighted BF decoding methods. Weighted OSML and weighted BF decoding are reliability-based decoding methods that require some real-number computations besides logical operations. They improve the error performance of OSML and BF decoding at a cost of some additional computational complexity and offer a good trade-off between error performance and decoding complexity. The binary Quasi-Cyclic Low Density Parity Check codes used in this universal forward error-correction coding system have the significant advantage of being able to employ any of the above decoding algorithms with good error performance and to implement channel decoders of varying complexity. This provides the capability of realizing useful trade-offs between decoder implementation complexity and error performance for many applications.

The following sections describe the concept of Tanner graphs, which are useful for understanding the structural properties of Low Density Parity Check codes as well as iterative decoding methods. We describe a new weighted BF decoding method called Double-Weighted Bit Flipping (DWBF) decoding. Double-Weighted Bit Flipping decoding has an error performance that can approach that of Sum-Product Algorithm decoding for the binary Quasi-Cyclic Low Density Parity Check codes of this universal forward error-correction coding system and yet has roughly an implementation complexity similar to that of the standard weighted Bit Flipping decoding method.

Tanner Graphs

Tanner graphs represent general linear codes by bipartite graphs that are useful for analyzing the structure of Low Density Parity Check codes as well as for representing message passing in iterative decoding algorithms such as the Sum-Product Algorithm, Bit Flipping, and weighted Bit Flipping methods.

Consider a binary $(\gamma, \rho)$-regular Low Density Parity Check code of blocklength n specified as the null space of a parity check matrix H with J rows and n columns. Let $h_1, h_2, \ldots, h_j$ be the rows of H where $h_j = (h_{j,0}, h_{j,1}, \ldots, h_{j,n-1})$ for $1 \le j \le J$. It follows from equation (5) that a n-tuple $v = (v_0, v_1, \ldots, v_{n-1})$ is a codeword if and only if the inner product:

$$s_j = v \cdot h_j^T = \sum_{l=0}^{n-1} v_l h_{j,l} = 0 \tag{31}$$

for $1 \le j \le J$. The sum given by equation (31) is called a parity-check sum (or simply check sum), which is simply a linear sum of a subset of code bits. A code bit $v_l$ is said to be checked by the check sum $s_j = v \cdot h_j^T$ (or the row $h_j$) if $h_{j,l} = 1$.

A graph can be constructed to display the relationship between the code bits and the check sums that check on them. This graph consists of two levels of vertices. The first level consists of n vertices, which represent the n code bits of the code. These vertices, denoted $v_1, v_2, \ldots, v_n$, are called the code bit (or variable) vertices (or nodes). The second level consists of J vertices which represent the J check sums $s_1, s_2, \ldots, s_J$ that the code bits must satisfy. These vertices are called the check sum vertices (or nodes). A code bit vertex $v_l$ is connected to a check sum vertex $s_j$ by an edge, denoted ($v_l, s_j$), if and only if the code bit $v_l$ is contained in the check sum $s_j$ (or checked by the check sum $s_j$). No two code bit vertices are connected and no two check sum vertices are connected. This graph is a bipartite graph called the Tanner Graph of the code. The number of edges that are connected to (or incident at) a code bit vertex $v_l$, called the degree of $v_l$, is simply the number of check sums that contain $v_l$. The number of edges that are incident at the check sum vertex $s_j$, called the degree of $s_j$, is simply the number of code bits that are checked by the check sum $s_j$. For a binary regular Low Density Parity Check code, the degrees of all the code bit vertices are the same and the degrees of all the check sum vertices are the same. Such a Tanner Graph is said to be regular.

EXAMPLE 3

Consider a sample binary linear code with parity check matrix:

$$H = \begin{bmatrix} 1 & 1 & 1 & 1 & 0 \\ 1 & 1 & 1 & 0 & 1 \\ 0 & 0 & 0 & 1 & 1 \end{bmatrix}$$

Figure 8:
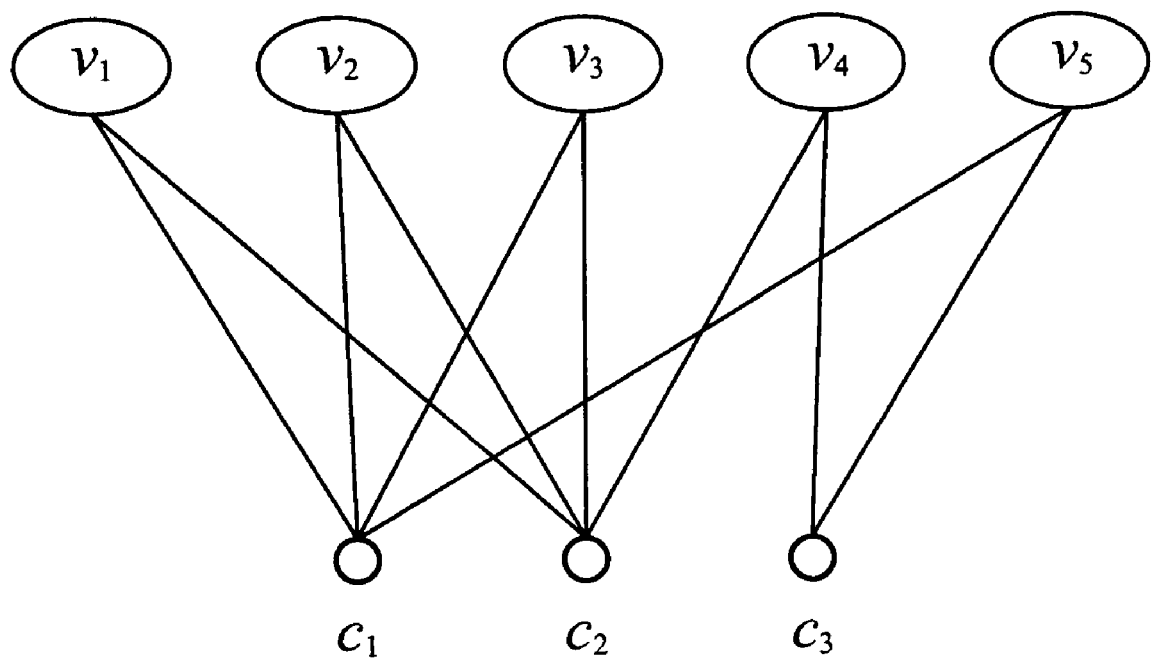
FIG. 8 illustrates a Tanner Graph.

The Tanner Graph is shown in FIG. 8. The variable (or codeword) nodes in this Tanner Graph correspond to the codeword bits and are represented by the circles labeled $v_1, \ldots, v_5$. The check-sum nodes correspond to the rows of the parity check matrix and are represented by the circles labeled $c_1, c_2, c_3$.

A cycle in a graph of vertices and edges is defined as a sequence of connected edges that starts from a vertex and ends at the same vertex, and satisfies the condition that no vertex (except the initial and the final vertex) appears more than once. The number of edges on a cycle is called the length of the cycle. The length of the shortest cycle in a graph is called the girth of the graph. The Tanner Graph of a linear block code contains no cycles of length 2 and no cycles of odd lengths. Therefore, the girth of the Tanner Graph of a linear block code is at least 4.

The error performance for soft-decision iterative Sum-Product Algorithm decoding of a linear code very much depends on cycles of short lengths in its Tanner Graph. These short cycles, especially cycles of length 4, make successive decoding iterations highly correlated; hence, they severely limit decoding performance. Therefore, to use the Sum-Product Algorithm for decoding, it is important to design codes without short cycles in their Tanner Graphs, especially cycles of length 4. The Tanner Graphs of binary ($\gamma$, $\rho$)-regular Low Density Parity Check codes are regular. Since the row and column weights of H are $\rho$ and $\gamma$, respectively, the degrees of each check sum vertex and each code bit vertex in the Tanner Graph are $\rho$ and $\gamma$, respectively. It follows from the Row-Column constraint on the columns and rows of the parity check matrix H of a binary Low Density Parity Check code that no two-code bits are checked simultaneously by two-check sums. This implies that the Tanner Graph of a binary Low Density Parity Check code does not contain cycles of length 4. However, they may contain cycles of length 6. Hence, the girth of the Tanner Graph of a binary regular or irregular Low Density Parity Check code, specified by a Row-Column constrained parity-check matrix, is at least 6. The binary Quasi-Cyclic Low Density Parity Check codes described above satisfy the Row-Column constraint; therefore, their Tanner Graphs have a girth of at least 6.

Standard Decoding Algorithms

For illustrative purposes, we describe in this section decoding methods only for Binary Phase Shift Keying (BPSK) modulation over Additive White Gaussian Noise channels. Decoding for other communication channels (storage medium) can be addressed similarly.

Suppose a binary ($\gamma$, $\rho$)-regular Low Density Parity Check code with J×n parity check matrix H is used for over an Additive White Gaussian Noise channel with zero mean and power spectral density $N_0/2$. Assume coherent BPSK signaling with unit energy. A codeword $v=(v_0, v_1, \ldots, v_{n-1})$ is mapped into a bipolar sequence $x=(x_0, x_1, \ldots, x_{n-1})$ before its transmission, where $x_l=(v_l-1)=+1$ for $v_l=1$ and $x_l=-1$ for $v_l=0$ with $0 \leq l \leq n-1$. Let $y=(y_0, y_1, \ldots, y_{n-1})$ be the soft-decision received sequence at the output of the demodulator matched filter. For $0 \leq l \leq n-1$, $y_l = \pm 1 + n_l$ where $n_l$ is a Gaussian random variable with zero mean and variance $N_0/2$. Let $z=(z_0, z_1, \ldots, z_{n-1})$ be the binary hard-decision received sequence obtained from y as follows: $z_l=1$ for $y_l>0$ and $z_l=0$ for $y_l \leq 0$. Let $h_1, h_2, \ldots, h_J$ be the rows of H where $h_j=(h_{j,0}, h_{j,1}, \ldots, h_{j,n-1})$ for $1 \leq j \leq J$. Then:

$$s=(s_1,s_2,\ldots s_J)=z \cdot H^T \quad (32)$$

gives the syndrome of the received sequence z, where the j-th syndrome component $s_j$ is given by the check sum:

$$s_j = z \cdot h_j = \sum_{l=0}^{n-1} z_l h_{j,l} \quad (33)$$

The received vector z is a codeword if and only if $s=0$. If $s \neq 0$, then errors in z are detected. A non-zero syndrome component $s_j$ indicates a parity failure. The total number of parity failures is equal to the number of non-zero syndrome components in s. Let:

$$e=(e_0,e_1,\ldots e_{n-1})=(v_0,v_1,\ldots v_{n-1})+(z_0,z_1,\ldots z_{n-1}) \quad (34)$$

Then e is the error pattern in z. This error pattern e and the syndrome s satisfy the condition:

$$s = (s_1, s_2, \ldots s_J) = e \cdot H^T \quad (35)$$

where:

$$s_j = e \cdot h_j = \sum_{l=0}^{n-1} e_l h_{j,l} \quad (36)$$

for $1 \leq j \leq J$.

One-Step Majority-Logic Decoding

One-Step Majority-Logic (OSML) decoding of binary ($\gamma$, $\rho$)-regular Low Density Parity Check codes is as follows. A code bit $v_l$ is said to be checked by the check sum $s_j=v \cdot h_j^T$ if $h_{j,l}=1$. Let $A_l$ be the set of rows in H that check on the code bit $v_l$. Let $S_l$ denote the set of check sums formed by the rows in $A_l$. It follows from the Row-Column constraint property of H for binary ($\gamma$, $\rho$)-regular Low Density Parity Check codes that the code bit $v_l$ is contained in every check sum in $S_l$, and any of the other n−1 code bits is contained in at most one check sum in $S_l$. The check sums in $S_l$ (or the rows in $A_l$) are said to be orthogonal on the code bit $v_l$. The check sums in $S_l$ are called the orthogonal check sums on code bit $v_l$, and the rows in $A_l$ are called the orthogonal vectors on $v_l$. For $0 \leq l \leq n-1$, each code bit $v_l$ is checked by exactly $\gamma$ orthogonal check sums. So denote:

$$A_l = \{h_1^{(l)}, h_2^{(l)}, \ldots h_\gamma^{(l)}\} \quad (37)$$

as the set of $\gamma$ rows in H that are orthogonal on this bit position l; that is, the l-th component of each row in $A_l$ is 1, and no two rows in $A_l$ have a common 1 in any other position. We form the following set of syndrome equations based on the rows in $A_l$:

$$S_l = \{s_j^{(l)} = e \cdot h_j^{(l)} : h_j^{(l)} \in A_l \quad \text{for } 1 \leq j \leq \gamma\} \quad (38)$$

where:

$$s_j^{(l)} = e \cdot h_j^{(l)} = \sum_{i=0}^{n-1} e_i h_{j,i}^{(l)}. \quad (39)$$

An error digit $e_l$ is said to be checked by the check sum $S_j$ if the coefficient $h_{j,l}=1$. Each check sum in $S_l$ checks the error bit $e_l$, and any other error bit in e is checked by at most one check sum in $S_l$. Therefore, $S_l$ gives a set of γ check sums orthogonal on the error digit $e_l$.

Suppose there are $\lfloor \gamma/2 \rfloor$ or fewer errors in the error vector $e=(e_0, e_1, e_{n-1})$ (i.e., $\lfloor \gamma/2 \rfloor$ or fewer components of e are 1). If $e_l=1$, then other non-zero error digits can distribute among at most $\lfloor \gamma/2 \rfloor$ check-sums orthogonal on $e_l$. Hence, at least $\gamma - \lfloor \gamma/2 \rfloor + 1$, or more than half of the check sums orthogonal on $e_l$, are equal to $e_l=1$; however, if $e_l=0$, the non-zero error digits can distribute among at most $\lfloor \gamma/2 \rfloor$ check-sums. Hence, at least $\gamma - \lfloor \gamma/2 \rfloor$, or at least half of the check sums orthogonal on $e_l$ are equal to $e_l=0$. Thus, the value of $e_l$ is equal to the value assumed by a clear majority of the parity check sums orthogonal on $e_l$; if no value is assumed by a clear majority of the parity check sums (i.e., there is a tie), the error digit $e_l$ is zero. Based on the preceding fact, an algorithm for decoding $e_l$ can be formulated as follows. The error digit $e_l$ is decoded as 1 if a clear majority of the parity check sums orthogonal on $e_l$ takes on the value 1; otherwise, $e_l$ is decoded as 0. Correct decoding of $e_l$ is guaranteed if there are $\lfloor \gamma/2 \rfloor$ or fewer errors in the error vector e. If it is possible to form γ parity check sums orthogonal on $e_l$, it is possible to form y parity check sums orthogonal on any error digit because of the symmetry of the code. The decoding of the other error digits is identical to the decoding of the error digit $e_l$. This decoding algorithm is called One-Step Majority-Logic (OSML) decoding. The binary (γ, ρ)-regular Low Density Parity Check code is capable of correcting any error pattern with $\lfloor \gamma/2 \rfloor$ or fewer errors using OSML decoding and, as a result, its minimum distance is greater than or equal to γ+1.

Bit Flipping Decoding

Bit Flipping (BF) decoding of binary (γ, ρ)-regular Low Density Parity Check codes is as follows. When detectable errors occur during the transmission, there will be parity failures in the syndrome $s=(s_1, s_2, \ldots s_j)$, and some of the syndrome bits are equal to 1. BF decoding is based on the change of the number of parity failures in $\{z \cdot h_j : 1 \leq j \leq J\}$ when a bit in the received sequence z is changed.

First, the decoder computes all the parity check sums based on equation (33) and then changes any bit in the received vector z that is contained in more than some fixed number δ of unsatisfied parity check equations (i.e., with non-zero check sums). Using these new values, the parity check sums are recomputed, and the process is repeated until the parity check equations are all satisfied (i.e., all the check sums are equal to zero). This is then an iterative decoding algorithm. The parameter δ, called threshold, is a design parameter that should be chosen to optimize the error performance while minimizing the number of computations of parity check sums. The value of δ depends on the code parameters ρ, γ, the code minimum distance $d_{min}$, and the Signal-To-Noise Ratio.

If decoding fails for a given value of δ, then the value of δ can be reduced to allow further decoding iterations. For error patterns with a number of errors less than or equal to the error correcting capability of the code, the decoding will be completed in one or a few iterations. Otherwise, more decoding iterations are needed. Therefore, the number of decoding iterations is a random variable and is a function of the channel Signal-To-Noise Ratio. A limit may be set on the number of iterations. When this limit is reached, the decoding process is terminated to avoid excessive computations. Due to the nature of binary Low Density Parity Check codes, the above decoding algorithm corrects many error patterns with a number of errors exceeding the error-correcting capability of the code.

A very simple implementation of the BF decoding algorithm is given below:

Step 1: Compute the parity check sums (syndrome bits). If all the parity check equations are satisfied (i.e., all the syndrome bits are zero), stop the decoding.

Step 2: Find the number of unsatisfied parity check equations for each code bit position, denoted $f_i$, i=0, 1, ..., n-1.

Step 3: Identify the set of bits for which $f_i$ is the largest.

Step 4: Flip the bits in this set.

Step 5: Repeat steps 1 to 4 until all the parity check equations are satisfied (for this case, we stop the iteration in step 1) or when a predefined maximum number of iterations is reached.

BF decoding requires only logical operations. The number of logical operations $N_{BF}$ performed for each decoding iteration is linearly proportional to Jρ (or nγ), say $N_{BF}=K_{BF}J\rho$, where the constant $K_{BF}$ depends on the implementation of the BF decoding algorithm. Typically, the value of $K_{BF}$ is less than 3. The simple BF decoding algorithm can be improved by using adaptive thresholds δ's. Of course, this improvement is achieved at the expense of more computations. Binary Quasi-Cyclic Low Density Parity Check codes perform well with BF decoding because a large number of check sums orthogonal on each code bit can be formed when the code blocklength n is large.

Weighted One-Step Majority-Logic and Weighted Bit Flipping Decoding

The simple hard-decision One-Step Majority-Logic (OSML) and Bit Flipping (BF) decoding methods can be improved to achieve better error performance by including some reliability information (or measure) of the received symbols in the decoding decisions. Of course, additional decoding complexity is required to achieve such performance improvements. Consider the soft-decision received sequence $y=(y_0, y_1, \ldots, y_{n-1})$. For the Additive White Gaussian Noise channel, a simple measure of the reliability of a received symbol $y_l$ is its magnitude, $|y_l|$ the larger the magnitude $|y_l|$, the higher the reliability of the hard-decision digit $z_l$. Many reliability-based algorithms based on this reliability measure have been devised for decoding linear block codes. In the following, this reliability measure is used to modify both the OSML and the BF decoding methods.

Again, consider a Low Density Parity Check code specified by a parity check matrix H with J rows, given by $\{h_1, h_2, \ldots h_J\}$. For $0 \leq l \leq n-1$ and $1 \leq j \leq J$, define:

$$|y_j|_{min}^{(l)} = \min\{|y_i| : 0 \leq i \leq n-1, h_{j,i}^{(l)} = 1\} \quad (40)$$

and $$E_l = \sum_{s_j^{(l)} \in S_l} (2s_j^{(l)} - 1) \cdot |y_j|_{min}^{(l)} \quad (41)$$

where $S_l$ is the set of check sums $s_j^{(l)}$ orthogonal on bit-position l. The value $E_l$ is a weighted check sum that is orthogonal on the code bit position l. Let $e=(e_0, e_1, \ldots, e_{n-1})$ be the error pattern to be decoded. Then the OSML decoding algorithm can be modified based on the weighted check sum $E_l$ as follows:

$$e_l = \begin{cases} 1, & \text{for } E_l > 0, \\ 0, & \text{for } E_l \leq 0, \end{cases} \quad (42)$$

for $0 \leq l \leq n-1$. This modified OSML algorithm is called weighted One-Step Majority Logic (OSML) decoding.

The decision rule given by equation (42) can also be used in BF decoding. In this case, the decoding is carried out as follows:

Step 1 Compute the check sums. If all the parity check equations are satisfied, stop the decoding.
Step 2 Compute $E_l$ based on (41), for $0 \leq l \leq n-1$.
Step 3 Find the bit position l for which $E_l$ is the largest.
Step 4 Flip the bit $z_l$.
Step 5 Repeat Steps 1 to 4. This process of bit flipping continues until all the parity check equations are satisfied or a preset maximum number of iterations is reached.

This modified BF algorithm is called weighted Bit Flipping (BF) decoding.

The above weighted OSML and weighted BF decoding algorithms require soft-decision channel outputs and also require real addition operations to compute the weighted check sums, $E_l$'s to make decisions. The resulting computational complexities of both weighted OSML and weighted BF decoding methods are dominated by the total number of real additions needed to decode a received sequence. From equation (41), we can readily see that for weighted OSML decoding, the number of real additions required for decoding a received sequence is equal to $K_{OSML}(J\rho+n\gamma)$, where $K_{OSML}$ is a constant. However, for weighted BF decoding, the number of real additions needed for each decoding iteration is equal to $K_{OSML}(J\rho+n\gamma)$. Since $J\rho$ (or $n\gamma$) is the total number of "1" entries in the parity check matrix H of the code, the computational complexities of both weighted OSML and BF decoding methods are linearly proportional to the total number of "1" entries in H.

Sum-Product Algorithm Decoding

The Sum-Product Algorithm is an iterative decoding algorithm based on belief propagation, which is extremely efficient for decoding Low Density Parity Check codes. Like the MAP (maximum a posteriori probability) decoding algorithm, it is a symbol-by-symbol Soft-Input Soft-Output (SISO) iterative decoding algorithm. It processes the received symbols iteratively to improve the reliability of each decoded code symbol based on the parity check sums computed from the hard-decisions of the received symbols and the parity check matrix H of the code. The reliability of a decoded symbol can be measured by its marginal posteriori probability, its Log-Likelihood Ratio, or the value of its corresponding received symbol. The computed reliability measures of code symbols at the end of each decoding iteration are used as inputs for the next iteration. The decoding iteration process continues until a certain stopping condition is satisfied. Then, based on the computed reliability measures of code symbols, hard decisions are made.

Again, we consider a binary $(\gamma, \rho)$-regular Low Density Parity Check code C of blocklength n specified by a parity check matrix H with J rows, given by $\{h_1, h_2, \ldots h_J\}$. For $1 \leq j \leq J$, define the following index set for $h_j$:

$$B(h_j) = \{l : h_{j,l} = 1, 0 \leq l \leq n-1\}, \quad (43)$$

which is called the support of $h^j$. The implementation of Sum-Product Algorithm decoding is based on the computation of the marginal a posteriori probabilities, $P(v_l|y)$'s, for $0 \leq l \leq n-1$. Then the Log-Likelihood Ratio for each code bit is given by:

$$L(v_l) = \log \frac{P(v_l = 1|y)}{P(v_l = 0|y)}. \quad (44)$$

Let $p_l^0 = P(v_l=0)$ and $p_l^1 = P(v_l=1)$ be the prior probabilities of $v_l=0$ and $v_l=1$, respectively. For $0 \leq l \leq n-1$, $1 \leq j \leq J$, and each $h_j \in A_l$, where $A_l$ is the set of rows of H that are orthogonal to the l-th code bit, let $q_{j,l}^{x,(i)}$ be the conditional probability that the transmitted code bit $v_l$ has value x (0 or 1), given the check-sums computed based on the check vectors in $A_l \backslash h_j$ at the i-th decoding iteration. For $0 \leq l \leq n-1$, $1 \leq j \leq J$, and $h_j \in A_l$, let $\sigma_{j,l}^{x,(i)}$ be the conditional probability that the check-sum $s_j$ is satisfied (i.e. $s_j = 0$), given $v_l = x$ (0 or 1) and the other code bits in $B(h_j)$ have a separable distribution $\{q_{j,l}^{v_l,(i)} : t \in B(h_j) \backslash l\}$, i.e.:

$$\sigma_{j,l}^{x,(i)} = \sum_{\{v_t : t \in B(h_j) \backslash l\}} P(s_j = 0 | v_l = x, \{v_t : t \in B(h_j) \backslash l\}) \cdot \prod_{t \in B(h_j) \backslash l} q_{j,t}^{v_t,(i)}. \quad (45)$$

The computed values of $\sigma_{j,l}^{x,(i)}$ are then used to update the values of $q_{j,l}^{x,(i+1)}$ as follows:

$$q_{j,l}^{x,(i+1)} = \alpha_{j,l}^{(i+1)} p_l^x \prod_{h_t \in A_l \backslash h_j} \sigma_{j,l}^{x,(i)} \quad (46)$$

where $\alpha_{j,l}^{(i+1)}$ is chosen such that $q_{j,l}^{0,(i+1)} + q_{j,l}^{1,(i+1)} = 1$. The computed values of $q_{j,l}^{x,(i+1)}$ are then used to update the values of $\sigma_{j,l}^{x,(i+1)}$ using equation (45). The updating between $q_{j,l}^{x,(i+1)}$ and $\sigma_{j,l}^{x,(i)}$ is carried out iteratively during the decoding process.

At the i-th iteration step, the pseudo-posterior probabilities are given by:

$$P^{(i)} = (v_l = x | y) = \alpha_l^{(i)} p_l^x \prod_{h_j \in A_l} \sigma_{j,l}^{x,(i-1)}, \quad (47)$$

where $\alpha_l^i$ is chosen such that $P^{(i)}(v_l=0|y) + P^{(i)}(v_l=1|y) = 1$. Based on these probabilities, we can form the vector $z^{(i)} = (z_0^{(i)}, z_1^{(i)}, \ldots z_{n-1}^{(i)})$ as the candidate decoded codeword with:

$$z_l^{(i)} = \begin{cases} 1, & \text{for } P^{(i)}(v_l = 1|y) > 0.5 \\ 0, & \text{otherwise} \end{cases} \qquad (48)$$

Then re-compute $z^{(i)} \cdot H^T$. If $z^{(i)} \cdot H^T = 0$, stop the decoding iteration process, and output $z^{(i)}$ as the decoded codeword.

The Sum-Product Algorithm decoding method then consists of the following steps:

Initialization: Set i=0 and set the maximum number of iterations to $I_{max}$. For every pair (j, l) such that $h_{j,l}=1$ with $1 \leq j \leq J$ and $0 \leq l \leq n-1$, set $q_{j,l}^{0,(0)} = p_l^0$ and $q_{j,l}^{1,(0)} = p_l^1$.

Step 1: For $0 \leq l \leq n-1$, $1 \leq j \leq J$, and each $h_l \in A_l$, compute the probabilities $\sigma_{j,l}^{0,(i)}$ and $\sigma_{j,l}^{1,(i)}$. Go to Step 2.

Step 2: For $0 \leq l \leq n-1$, $1 \leq j \leq J$, and each $h_l \in A_l$, compute the values of $q_{j,l}^{0,(i+1)}$ and $q_{j,l}^{1,(i+1)}$ and the values of $P^{(i+1)}(v_l=0|y)$ and $P^{(i+1)}(v_l=1|y)$. Form $z^{(i+1)}$ and test $z^{(i+1)} \cdot H^T$. If $z^{(i+1) \cdot HT} = 0$ or the maximum iteration number $I_{max}$ is reached, go to Step 3. Otherwise, set i:=i+1 and go to Step 1.

Step 3: Output $z^{(i+1)}$ as the decoded codeword and stop the decoding process.

In order to implement the Sum-Product Algorithm decoding algorithm, real number additions, subtractions, multiplications, divisions, as well as evaluations of exponential and logarithm functions are needed. The last four types of operations are more complex than addition and subtraction. For this reason, we simply ignore the number of additions and subtractions in analyzing the computational complexity of this algorithm. From equations (45) to (47), we find that the number of multiplications and divisions needed in each iteration of the Sum-Product Algorithm decoding algorithm is of the order $O(2J\rho + 4n\gamma)$, and the number of exponential and logarithm function evaluations needed for each iteration of decoding is of the order $O(n)$. We see that the resulting complexity can be prohibitively high in particular for high-speed applications. Therefore, full Sum-Product Algorithm decoding may not be practical for these types of applications.

Two-Stage Hybrid Decoding

The Sum-Product Algorithm decoding method is computationally intensive, as each decoding iteration requires many real number computations. A large number of iterations may be needed to achieve desired error performance objectives, resulting in a large number of computations and a long decoding delay that is not desirable in high-speed applications. However, for binary Quasi-Cyclic Low Density Parity Check codes, this difficulty can be overcome by using a two-stage hybrid soft/hard decoding scheme. In the first stage, the binary Quasi-Cyclic Low Density Parity Check code is decoded using Sum-Product Algorithm decoding with a fixed number of iterations that is small, say, equal to I. At the completion of the I-th iteration, hard decisions of decoded symbols are made based on their Log-Likelihood Ratios. This results in a binary sequence z of estimated code bits. This sequence z is then decoded using simple OSML decoding. This two-stage hybrid decoding works well for binary $(\gamma, \rho)$-regular Quasi-Cyclic Low Density Parity Check codes with large $\gamma$ because they have large minimum distances, and Sum-Product Algorithm decoding of these codes converges very fast. Simulation results for many codes show that the performance gap between 5 iterations and 100 iterations is within 0.2 dB. Therefore, at the first stage, we may set the number of iterations for the Sum-Product Algorithm decoding to 5 or less (in many cases, 2 iterations are enough). The resulting estimated code sequence z may still contain a small number of errors. These errors will be corrected by the OSML decoding at the second stage due to the large majority-logic error correcting capability of binary $(\gamma, \rho)$-regular Quasi-Cyclic Low Density Parity Check codes. The two-stage hybrid soft/hard decoding scheme offers a good trade-off between error performance and decoding complexity. Furthermore, it reduces decoding delay.

New Double-Weighted Bit Flipping Decoding

Since BF decoding is a hard-decision decoding algorithm, it has a significant performance degradation compared to iterative soft-decision Sum-Product Algorithm decoding. Weighted BF decoding has the potential of closing this performance gap by using soft-decision reliability information in decoding. A modified weighted BF procedure, called LP-WBF decoding, can achieve a performance within 1 dB of the Sum-Product Algorithm decoding at a BER of $10^{-6}$. A further improvement is by weighting the check-sums. This method is called the Weighted-Sum Weighted Bit Flipping (WS-WBF) algorithm. The WS-WBF method needs to find a threshold T and a constant integer K in its implementation to achieve a better performance than the LP-WBF algorithm.

In this universal forward error-correction coding system, a new approach is developed to weigh the reliability of the check-sums. Instead of finding a good combination of T and K by computer search as is necessary for the WS-WBF approach, this new approach sets the reliability information embedded in the check-sums as a probability function of the received sequence. We call this new decoding algorithm Double-Weighted Bit Flipping (DWBF) decoding. Simulation results for the (1023, 781) FG-Low Density Parity Check code show that the performance of this code using DWBF decoding is superior to the best results achieved using WS-WBF decoding.

Suppose a binary $(\gamma, \rho)$-regular Low Density Parity Check code with J×n parity check matrix H with J rows, given by $\{h_1, h_2, \ldots h_J\}$ where $h_j = (h_{j,0}, h_{j,1}, \ldots, h_{j,n-1})$, for $1 \leq j \leq J$, is used for over an Additive White Gaussian Noise channel with zero mean and power spectral density $N_0/2$. We assume that coherent BPSK signaling with unit energy is used and let $y = (y_0, y_1, \ldots, y_{n-1})$ be the soft-decision received sequence at the output of the demodulator matched filter. The Double-Weighted Bit Flipping decoding algorithm consists of the following initialization and iteration steps.

Initialization Step:

Denote $z = (z_0, z_1, \ldots, z_{n-1})$ to be the hard decisions sequence obtained from y, where:

$$z_j = \begin{cases} 1, & \text{for } y_j > 0, \\ 0, & \text{for } y_j \leq 0, \end{cases}.$$

Next compute the syndrome $s = (s_0, s_1, \ldots, s_{n-1})$ for the sequence z given by $s = zH^T$. If all parity equations are satisfied, then stop the decoding. Otherwise, $s \neq 0$. Then weighted check sums that incorporate a reliability measure for the hard-decision sequence z must be computed next to decide which bit to flip for the next iteration step. Define $r = (r_0, r_1, \ldots, r_{n-1})$, where $r_j = |y_j|$. The standard weighted BF decoding algorithm described above used r as the reliability measure or metric for the hard-decision sequence z to arrive at the weighted check sums given by equation (41). We shall use a different weighting in the DWBF algorithm to compute these weighted check sums. For each check-sum $s_j$, we first need to record the largest and the smallest values among the received soft-decision sequence y that is related to check-sum $s_j$, where $1 \leq j \leq J$. For $1 \leq j \leq J$ denote $K(j)=\{0 \leq i \leq n-1: h_{j,i}=1\}$ and let $U_j=\max\{|y_i|:i \in K(j)\}$ and $L_j=\min\{|y_i|:i \in K(j)\}$ be the largest and the smallest soft-decision samples respectively corresponding to the check-sum $s_j$.

Iteration Step:

To choose which bit to flip, we need to calculate a weighted check sum $T_l$ for every bit position l, $0 \leq l \leq n-1$. The LP-WBF decoding algorithm uses the following weighted check sum:

$$T_l = \sum_{j \in M(l)} T_{j,l} \quad (49)$$

where $M(l)=\{1 \leq j \leq J: h_{j,l}=1\}$ and where:

$$T_{j,l} = \begin{cases} |y_l| - \frac{L_j}{2}, & \text{if } s_j = 0 \\ |y_l| - \left(U_j + \frac{L_j}{2}\right), & \text{if } s_j = 1. \end{cases} \quad (50)$$

The disadvantage of the LP-WBF decoding algorithm is that it only considers the reliability of bit j while ignoring the reliability of all the other bits in the check-sum $s_j$. To overcome this deficiency, the DWBF decoding algorithm takes into account the reliability of all the other bits in the check-sum $s_j$ explicitly by using the following weighted check sum:

$$T_l = \sum_{j \in M(l)} T_{j,l} R_{j,l} \quad (51)$$

where $$R_{j,l} = \left(1 + \exp\left(\frac{-4 \min_{i \in N(j) \setminus l} |y_i|}{N_0}\right)\right)^{-1} \quad (52)$$

and where $N(j)=\{i: h_{j,i}=1\}$.

Then we flip the bit $z_j$ in z with the smallest $T_j$ value. Recompute the syndrome $s=zH^T$ for this bit-flipped sequence z. If $s=0$, stop the decoding. Otherwise, repeat this iteration step if the number of iterations is less than the preset maximum allowable number of iterations. The decoding is terminated when it reaches its preset maximum allowable number of iterations.

Universal Decoder for Families of Structurally Compatible Binary Quasi-Cyclic Low Density Parity Check Codes Consider a structurally compatible family of binary Quasi-Cyclic Low Density Parity Check codes obtained using a base code $C(c,t)$ that is the null space of a parity check matrix $H_{qc}(c, t)$, which is a $c \times t$ array of $b \times b$ circulants as described above. Suppose $(c_i, t_i)$, with $1 \leq i \leq m$, are distinct pairs of positive integers such that $1 \leq c_1 \leq c_2 \leq \ldots \leq c_m \leq c$, and $1 \leq t_1 \leq t_2 \leq \ldots \leq t_m \leq t$. Let $H_{qc}(c_i, t_i)$ be the $c_i \times t_i$ subarray of the base array $H_{qc}(c, t)$ of circulants obtained by deleting the last $t-t_i$ columns and the last $c-c_i$ rows of $b \times b$ circulant matrices, and let $C(c_i, t_i)$ be the binary Quasi-Cyclic Low Density Parity Check code given by the null space of $H_{qc}(c_i, t_i)$. So $C(c,t), C(c_1, t_1), C(c_2, t_2), \ldots, C(c_m, t_m)$ form the structurally compatible family of codes. A single universal decoder that can be used to decode all the codes in this family was devised in this universal forward error-correction coding system.

Consider the various decoding algorithms described above. The core of the OSML and weighted OSML decoding methods is check-sum computation, which is based on the parity-check matrix. Thus, the OSML and weighted OSML decoding of the family of structurally compatible binary Quasi-Cyclic Low Density Parity Check codes with parity-check matrices $H_{qc}(c_i, t_i)$ can be done using the decoder implementation based on the base code $H_{qc}(c, t)$ by disabling the entries corresponding to deleted rows and columns in $H_{qc}(c, t)$ to the check-sum. That is, the decoder for the base code serves as the universal decoder for all codes in the structurally compatible family when OSML and weighted OSML decoding is employed. Consider next the Sum-Product Algorithm, BF, weighted BF, and the new Double-Weighted Bit Flipping (DWBF) decoding algorithms. It is clear from our previous discussions that channel decoders for a binary Quasi-Cyclic Low Density Parity Check code based on any of these decoding algorithms can be viewed as respective decoding algorithms on the Tanner Graph corresponding to the parity-check matrix of that code.

In particular, let $V_i$ and $S_i$ denote the set of deleted columns and the set of deleted rows in obtaining the parity check matrix $H_{qc}(c_i, t_i)$ for the code $C(c_i, t_i)$ from the parity check matrix $H_{qc}(c, t)$ of the base code. Then the Tanner Graph $T_i$ of the code $C(c_i, t_i)$ is a subgraph of the Tanner Graph T of the base code $C(c,t)$, which is obtained by: (1) deleting the variable nodes corresponding to the deleted columns in $V_i$ and the edges incident on these deleted variable nodes; and (2) deleting the check-sum nodes corresponding to the deleted rows in $S_i$ and the edges incident on these deleted check-sum nodes. Let D be the decoder built for the base code $C(c,t)$ given by the null space of $H_{qc}(c, t)$. If we deactivate the (wire) connections in decoder D that correspond to the edges incident on the deleted variable nodes and deleted check-sum nodes, we obtain a subdecoder for decoding the code $C(c_i, t_i)$. Thus, the channel decoder for the base code serves as the universal decoder for all the codes in this structurally compatible family of Quasi-Cyclic Low Density Parity Check codes when the Sum-Product Algorithm, BF, weighted BF, or Double-Weighted Bit Flipping (DWBF) decoding methods are employed.

For an example, we consider again the codes given in Example 2 (where c=3, t=4 and $c_1=2$, $t_1=3$): the (12,5) base code $C(3,4)$ with parity-check matrix $H(3,4)$, and the subcode $C(2,3)$ with parity-check matrix $H(2,3)$ obtained by deleting the last row and last column of circulants in $H(3,4)$. These matrices are given below for reference:

$$H(3,4) = \begin{bmatrix} 0 & 0 & 1 & 0 & 0 & 0 & 1 & 0 & 0 & 0 & 1 & 0 \\ 1 & 0 & 0 & 0 & 0 & 0 & 0 & 1 & 0 & 0 & 0 & 1 \\ 0 & 1 & 0 & 0 & 0 & 0 & 0 & 0 & 1 & 1 & 0 & 0 \\ 0 & 1 & 0 & 1 & 0 & 0 & 0 & 0 & 0 & 0 & 0 & 1 \\ 0 & 0 & 1 & 0 & 1 & 0 & 0 & 0 & 0 & 1 & 0 & 0 \\ 1 & 0 & 0 & 0 & 0 & 1 & 0 & 0 & 0 & 0 & 1 & 0 \\ 1 & 0 & 0 & 0 & 1 & 0 & 0 & 0 & 1 & 0 & 0 & 0 \\ 0 & 1 & 0 & 0 & 0 & 1 & 1 & 0 & 0 & 0 & 0 & 0 \\ 0 & 0 & 1 & 1 & 0 & 0 & 0 & 1 & 0 & 0 & 0 & 0 \end{bmatrix},$$

-continued $$H(2,3) = \begin{bmatrix} 0 & 0 & 1 & & 0 & 0 & 0 & & 1 & 0 & 0 \\ 1 & 0 & 0 & & 0 & 0 & 0 & & 0 & 1 & 0 \\ 0 & 1 & 0 & & 0 & 0 & 0 & & 0 & 0 & 1 \\ & & & & & & & & & & \\ 0 & 1 & 0 & & 1 & 0 & 0 & & 0 & 0 & 0 \\ 0 & 0 & 1 & & 0 & 1 & 0 & & 0 & 0 & 0 \\ 1 & 0 & 0 & & 0 & 0 & 1 & & 0 & 0 & 0 \end{bmatrix}.$$

Figure 10:
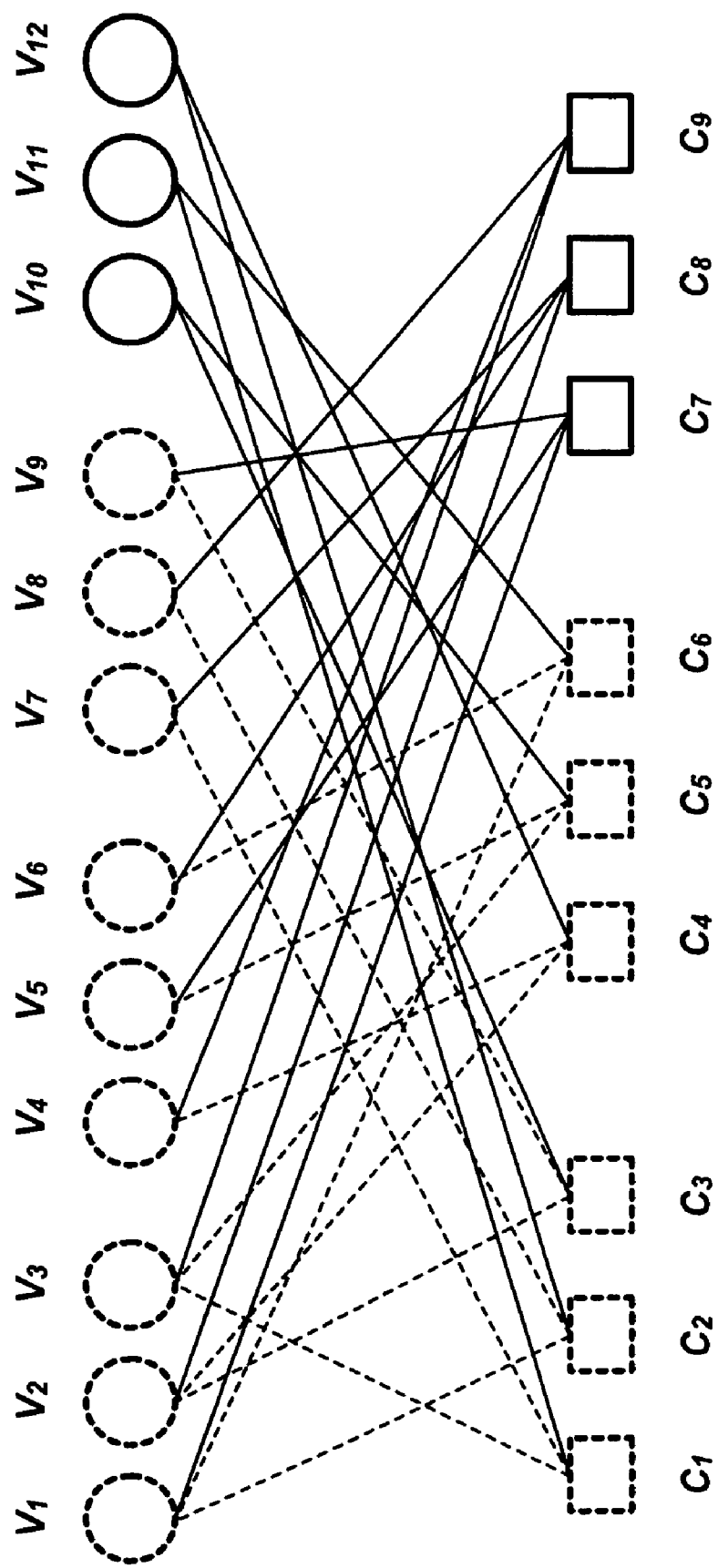
FIG. 10 illustrates Tanner Graphs for the binary Quasi-Cyclic Low Density Parity Check codes C(3,4) and C(2,3)

The Tanner Graph T for the code C(3,4) corresponding to the parity-check matrix H(3,4) is shown in FIG. 10. In this figure, the Tanner Graph $T_1$ for the code C(2,3) corresponding to the parity-check matrix H(2,3) is the sub-graph of T, shown by the dotted black variable nodes, dotted black check-sum nodes, and the dotted black edges. Implementation of iterative decoding, such as the Sum-Product Algorithm, DWBF, weighted BF, and BF decoding methods on the Tanner Graph T can be used to decode the base code C(3,4) corresponding to the parity-check matrix H(3,4). The Low Density Parity Check code C(2,3) corresponding to the parity-check matrix H(2,3) can be decoded by disabling the solid black variable nodes, solid black check-sum nodes, and solid black edges. This demonstrates that a single universal decoder implantation can be used to decode both codes. The same conclusion also applies to OSML and weighted OSML decoding.

General Finite Field Construction of Binary Quasi-Cyclic Low Density Parity Check Codes A systematic method is required for generating binary Quasi-Cyclic Low Density Parity Check codes of different code rates and different blocklengths that are capable of achieving given error performance requirements. This universal forward error-correction coding system has devised a general construction method for generating well-performing binary Quasi-Cyclic Low Density Parity Check codes with a wide range of blocklengths and wide choice of coding rates that are suitable to use in the universal coding scheme. The construction method is described in the following sections. The first construction method, including examples that yield good codes, is based on a Galois field GF(q) with q elements where q is the power of a prime number. The second construction method, including corresponding examples, is based on Galois fields GF(q) where q is a prime number. Both construction methods can be employed to construct a structurally compatible family of binary Quasi-Cyclic Low Density Parity Check codes of various lengths, rates, and error performances for various channel conditions and data rates. Codes in this family can be encoded using one universal encoder and decoded with one universal decoder.

Location Vector Representations of Finite Field Elements

Consider the Galois field GF(q) with q elements where q is a power of a prime number. Let $\alpha$ be a primitive element of GF(q). Then the following q powers of $\alpha$: $\alpha^{-\infty}=0$, $\alpha^0=1$, $\alpha$, $\alpha^2, \ldots, \alpha^{q-2}$, form all the elements of GF(q). The field GF(q) consists of two groups, the additive and multiplicative groups. All the q elements of GF(q) under the addition operation form the additive group of GF(q), and the q−1 non-zero elements of GF(q) under the multiplication operation form the multiplicative group of GF(q). For each non-zero element $\alpha^i$ with $0 \leq i \leq q-2$, form a (q−1)-tuple over GF(2):

$$z(\alpha^i) = (z_0, z_1, \ldots, z_{q-2}),$$

whose components correspond to the q−1 non-zero elements of GF(q), where the i-th component $z_i = 1$ and all the other q−2 components are equal to 0. This (q−1)-tuple is referred to as the location-vector of $\alpha^i$ with respect to the multiplicative group of GF(q). We call $z(\alpha^i)$ the M-location-vector of $\alpha^i$. The M-location vector z(0) of the zero element 0 of GF(q) is defined as the all-zero (q−1)-tuple, (0, 0, . . . , 0).

Let $\delta$ be a non-zero element of GF(q), the location vector $z(\alpha\delta)$ of $\alpha\delta$ is the cyclic-shift (one place to the right) of the location vector $z(\delta)$ of $\delta$. Form a (q−1)×(q−1) matrix A over GF(2) with the M-locations-vectors of $\delta, \alpha\delta, \alpha^2\delta, \ldots, \alpha^{q-2}\delta$ as rows. Then A is a (q−1)×(q−1) circulant permutation matrix.

Construction of Row-Column Constrained Arrays of Circulant Permutation Matrices

Consider the Galois field GF(q) where q is a power of a prime number. Let $\alpha$ be a primitive element of GF(q). Then the powers of $\alpha$: $\alpha^{-\infty}=0$, $a^0=1$, $\alpha, \alpha^2, \ldots, \alpha^{q-2}$, give all the elements of GF(q) and $\alpha^{q-1}=1$. Let X be any non-zero element of GF(q). For any $i \in \{-\infty, 0, 1, \ldots, q-2\}$, it is clear that $\alpha^i X+0$, $\alpha^i X+1$, $\alpha^i X+\alpha, \ldots, \alpha^i X+\alpha^{q-2}$ are all different and form all the q elements of GF(q). Form the following q×q matrix over GF(q):

$$G = \begin{bmatrix} g_{-\infty} \\ g_0 \\ g_1 \\ \vdots \\ g_{q-2} \end{bmatrix} \quad (53)$$

$$= \begin{bmatrix} 0X+0 & 0X+1 & 0X+\alpha & \cdots & 0X+\alpha^{q-2} \\ X+0 & X+1 & X+\alpha & \cdots & X+\alpha^{q-2} \\ \alpha X+0 & \alpha X+1 & \alpha X+\alpha & \cdots & \alpha X+\alpha^{q-2} \\ \vdots & \vdots & \vdots & \ddots & \vdots \\ \alpha^{q-2}X+0 & \alpha^{q-2}X+1 & \alpha^{q-2}X+\alpha & \cdots & \alpha^{q-2}X+\alpha^{q-2} \end{bmatrix}$$

We label the q rows and the q columns of G with the following indices $-\infty, 0, 1, \ldots, q-2$. The matrix G has the following structural properties: (1) the q components of each row are all different and they form all the q elements of GF(q); (2) the q components of each column are all different and they form all the q elements of GF(q); (3) any two rows differ in all positions; (4) any two columns differ in all positions; and (5) each row (or each column) contains one and only one zero element. No matter what choice of X, a zero always appears at the intersection of the $-\infty$-th row and $-\infty$-th column. Let G* be the submatrix obtained by removing the $-\infty$-th row and $-\infty$-th column of G. For X=−1, the zero elements of G* lie on the main diagonal of G*. In this case, the zero elements of G lie on the main diagonal of G.

Lemma 1: Let $g_i$ and $g_j$ be two different rows in G, i.e., $i \neq j$. For any two integers, k and l with $k \leq 0$, $1 \leq q-2$, the two q-tuples $\alpha^k g_i$ and $\alpha^l g_j$ can have at most one position where they have identical components, i.e., $\alpha^k g_i$ and $\alpha^l g_j$ differ in at least q−1 positions.

Proof: Suppose that $\alpha^k g_i$ and $\alpha^l g_j$ have identical components at the positions s and t. Then $\alpha^k(\alpha^i X - \alpha^s) = \alpha^l(\alpha^j X - a^s)$ and $\alpha^k(\alpha^i X - a^t) = \alpha^l(\alpha^j X - \alpha^t)$. These two equalities imply that i=j and k=l, which contradicts the assumptions that $i \neq j$ and $k \neq l$. Hence, $\alpha^k g_i$ and $\alpha^l g_j$ cannot have more than one position where they have identical components.

For any $i \in \{-\infty, 0, 1, \ldots, q-2\}$, form the following (q−1)×q matrix $G_i$ over GF(q) with $g_i, \alpha g_i, \ldots, \alpha^{q-2} g_i$ as its rows:

$$G_i = \begin{bmatrix} g_i \\ \alpha g_i \\ \vdots \\ \alpha^{q-2} g_i \end{bmatrix} \quad (54)$$

$$= \begin{bmatrix} \alpha^i X & \alpha^i X + 1 & \alpha^i X + \alpha & \cdots & \alpha^i X + \alpha^{q-2} \\ \alpha^{i+1} X & \alpha(\alpha^i X + 1) & \alpha(\alpha^i X + \alpha) & \cdots & \alpha(\alpha^i X + \alpha^{q-2}) \\ \vdots & \vdots & \vdots & \ddots & \vdots \\ \alpha^{i+q-2} X & \alpha^{q-2}(\alpha^i X + 1) & \alpha^{q-2}(\alpha^i X + \alpha) & \cdots & \alpha^{q-2}(\alpha^i X + \alpha^{q-2}) \end{bmatrix}$$

$G_i$ has the following structural properties: (1) there is a zero-column with $q-1$ zero components; (2) except for the zero-column, all the $q-1$ components in each of the other $q-1$ columns are non-zero and they form the $q-1$ non-zero elements of GF(q); (3) any two rows differ in all $q-1$ positions; and (4) any two columns differ in all $q-1$ positions.

Replacing each entry of $G_i$ by its M-location-vector, we obtain a $(q-1) \times q(q-1)$ matrix over GF(2):

$$B_i = [A_{i,-\infty}, A_{i,0}, A_{i,1}, \ldots A_{i,q-2}], \quad (55)$$

which consists of $q(q-1) \times (q-1)$ submatrices $A_{i,j}$'s. Each submatrix $A_{i,j}$ is formed by the M-location vectors of the $q-1$ entries of j-th column of $G_i$ and is a circulant permutation matrix if the j-th column of $G_i$ is not the zero column of $G_i$. Otherwise, it is a $(q-1) \times (q-1)$ zero matrix. Therefore, $B_i$ consists of $q-1$ $(q-1) \times (q-1)$ circulant permutation matrices and a single $(q-1) \times (q-1)$ zero matrix, which is a trivial circulant matrix. Form the following $q \times q$ array of $(q-1) \times (q-1)$ circulant permutation and zero matrices:

$$H_{qc,1} = \begin{bmatrix} B_{-\infty} \\ B_0 \\ B_1 \\ \vdots \\ B_{q-2} \end{bmatrix} \quad (56)$$

$$= \begin{bmatrix} A_{-\infty,-\infty} & A_{-\infty,0} & A_{-\infty,1} & \cdots & A_{-\infty,q-2} \\ A_{0,-\infty} & A_{0,0} & A_{0,1} & \cdots & A_{0,q-2} \\ A_{1,-\infty} & A_{1,0} & A_{1,1} & \cdots & A_{1,q-2} \\ \vdots & \vdots & \vdots & \ddots & \vdots \\ A_{q-2,-\infty} & A_{q-2,0} & A_{q-2,1} & \cdots & A_{q-2,q-2} \end{bmatrix}$$

Each row (or each column) of the $q \times q$ array $H_{qc,1}$ contains one and only one $(q-1) \times (q-1)$ zero matrix. There are q zero matrices in the array $H_{qc,1}$ whose distribution depends on the choice of the non-zero element X. The distribution of the zero matrices in $H_{qc,1}$ is identical to the distribution of zeros in the matrix G given by equation (53). Therefore, $H_{qc,1}$ is a $q(q-1) \times q(q-1)$ matrix over GF(2) with both column and row weights equal to $q-1$. It follows from the Lemma 1 and the structural properties of matrices G and $G_i$ that $H_{qc,1}$ satisfies the Row-Column constraint. We illustrate the construction of such an array $H_{qc,1}$ of circulants in Example 4 below.

EXAMPLE 4

Consider the Galois field GF(q) where $q=2^2=4$. Let $\alpha$ be a primitive element of $GF(2^2)$. Then the elements of $GF(2^2)$ are $\alpha^{-\infty}=0$, $\alpha^0=1$, $\alpha$, $\alpha^2$ with $\alpha^2=1+\alpha$, $\alpha^3=1$, and $\alpha^i=-\alpha^i$. The construction technique described above then yields a $4 \times 4$ array $H_{qc,1}$ of $3 \times 3$ circulant permutation and zero matrices. Choose X=1. Then the $4 \times 4$ matrix G given by equation (53) becomes:

$$G = \begin{bmatrix} g_{-\infty} \\ g_0 \\ g_1 \\ g_2 \end{bmatrix} = \begin{bmatrix} 0 & \alpha^0 & \alpha^1 & \alpha^2 \\ \alpha^0 & 0 & \alpha^2 & \alpha^1 \\ \alpha^1 & \alpha^2 & 0 & \alpha^0 \\ \alpha^2 & \alpha^1 & \alpha^0 & 0 \end{bmatrix}.$$

Then for $i \in \{-\infty, 0, 1, 2\}$, the $3 \times 4$ matrix $G_i$ given by equation (54) (with $g_i$, $\alpha g_i$ and $\alpha^2 g_i$ as its rows) becomes:

$$G_i = \begin{bmatrix} g_i \\ \alpha g_i \\ \alpha^2 g_i \end{bmatrix}$$

$$= \begin{bmatrix} \alpha^i & \alpha^i + 1 & \alpha^i + \alpha & \alpha^i + \alpha^2 \\ \alpha^{i+1} & \alpha(\alpha^i + 1) & \alpha(\alpha^i + \alpha) & \alpha(\alpha^i + \alpha^2) \\ \alpha^{i+2} & \alpha^2(\alpha^i + 1) & \alpha^2(\alpha^i + \alpha) & \alpha^2(\alpha^i + \alpha^2) \end{bmatrix}.$$

So we have:

$$G_{-\infty} = \begin{bmatrix} g_{-\infty} \\ \alpha g_{-\infty} \\ \alpha^2 g_{-\infty} \end{bmatrix} = \begin{bmatrix} 0 & \alpha^0 & \alpha^1 & \alpha^2 \\ 0 & \alpha^1 & \alpha^2 & \alpha^0 \\ 0 & \alpha^2 & \alpha^0 & \alpha^1 \end{bmatrix},$$

$$G_0 = \begin{bmatrix} g_0 \\ \alpha g_0 \\ \alpha^2 g_0 \end{bmatrix} = \begin{bmatrix} \alpha^0 & 0 & \alpha^2 & \alpha^1 \\ \alpha^1 & 0 & \alpha^0 & \alpha^2 \\ \alpha^2 & 0 & \alpha^1 & \alpha^0 \end{bmatrix}.$$

$$G_1 = \begin{bmatrix} g_1 \\ \alpha g_1 \\ \alpha^2 g_1 \end{bmatrix} = \begin{bmatrix} \alpha^1 & \alpha^2 & 0 & \alpha^0 \\ \alpha^2 & \alpha^0 & 0 & \alpha^1 \\ \alpha^0 & \alpha^1 & 0 & \alpha^2 \end{bmatrix},$$

and $$G_2 = \begin{bmatrix} g_2 \\ \alpha g_2 \\ \alpha^2 g_2 \end{bmatrix} = \begin{bmatrix} \alpha^2 & \alpha^1 & \alpha^0 & 0 \\ \alpha^0 & \alpha^2 & \alpha^1 & 0 \\ \alpha^1 & \alpha^0 & \alpha^2 & 0 \end{bmatrix}.$$

Replacing each $G_i$ with its M-location vector, we obtain a $1 \times 4$ array $B_i$ of $3 \times 3$ circulant permutation and zero matrices over $GF(2^2)$. It then follows from using equation (56) that the $4 \times 4$ array $H_{qc,1}$ of $3 \times 3$ circulant permutation and zero matrices is given by:

$$H_{qc,1} = \begin{bmatrix} B_{-\infty} \\ B_0 \\ B_1 \\ B_2 \end{bmatrix} \quad (57)$$

-continued $$= \begin{bmatrix}
0 & 0 & 0 & 1 & 0 & 0 & 0 & 1 & 0 & 0 & 0 & 1 \\
0 & 0 & 0 & 0 & 1 & 0 & 0 & 0 & 1 & 1 & 0 & 0 \\
0 & 0 & 0 & 0 & 0 & 1 & 1 & 0 & 0 & 0 & 1 & 0 \\
1 & 0 & 0 & 0 & 0 & 0 & 0 & 0 & 1 & 0 & 1 & 0 \\
0 & 1 & 0 & 0 & 0 & 0 & 1 & 0 & 0 & 0 & 0 & 1 \\
0 & 0 & 1 & 0 & 0 & 0 & 0 & 1 & 0 & 1 & 0 & 0 \\
0 & 1 & 0 & 0 & 0 & 1 & 0 & 0 & 0 & 1 & 0 & 0 \\
0 & 0 & 1 & 1 & 0 & 0 & 0 & 0 & 0 & 0 & 1 & 0 \\
1 & 0 & 0 & 0 & 1 & 0 & 0 & 0 & 0 & 0 & 0 & 1 \\
0 & 0 & 1 & 0 & 1 & 0 & 1 & 0 & 0 & 0 & 0 & 0 \\
1 & 0 & 0 & 0 & 0 & 1 & 0 & 1 & 0 & 0 & 0 & 0 \\
0 & 1 & 0 & 1 & 0 & 0 & 0 & 0 & 1 & 0 & 0 & 0
\end{bmatrix}$$

A Class of High Coding Gain Efficiently Implementable Binary Quasi-Cyclic Low Density Parity Check Codes In this section, we show how well-performing binary Quasi-Cyclic Low Density Parity Check codes can be constructed using the base matrices $H_{qc,1}$ given by equation (56) to obtain parity check matrices that specify these codes. These codes can be efficiently encoded using any of the techniques described above. They also have segmented structures that allow efficient decoder implementations using any of the decoding methods described above.

For any pair $(\gamma,\rho)$ of positive integers with $1 \leq \gamma, \rho \leq q$, let $H_{qc,1}(\gamma, \rho)$ be a $\gamma \times \rho$ subarray of the q×q array $H_{qc,1}$ of (q−1)× (q−1) circulant permutation and zero matrices. Then $H_{qc,1}(\gamma, \rho)$ is a $\gamma(q-1) \times \rho(q-1)$ matrix over GF(2). If $H_{qc,1}(\gamma, \rho)$ does not contain zero submatrices in $H_{qc,1}$, it has column and row weights $\gamma$ and $\rho$, respectively. The null space of $H_{qc,1}(\gamma, \rho)$ gives a regular Quasi-Cyclic Low Density Parity Check code $C_{qc,1}$ of length $\rho(q-1)$, with code rate at least $(\rho-\gamma)/\rho$, and minimum distance at least $\gamma+2$ for even $\gamma$ and $\gamma+1$ for odd $\gamma$. The Tanner Graph of the code has a girth of at least 6 and the size of a minimal stopping set is at least $\gamma+1$ for even $\gamma$ and $\gamma$ for odd $\gamma$. If $H_{qc,1}(\gamma, \rho)$ contains some zero submatrices of $H_{qc,1}$, then $H_{qc,1}(\gamma, \rho)$ has two column weights $\gamma-1$ and $\gamma$ and possibly two row weights $\rho-1$ and $\rho$. In this case, the null space of $H_{qc,1}(\gamma, \rho)$ gives a binary near-regular Quasi-Cyclic Low Density Parity Check code with minimum distance at least $\gamma$ for even $\gamma$ and $\gamma+1$ for odd $\gamma$. The following example illustrates this construction method starting with the 4×4 array $H_{qc,1}$ of 3×3 circulant permutation and zero matrices as defined by the array given by equation (57):

EXAMPLE 5

Let $H_{qc,1}^*$ be the new array obtained by permuting the last column of 3×3 circulants in the array given by equation (57) to be the first column of circulants in $H_{qc,1}^*$. The objective of these pre-permutations is to avoid permutations in the encoding implementations discussed previously. Such column permutations do not change the resulting code performance. Therefore, $H_{qc,1}^*$ becomes:

$$H_{qc,1}^* = \begin{bmatrix}
0 & 0 & 1 & 0 & 0 & 0 & 1 & 0 & 0 & 0 & 1 & 0 \\
1 & 0 & 0 & 0 & 0 & 0 & 0 & 1 & 0 & 0 & 0 & 1 \\
0 & 1 & 0 & 0 & 0 & 0 & 0 & 0 & 1 & 1 & 0 & 0 \\
0 & 1 & 0 & 1 & 0 & 0 & 0 & 0 & 0 & 0 & 0 & 1 \\
0 & 0 & 1 & 0 & 1 & 0 & 0 & 0 & 0 & 1 & 0 & 0 \\
1 & 0 & 0 & 0 & 0 & 1 & 0 & 0 & 0 & 0 & 1 & 0 \\
1 & 0 & 0 & 0 & 1 & 0 & 0 & 0 & 1 & 0 & 0 & 0 \\
0 & 1 & 0 & 0 & 0 & 1 & 1 & 0 & 0 & 0 & 0 & 0 \\
0 & 0 & 1 & 1 & 0 & 0 & 0 & 1 & 0 & 0 & 0 & 0 \\
0 & 0 & 0 & 0 & 0 & 1 & 0 & 1 & 0 & 1 & 0 & 0 \\
0 & 0 & 0 & 1 & 0 & 0 & 0 & 0 & 1 & 0 & 1 & 0 \\
0 & 0 & 0 & 0 & 1 & 0 & 1 & 0 & 0 & 0 & 0 & 1
\end{bmatrix}$$

Choose $\gamma=3$ and $\rho=4$. Finally, by choosing a 3×4 subarray from the left upper corner in $H_{cq,1}^*$, we obtain the following parity check matrix considered previously in Example 2:

$$H(3,4) = \begin{bmatrix}
0 & 0 & 1 & 0 & 0 & 0 & 1 & 0 & 0 & 0 & 1 & 0 \\
1 & 0 & 0 & 0 & 0 & 0 & 0 & 1 & 0 & 0 & 0 & 1 \\
0 & 1 & 0 & 0 & 0 & 0 & 0 & 0 & 1 & 1 & 0 & 0 \\
0 & 1 & 0 & 1 & 0 & 0 & 0 & 0 & 0 & 0 & 0 & 1 \\
0 & 0 & 1 & 0 & 1 & 0 & 0 & 0 & 0 & 1 & 0 & 0 \\
1 & 0 & 0 & 0 & 0 & 1 & 0 & 0 & 0 & 0 & 1 & 0 \\
1 & 0 & 0 & 0 & 1 & 0 & 0 & 0 & 1 & 0 & 0 & 0 \\
0 & 1 & 0 & 0 & 0 & 1 & 1 & 0 & 0 & 0 & 0 & 0 \\
0 & 0 & 1 & 1 & 0 & 0 & 0 & 1 & 0 & 0 & 0 & 0
\end{bmatrix}$$

The above construction gives a class of binary Quasi-Cyclic Low Density Parity Check codes using the array $H_{qc,1}$ given by equation (56). Any code in this class can be encoded with simple shift-registers with complexity linearly proportional to the number of parity-check symbols of the code as shown previously. This simple encoding advantage is not shared by other types of Low Density Parity Check codes. This encoding advantage is essential in practical applications for digital communication and storage systems. Codes in this class also have advantage in IC decoder implementation due the circulant structure of their parity-check matrices that results in simple regular wiring and modular structure. Extensive experimental results show that the binary Quasi-Cyclic Low Density Parity Check codes in this class decoded with iterative decoding methods achieve large coding gains over uncoded systems, and they outperform other types of Low Density Parity Check codes in terms of bit-error probability, block-error probability, error-floor, and rate of decoding convergence. Low error-floor is particularly important in digital communication and storage systems where very low error rates are required. Fast rate of decoding convergence is important in high-speed communications. It reduces decoding delay and implementation power consumption. A family of structurally compatible binary Quasi-Cyclic Low Density Parity Check codes can be constructed using the above method to form a universal coding scheme. This is described below where it is shown that the structurally compatible family of codes can be implemented using a single universal encoder and a single universal decoder.

Examples of Binary Quasi-Cyclic Low Density Parity Check Code Constructions

We give several examples below which show that the code construction technique described above is capable of generating binary Quasi-Cyclic Low Density Parity Check codes with flexible choice of blocklengths and code rates as well as good performances.

EXAMPLE 6

Figure 11:
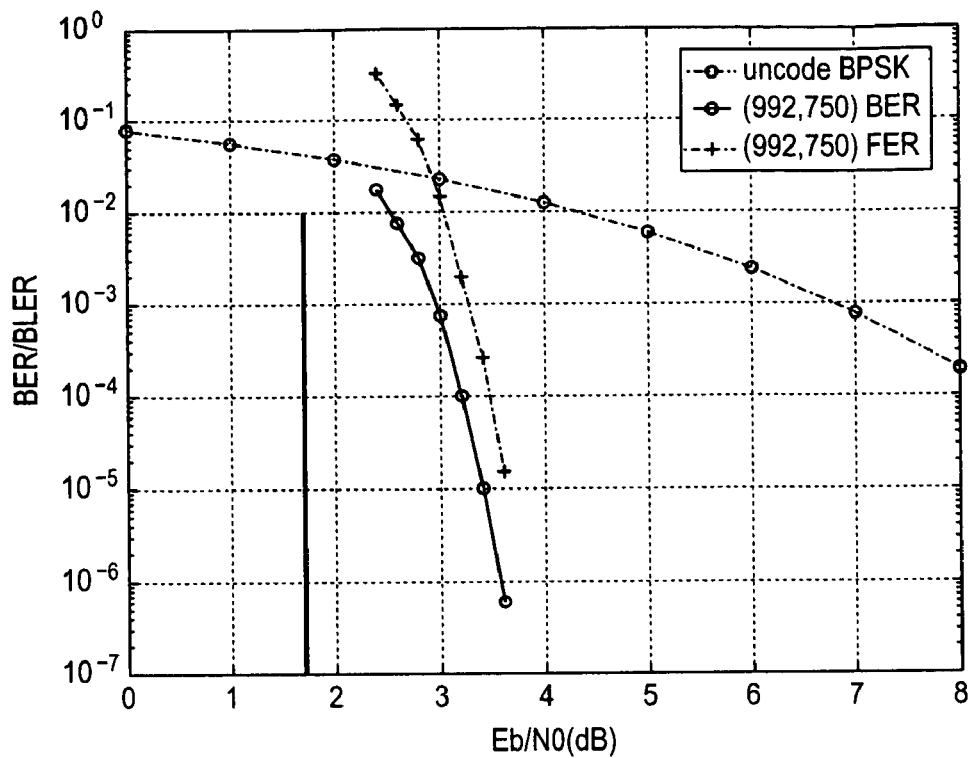
FIG. 11 illustrates the error performance of the (992, 750) binary Quasi-Cyclic Low Density Parity Check code over the Additive White Gaussian Noise channel with Binary Phase Shift Keying signaling.
Figure 12:
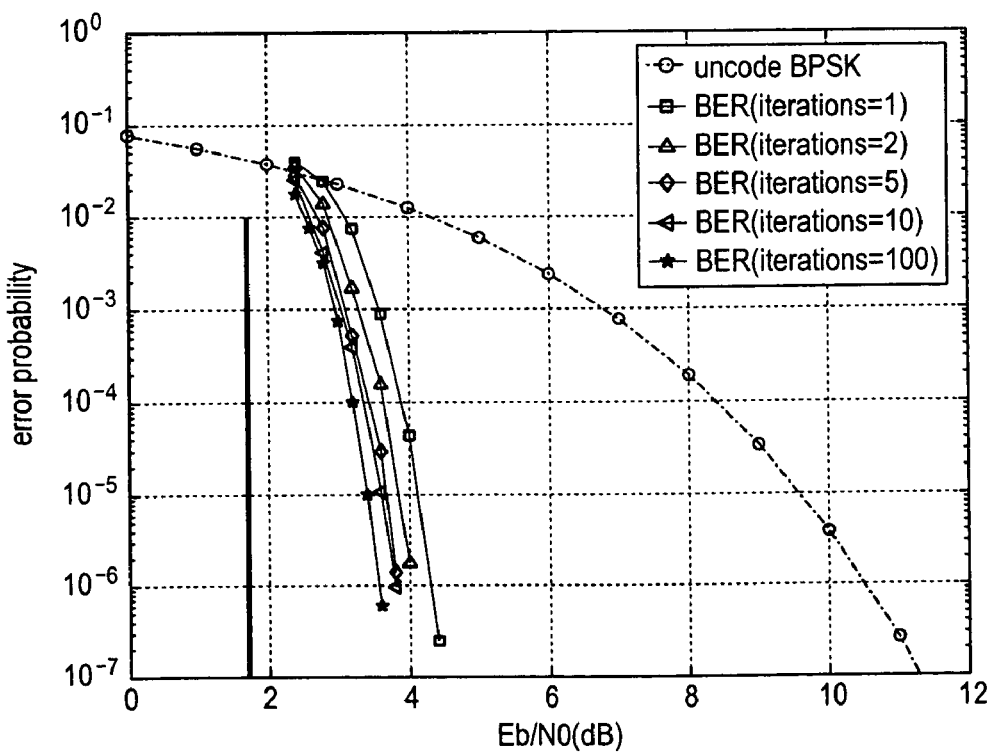
FIG. 12 illustrates the rate of decoding convergence of the (992, 750) binary Quasi-Cyclic Low Density Parity Check code over the Additive White Gaussian Noise channel with Binary Phase Shift Keying signaling.
Figure 13:
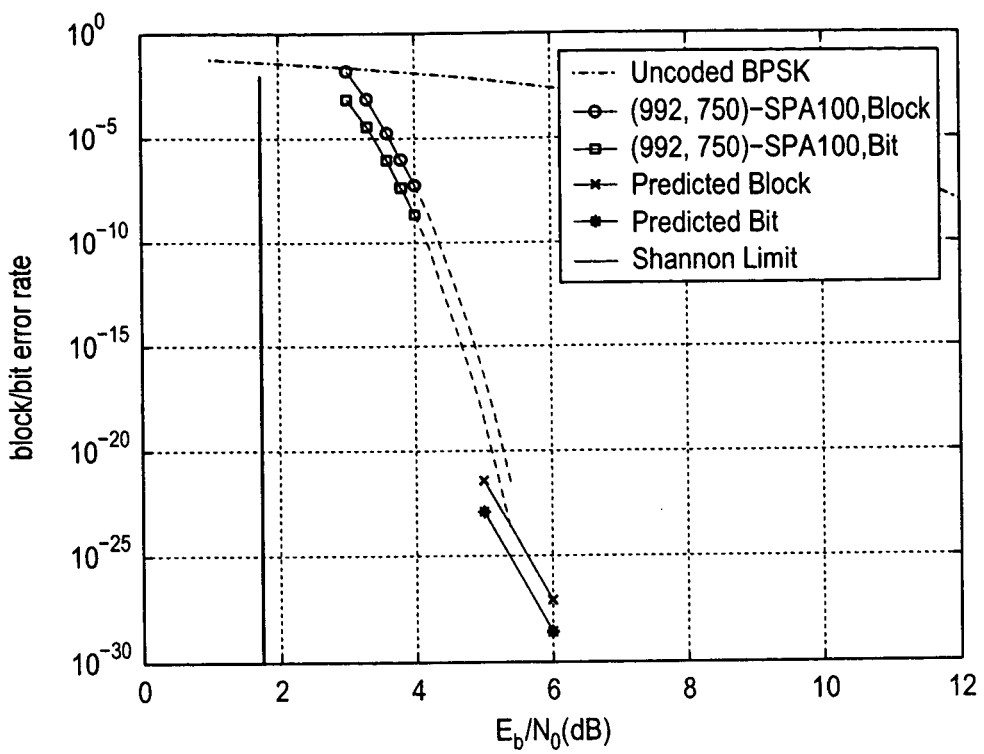
FIG. 13 illustrates the estimated error floor of the (992, 750) binary Quasi-Cyclic Low Density Parity Check code over the Additive White Gaussian Noise channel with Binary Phase Shift Keying signaling.

Let $GF(2^5)$ be the field for code construction. Choose $X=-1$. Based on this field, we construct a 32×32 array $H_{qc,1}$ of 31×31 circulant permutation and zero matrices. Suppose we set $\gamma=\rho=32$. Then the array $H_{qc,1}(32,32)$ is the entire array $H_{qc,1}$ that is a 992×992 matrix over GF(2) with both column and row weights 31. The null space of $H_{qc,1}(32,32)$ gives a (992,750) binary Quasi-Cyclic Low Density Parity Check code with a code rate of 0.756 and a minimum distance of at least 32. The Tanner Graph of this code has a girth of at least 6 and the size of a minimal stopping set is at least 32. The performance of this code over the Additive White Gaussian Noise channel with BPSK signaling is shown in FIGS. 11 to 13. From FIG. 11, we see that at the BER of $10^{-6}$, the code achieves 6.8 dB coding gain over the uncoded BPSK system and is 1.8 dB from the Shannon limit. From FIG. 12, we see that iterative decoding of this code converges very fast. The gap between 5 iterations and 100 iterations is only 0.2 dB. FIG. 13 shows that the estimated error-floor of this code with iterative decoding is below $10^{-25}$ for BER and below $10^{-23}$ for BLER.

EXAMPLE 7

Figure 14:
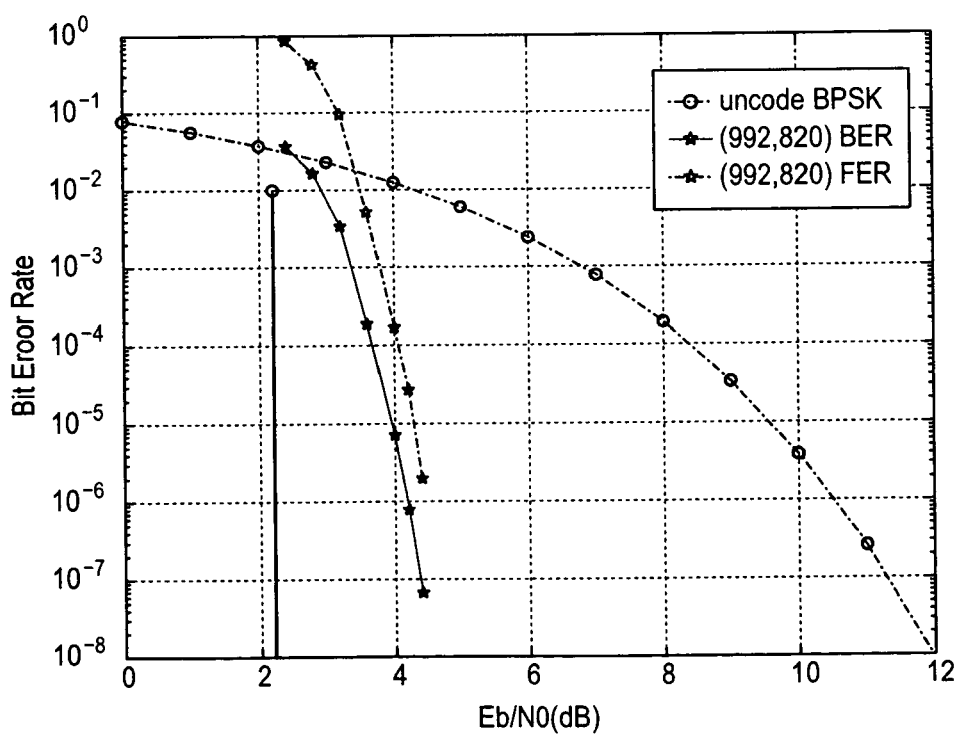
FIG. 14 illustrates the error performance of the (992, 802) binary Quasi-Cyclic Low Density Parity Check code over the Additive White Gaussian Noise channel with Binary Phase Shift Keying signaling.
Figure 15:
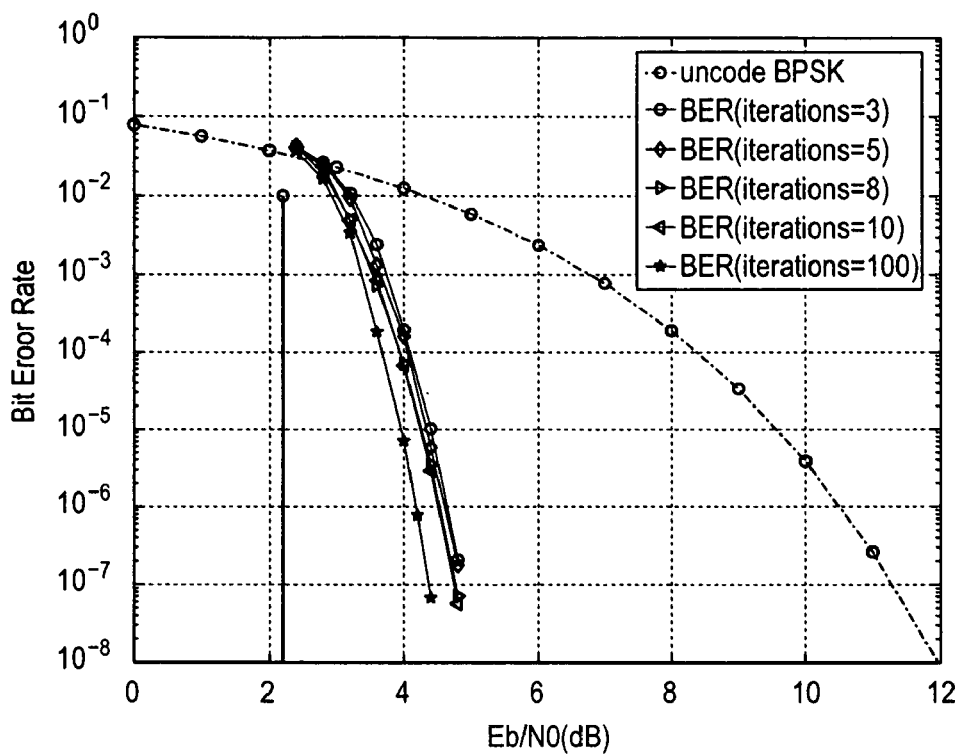
FIG. 15 illustrates the rate of decoding convergence of the (992, 802) binary Quasi-Cyclic Low Density Parity Check code over the Additive White Gaussian Noise channel with Binary Phase Shift Keying signaling.
Figure 16:
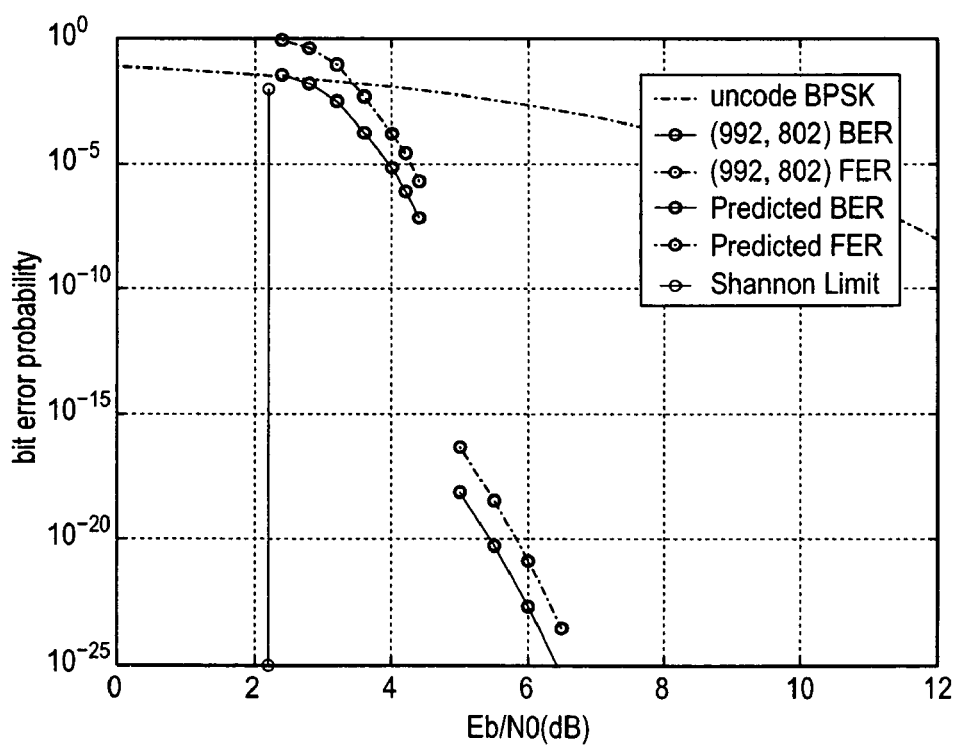
FIG. 16 illustrates the estimated error floor of the (992, 802) binary Quasi-Cyclic Low Density Parity Check code over the Additive White Gaussian Noise channel with Binary Phase Shift Keying signaling.

Again, we choose $X=-1$ and use the field $GF(2^5)$ to construct an RC-constrained 32×32 array $H_{qc,1}$ of 31×31 circulant permutation and zero matrices. Suppose we set $\gamma=10$ and $\rho=32$. Take a 10×32 subarray $H_{qc,1}(10,32)$ from $H_{qc,1}$. Then $H_{qc,1}(10,32)$ is a 310×992 matrix over GF(2) with row weight 31 and two column weights, 9 and 10. The null space of $H_{qc,1}(10,31)$ gives a (992, 802) binary Quasi-Cyclic Low Density Parity Check code with a code rate of 0.809 and a minimum distance of at least 10. The performances of this code over the Additive White Gaussian Noise with BPSK signaling are shown in FIGS. 14 to 16. From FIG. 14, we see that at the BER of $10^{-6}$, the code achieves a 6.1 dB coding gain over the uncoded BPSK system. From FIG. 15, we see that iterative decoding of the code converges very fast. At the BER of $10^{-6}$, the performance gap between 5 iterations and 100 iterations is within 0.2 dB. FIG. 16 shows the error-floor of this code to be well below $10^{-15}$.

The codes in the following two examples are prime candidates for data storage applications because of their high code rates and high coding gains with low encoder implementation complexities.

EXAMPLE 8

Figure 17:
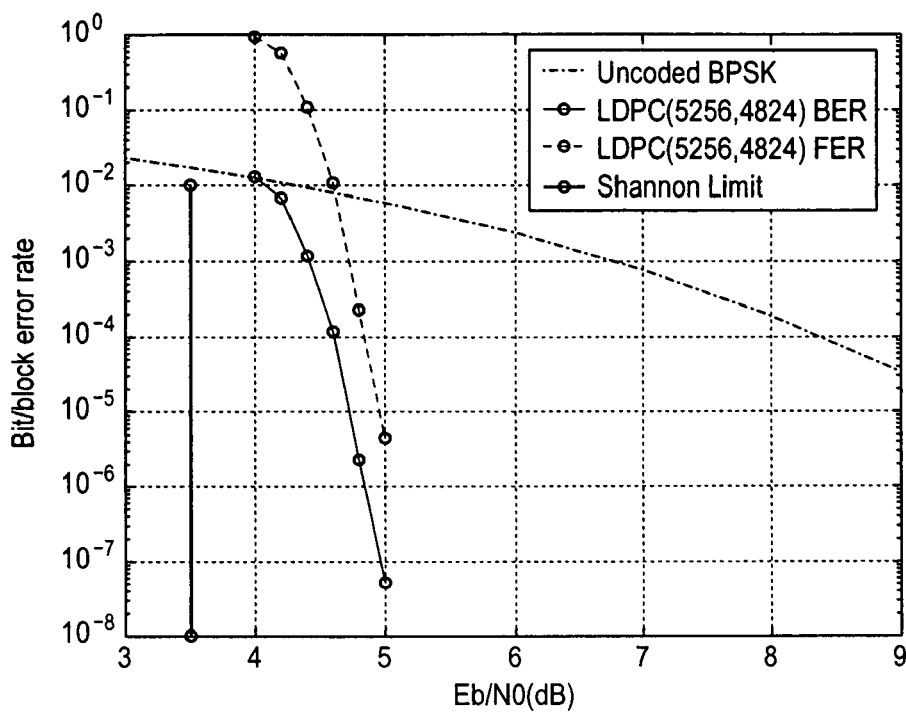
FIG. 17 illustrates the error performance of the (5256, 4824) binary Quasi-Cyclic Low Density Parity Check code over the Additive White Gaussian Noise channel with Binary Phase Shift Keying signaling.
Figure 18:
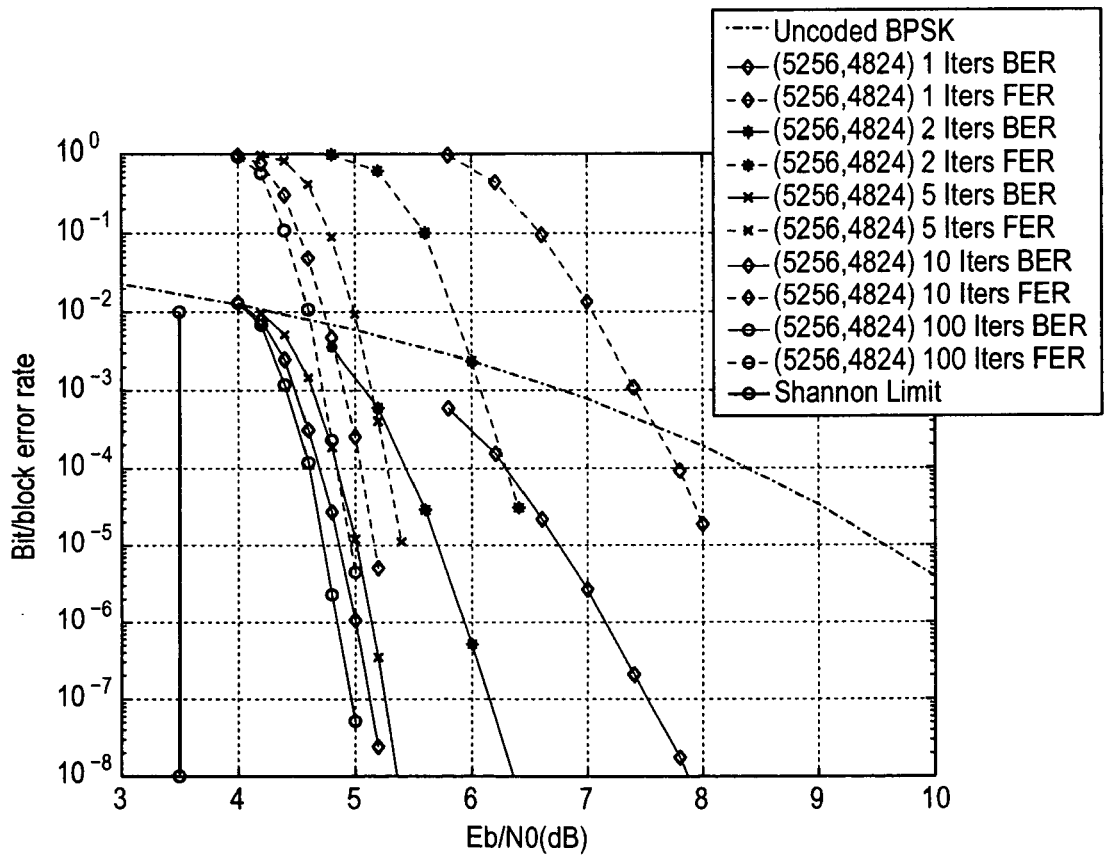
FIG. 18 illustrates the rate of decoding convergence of the (5256, 4824) binary Quasi-Cyclic Low Density Parity Check code over the Additive White Gaussian Noise channel with Binary Phase Shift Keying signaling.

Let GF(73) be the field for code construction and $X=-1$. Based on this field, we construct an RC-constrained 73×73 $H_{qc,1}$ array of 72×72 circulant permutation and zero matrices. Set $\gamma=6$ and $\rho=73$. Take a 6×73 subarray $H_{qc,1}(6,73)$ from $H_{qc,1}$. Then $H_{qc,1}(6,73)$ is a 432×5256 matrix with row weight 72 and two column weights 5 and 6. The null space of $H_{qc,1}(6,73)$ gives a (5256,4824) binary Quasi-Cyclic Low Density Parity Check code with a code rate of 0.918. The performances of this code with iterative decoding over the Additive White Gaussian Noise channel with BPSK signaling are shown in FIGS. 17 and 18, which display high coding gain as well as fast rates of decoding convergence.

EXAMPLE 9

Figure 19:
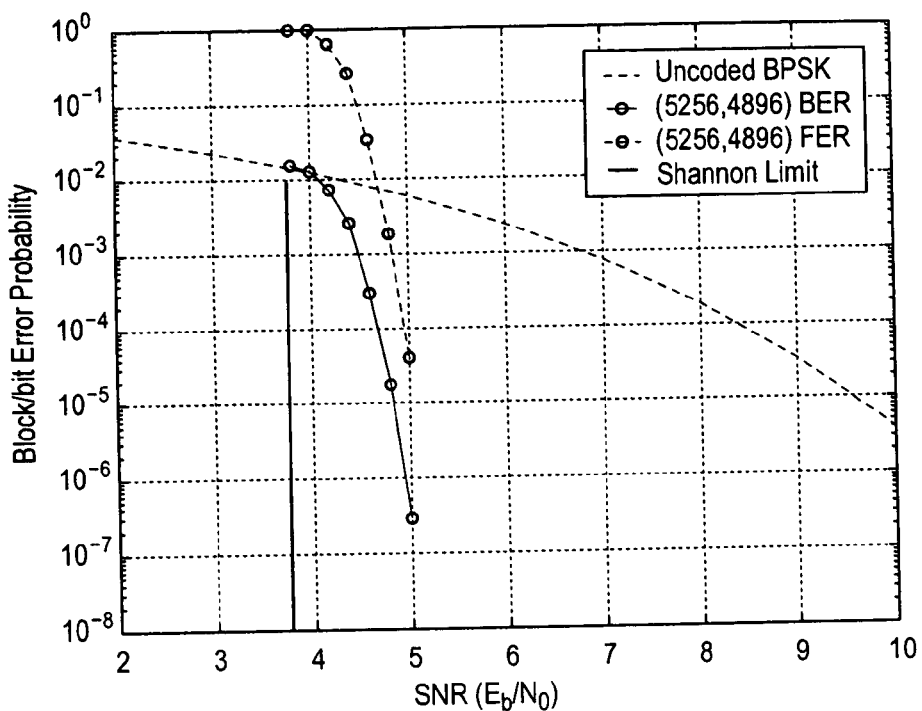
FIG. 19 illustrates the error performance of the (5256, 4896) binary Quasi-Cyclic Low Density Parity Check code over the Additive White Gaussian Noise channel with Binary Phase Shift Keying signaling.
Figure 20:
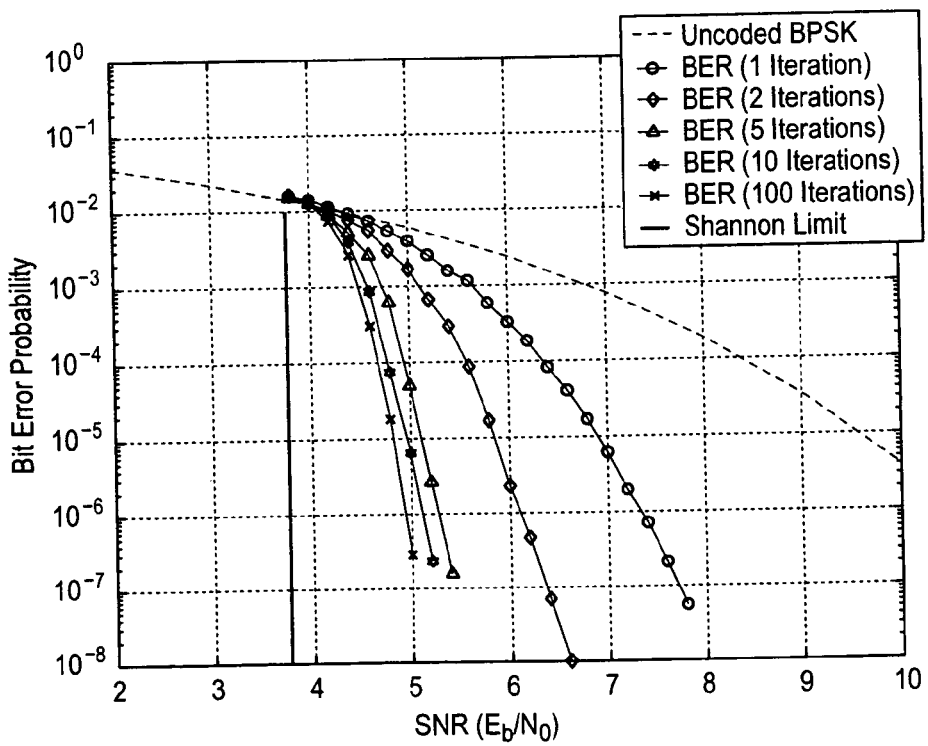
FIG. 20 illustrates the rate of decoding convergence of the (5256, 4896) binary Quasi-Cyclic Low Density Parity Check code over the Additive White Gaussian Noise channel with Binary Phase Shift Keying signaling.
Figure 21:
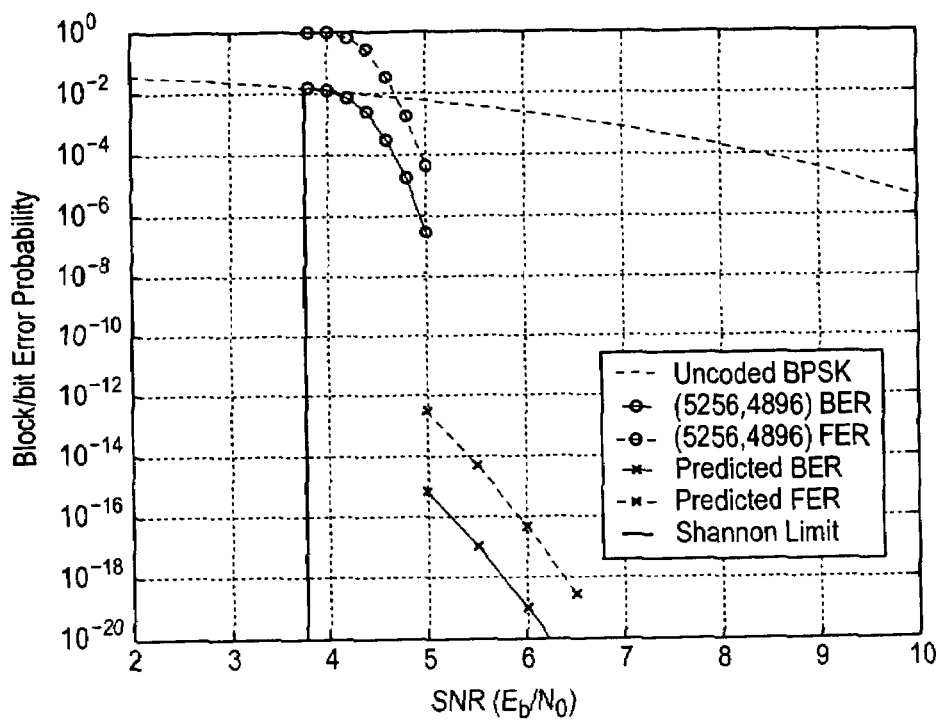
FIG. 21 illustrates the estimated error floor of the (5256, 4896) binary Quasi-Cyclic Low Density Parity Check code over the Additive White Gaussian Noise channel with Binary Phase Shift Keying signaling.

We use the 73×73 array $H_{qc,1}$ of circulant permutation and zero matrices constructed based on GF(73) given in Example 8. Choose $\gamma=5$ and $\rho=73$. Take a 5×73 subarray $H_{qc,1}(5,73)$ from $H_{qc,1}$. The null space of $H_{qc,1}(5,73)$ gives a (5256,4896) binary Quasi-Cyclic Low Density Parity Check code with a code rate of 0.932. The performances of this code with iterative decoding over the Additive White Gaussian Noise with BPSK signaling are shown in FIGS. 19 to 21, which display coding gain, decoder rate of convergence, and error-floor performances, respectively.

A Second Class of High Coding Gain Efficiently Implementable Binary Quasi-Cyclic Low Density Parity Check Codes We presented above a method for constructing Row-Column constrained arrays based on finite fields and location-vector representations of field elements with respect to the multiplicative groups of finite fields. We constructed above a class of high coding gain and efficiently implementable binary Quasi-Cyclic Low Density Parity Check codes based on these Row-Column constrained arrays. In this section, we present another class of binary Quasi-Cyclic Low Density Parity Check codes whose construction is based on finite fields and location-vector representations of field elements with respect to the additive groups of prime fields.

Let q be a prime number. Then there exists a prime field $GF(q)=\{0, 1, \ldots, q-1\}$ under modulo-q addition and multiplication operations. All the q elements of GF(q) form an additive group under the addition operation of GF(q). For any element $i \in GF(q)$, we form a q-tuple, $$z(i)=(z_0, z_1, \ldots, z_{q-1}) \quad (58)$$

whose components correspond to all the q elements of GF(q), where the i-th component $z_i=1$ and all the other q−1 components are equal to 0. This unit q-tuple z(i) is referred to as the location-vector with respect to the additive group of GF(q) and is called the A-location vector of the field element i. The A-location vector of the zero element 0 of GF(q), which is $z(0)=(1, 0, 0, \ldots, 0)$, is also a unit q-tuple. For $i \in \{0, 1, \ldots, q-1\}$, the A-location vector z(i+1) of the field element i+1 is the cyclic-shift (one place to the right) of the A-location vector z(i) of the field element i under modulo-q addition.

Let X be any non-zero integer in the prime field GF(q). We form the following q×q matrix over GF(q):

$$G = \begin{bmatrix} g_0 \\ g_1 \\ g_2 \\ \vdots \\ g_{q-1} \end{bmatrix} = \begin{bmatrix} 0 & 0 & 0 & \cdots & 0 \\ 0 & X & 2X & \cdots & (q-1)X \\ 0 & 2X & 3X & \cdots & X \\ \vdots & \vdots & \vdots & \ddots & \vdots \\ 0 & (q-1)X & X & \cdots & (q-2)X \end{bmatrix} \quad (59)$$

Let G* be the (q−1)×(q−1) matrix obtained by removing the all-zero row and the all-zero column from G. Then G* is a (q−1)×(q−1) circulant matrix over GF(q) such that each row is the left cyclic-shift of the row above it, and the first row is the left cyclic-shift of the last row.

For each row $g_i$ in G with $0 \leq i \leq q-1$, we form the following q×q matrix over GF(q):

$$G_i = \begin{bmatrix} 0+0 & iX+0 & \cdots & (q-1)X+0 & X+0 & \cdots & (i-1)X+0 \\ 0+1 & iX+1 & \cdots & (q-1)X+1 & X+1 & \cdots & (i-1)X+1 \\ \vdots & \ddots & \vdots & \vdots & \ddots & \vdots \\ 0+(q-1) & iX+(q-1) & \cdots & (q-1)X+(q-1) & X+(q-1) & \cdots & (i-1)X+(q-1) \end{bmatrix} \quad (60)$$

For a prime field $GF(q)=\{0, 1, \ldots, q-1\}$ under modulo-q addition and multiplication, the A-location vector $z(iX+(k+1))$ of the field element $iX+(k+1)$ is the cyclic-shift (one place to the right) of the A-location vector $z(iX+k)$ with $0 \leq k \leq q-1$. Finally, replacing each entry in $G_i$ by its A-location vector, we obtain a $q \times q^2$ matrix over $GF(2)$:

$$B_i[A_{i,0}, A_{i,1}, \ldots, A_{i,q-1}], \quad (61)$$

which consists of a row of q $q \times q$ circulant permutation matrices. Then the array:

$$H_{qc,2} = \begin{bmatrix} B_0 \\ B_1 \\ \vdots \\ B_{q-1} \end{bmatrix} = \begin{bmatrix} A_{0,0} & A_{0,1} & \cdots & A_{0,q-1} \\ A_{1,0} & A_{1,1} & \cdots & A_{1,q-1} \\ \vdots & \vdots & \ddots & \vdots \\ A_{q-1,0} & A_{q-1,1} & \cdots & A_{q-1,q-1} \end{bmatrix} \quad (62)$$

is a $q \times q$ array of $q \times q$ circulant permutation matrices. Therefore, $H_{qc,2}$ is a $q^2 \times q^2$ matrix with both column and row weights q and also satisfies the Row-Column constraint. The code construction using this array is similar to that used above. We illustrate the construction of such an array $H_{qc,2}$ of circulants in Example 10 below.

EXAMPLE 10

Consider $q=3$ and $GF(3)=\{0, 1, 2\}$, where the field arithmetic is addition and multiplication taken modulo-3. Choose $X=1$. Then the matrices $G_i$ given by equation (60) for $0 \leq i \leq 2$ are:

$$G_0 = \begin{bmatrix} 0 & 0 & 0 \\ 1 & 1 & 1 \\ 2 & 2 & 2 \end{bmatrix},$$

$$G_1 = \begin{bmatrix} 0 & 1 & 2 \\ 1 & 2 & 0 \\ 2 & 0 & 1 \end{bmatrix},$$

and $$G_2 = \begin{bmatrix} 0 & 2 & 1 \\ 1 & 0 & 2 \\ 2 & 1 & 0 \end{bmatrix}.$$

The A-location vectors for the field elements are:
$z(0) = (1\ 0\ 0)$
$z(1) = (0\ 1\ 0)$.
$z(2) = (0\ 0\ 1)$ Therefore, the matrices $B_i$ (each of which consists of one row of three $3 \times 3$ circulants given by equation (61)) for $0 \leq i \leq 2$ are:

$$B_0 = \begin{bmatrix} 100 & 100 & 100 \\ 010 & 010 & 010 \\ 001 & 001 & 001 \end{bmatrix},$$

$$B_1 = \begin{bmatrix} 100 & 010 & 001 \\ 010 & 001 & 100 \\ 001 & 100 & 010 \end{bmatrix},$$

and $$B_2 = \begin{bmatrix} 100 & 001 & 010 \\ 010 & 100 & 001 \\ 001 & 010 & 100 \end{bmatrix},$$

which yields the following array $H_{qc,2}$ (which is a $3 \times 3$ array of $3 \times 3$ circulants given by equation (62)):

$$H_{qc,2} = \begin{bmatrix} 1 & 0 & 0 & 1 & 0 & 0 & 1 & 0 & 0 \\ 0 & 1 & 0 & 0 & 1 & 0 & 0 & 1 & 0 \\ 0 & 0 & 1 & 0 & 0 & 1 & 0 & 0 & 1 \\ 1 & 0 & 0 & 0 & 1 & 0 & 0 & 0 & 1 \\ 0 & 1 & 0 & 0 & 0 & 1 & 1 & 0 & 0 \\ 0 & 0 & 1 & 1 & 0 & 0 & 0 & 1 & 0 \\ 1 & 0 & 0 & 0 & 0 & 1 & 0 & 1 & 0 \\ 0 & 1 & 0 & 1 & 0 & 0 & 0 & 0 & 1 \\ 0 & 0 & 1 & 0 & 1 & 0 & 1 & 0 & 0 \end{bmatrix}.$$

Consider a code construction where $\gamma=2$ and $\rho=3$ by choosing the top $2 \times 3$ subarray in $H_{qc,2}$. This then yields the following parity-check matrix H for a binary Quasi-Cyclic Low Density Parity Check code:

$$H = \begin{bmatrix} 1 & 0 & 0 & 1 & 0 & 0 & 1 & 0 & 0 \\ 0 & 1 & 0 & 0 & 1 & 0 & 0 & 1 & 0 \\ 0 & 0 & 1 & 0 & 0 & 1 & 0 & 0 & 1 \\ 1 & 0 & 0 & 0 & 1 & 0 & 0 & 0 & 1 \\ 0 & 1 & 0 & 0 & 0 & 1 & 1 & 0 & 0 \\ 0 & 0 & 1 & 1 & 0 & 0 & 0 & 1 & 0 \end{bmatrix}.$$

The rank of this parity check matrix H is equal to 5, so the null space of H is a (9,4) binary Quasi-Cyclic Low Density Parity Check of code rate equal to 4/9.

Similar to the above construction of codes based on the array $H_{qc,1}$ given by equation (56), we can construct well-performing binary Quasi-Cyclic Low Density Parity Check codes with flexible blocklengths and code rates by using subarrays of the $q^2 \times q^2$ matrix $H_{qc,2}$ given by equation (62) to form parity check matrices for these codes. We present several examples of this method below.

EXAMPLE 11

Figure 22:
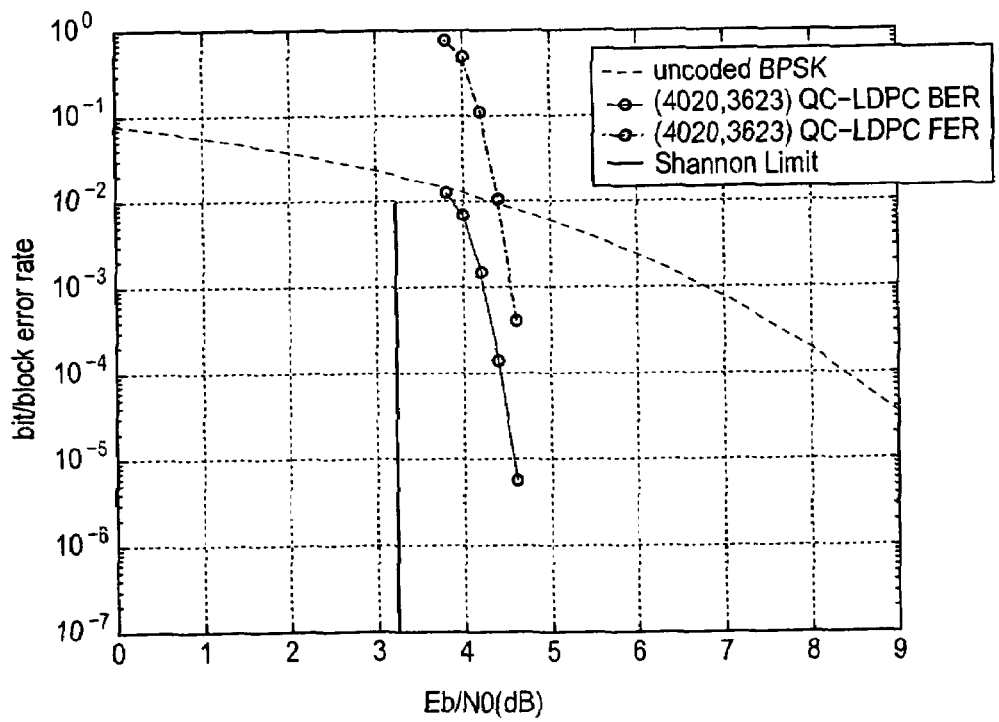
FIG. 22 illustrates the error performance of the (4020, 3623) binary Quasi-Cyclic Low Density Parity Check code over the Additive White Gaussian Noise channel with Binary. Phase Shift Keying signaling.
Figure 23:
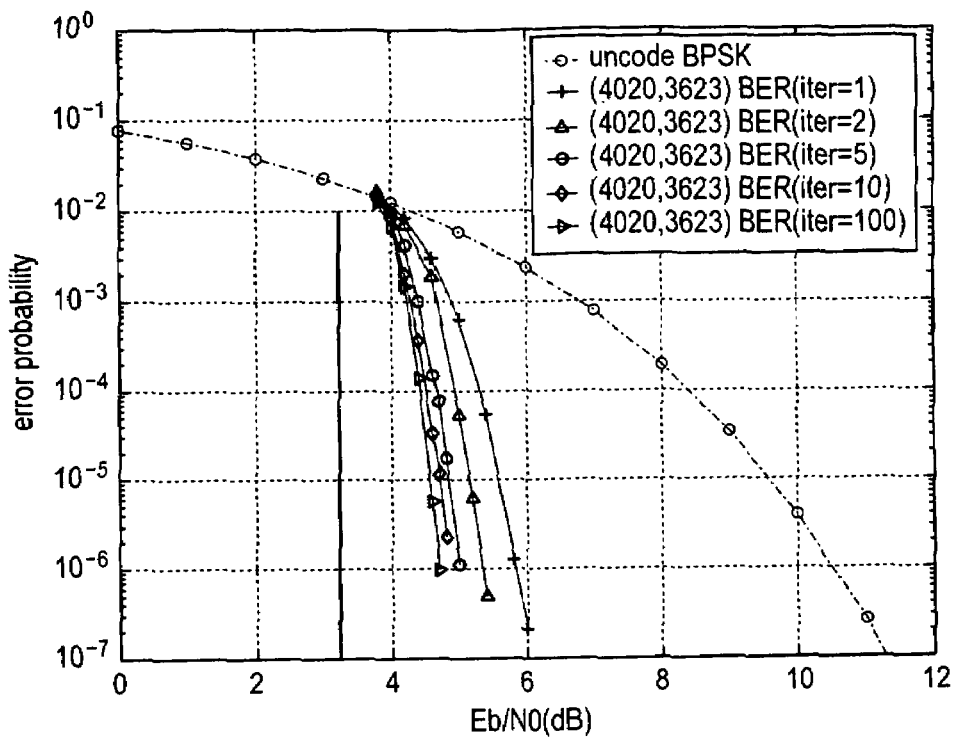
FIG. 23 illustrates the rate of decoding convergence of the (4020, 3623) binary Quasi-Cyclic Low Density Parity Check code over the Additive White Gaussian Noise channel with Binary Phase Shift Keying signaling.
Figure 24:
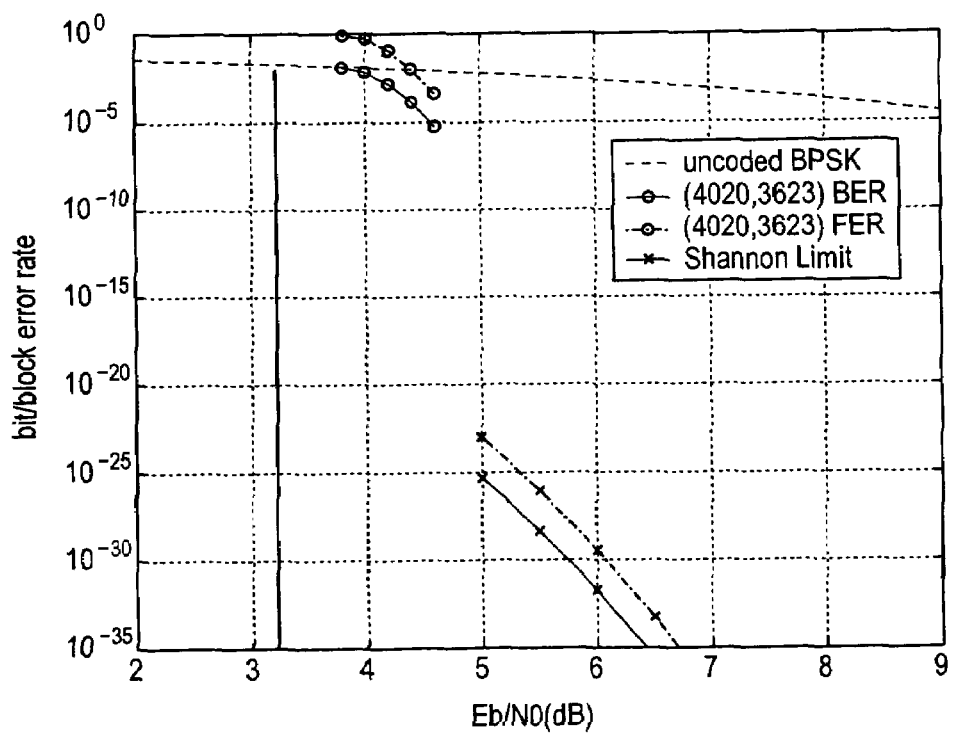
FIG. 24 illustrates the estimated error floor of the (4020, 3623) binary Quasi-Cyclic Low Density Parity Check code over the Additive White Gaussian Noise channel with Binary Phase Shift Keying signaling.

Let GF(67) be the construction field. Choose X=1. We can construct a 67×67 array $H_{qc,2}$ of 67×67 circulant permutation matrices. Choose $\gamma=6$ and $\rho=60$. Take a 6×60 subarray $H_{qc,2}(6,60)$ from $H_{qc,2}$. Then $H_{qc,2}(6,60)$ is a 402×4020 matrix over GF(2) with column and row weights 6 and 60, respectively. The null space of $H_{qc,2}$ (6,60) gives a (4020,3623) binary regular Quasi-Cyclic Low Density Parity Check code with a code rate of 0.9012. Its performances with BPSK signaling over the Additive White Gaussian Noise using iterative decoding are shown in FIGS. 22 to 24. From FIG. 22, we see that at the BER of $10^{-6}$, the code achieves a 6 dB coding gain over the uncoded BPSK signaling and performs 1.4 dB from the Shannon limit. FIG. 23 shows a fast rate of iterative decoding convergence, while FIG. 24 displays very low estimated error-floors.

EXAMPLE 12

Figure 25:
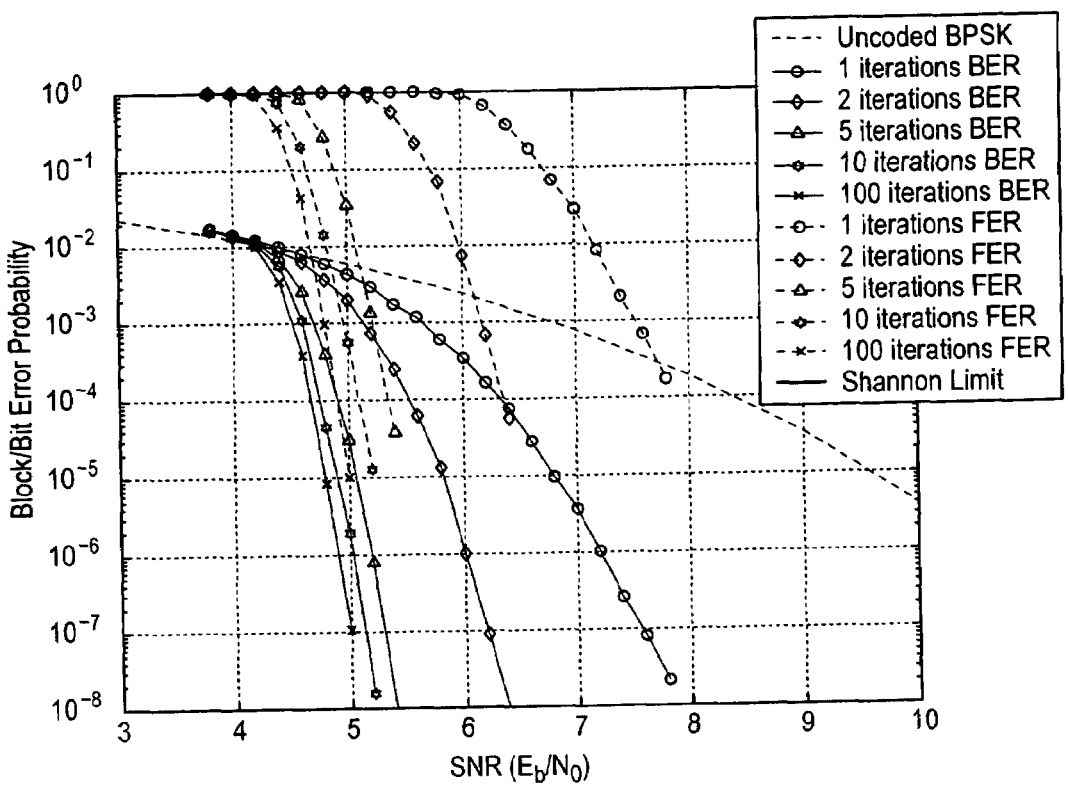
FIG. 25 illustrates the error performance of the (8148, 7571) binary Quasi-Cyclic Low Density Parity Check code over the Additive White Gaussian Noise channel with Binary Phase Shift Keying signaling.

In this example, we use the prime field GF(97) for code construction and choose X=1. First, we construct a 97×97 array $H_{qc,2}$ of 97×97 circulant permutation matrices. Set $\gamma=6$ and $\rho=84$. Take a 6×84 subarray $H_{qc,2}(6,84)$ from $H_{qc,2}$. Then $H_{qc,2}(6,84)$ is a 582×8148 matrix over GF(2) with column and row weights 6 and 84, respectively. The null space of $H_{qc,2}(6,84)$ gives a (8148,7571) binary regular Quasi-Cyclic Low Density Parity Check code with a code rate of 0.929. The performance of this code with BPSK signaling over the Additive White Gaussian Noise channel using iterative decoding is shown in FIG. 25. At the BER of $10^{-6}$, it achieves a 5.6 dB coding gain over the uncoded BPSK signal and performs 1.15 dB from the Shannon limit. FIG. 25 also shows that decoding convergence is very fast where the performance gap at a BER of $10^{-6}$ between 5 iterations and 100 iterations is within 0.3 dB.

EXAMPLE 13

Figure 26:
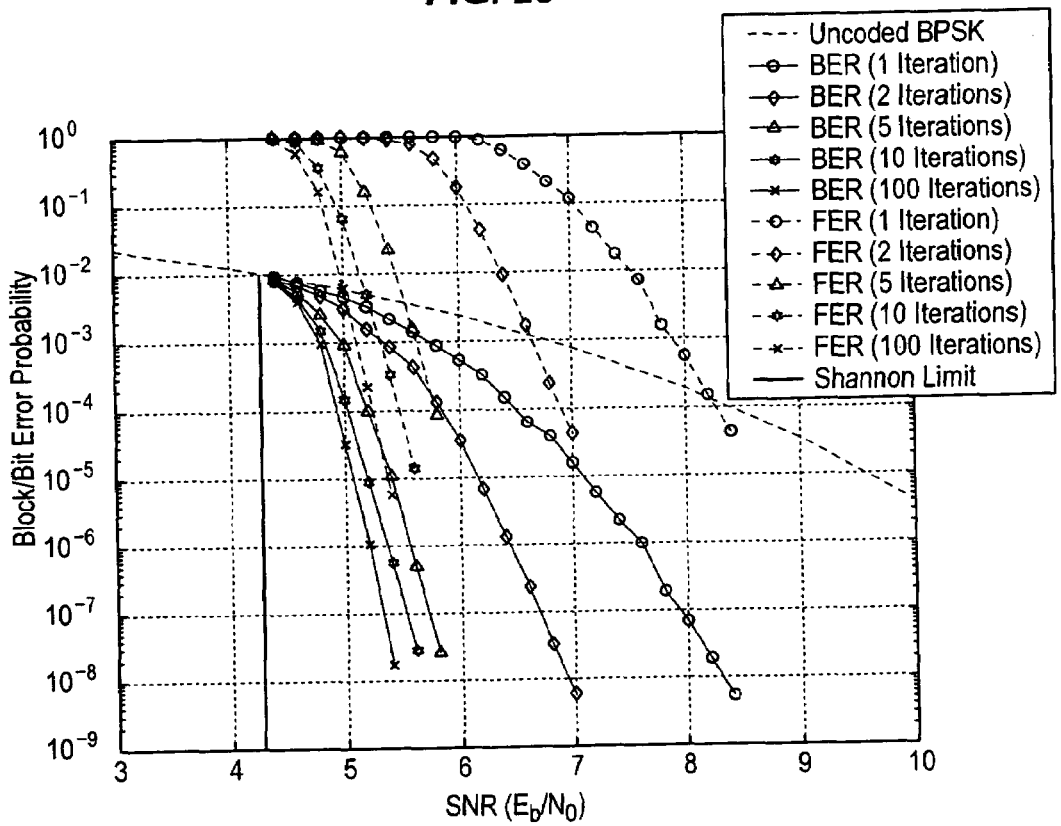
FIG. 26 illustrates the error performance of the (8148, 7763) binary Quasi-Cyclic Low Density Parity Check code over the Additive White Gaussian Noise channel with Binary Phase Shift Keying signaling.

We use the 97×97 array $H_{qc,2}$ of 97×97 circulant permutation matrices given above in Example 12. Set $\gamma=4$ and $\rho=84$. Take a 4×84 subarray $H_{qc,2}(4,84)$ from $H_{qc,2}$. Then $H_{qc,2}(4,84)$ is a 388×8148 matrix over GF(2) with column and row weights 4 and 84, respectively. The null space of $H_{qc,2}(4,84)$ gives a (8148,7763) binary regular Quasi-Cyclic Low Density Parity Check code with a code rate of 0.953. The performance of this code with BPSK signaling over the Additive White Gaussian Noise channel using iterative decoding is shown in FIG. 26. At the BER of $10^{-6}$, it achieves a 5.2 dB coding gain over the uncoded BPSK signal and performs 0.9 dB from the Shannon limit. FIG. 26 also shows that iterative decoding of the code converges very fast. At the BER of $10^{-6}$, the performance gap between 5 iterations and 100 iterations is within 0.3 dB.

Structurally Compatible Families of Binary Quasi-Cyclic Low Density Parity Check Codes for Universal Coding Schemes For a properly chosen $\gamma \times \rho$ subarray $H_{qc,e}(\gamma,\rho)$ of a Row-Column constrained array $H_{qc,e}$ (with e=1 or 2 corresponding to the code construction method 1 yielding equation (56) and code construction method 2 yielding equation (62)) of circulant permutation matrices constructed based on a given field GF(q), it is possible to construct a family of structurally compatible binary Quasi-Cyclic Low Density Parity Check codes of various lengths, code rates, and error performances for various channel conditions and data rates for the universal binary Quasi-Cyclic Low Density Parity Check based coding scheme introduced previously. Codes in this family can be encoded using a universal encoder and also decoded with one universal decoder.

We begin with a properly chosen field GF(q) and construct a Row-Column constrained array $H_{qc,e}$ of circulant permutation matrices. Choose a proper pair $(\gamma,\rho)$ of positive integers with $1 \leq \gamma$, $\rho \leq q$, and a $\gamma \times \rho$ subarray $H_{qc,e}(\gamma,\rho)$ of $H_{qc,e}$. Then $H_{qc,e}(\gamma,\rho)$ is used as the base array for constructing the base code C. The approach described previously can now be used to obtain a family of structurally compatible binary Quasi-Cyclic Low Density Parity Check codes. The null space of $H_{qc,e}(\gamma,\rho)$ gives a binary Quasi-Cyclic Low Density Parity Check code C. Choose a sequence of m distinct pairs of positive integers, $(\gamma_i, \rho_i)$, with $1 \leq i \leq m$, such that $1 \leq \gamma_1 \leq \gamma_2 \leq \ldots \leq \gamma_m \leq \gamma$, $1 \leq \rho_1 \leq \rho_2 \leq \ldots \leq \rho_m > \rho$. Let $H_{qc,e}(\gamma_i,\rho_i)$ be the $\gamma_i \times \rho_i$ subarray of the base array $H_{qc,e}(\gamma,\rho)$ obtained by deleting (or puncturing) the last $\rho-\rho_i$ columns of circulant permutation matrices and last $\gamma-\gamma_i$ rows of the circulant permutation matrices from $H_{qc,e}(\gamma,\rho)$. The deleted rows of circulant permutation matrices consist of $(\gamma-\gamma_i)(q-1)$ rows of $H_{qc,e}(\gamma,\rho)$ for the construction method 1 (or $(\gamma-\gamma_i)q$ rows for the construction method 2 given above). The deleted columns of circulant permutation matrices consist of $(\rho-\rho_i)(q-1)$ columns (or $(\rho-\rho_i)q$ columns) for construction method 1 (or construction method 2). Let $C_i$ be the binary Quasi-Cyclic Low Density Parity Check code given by the null space of $H_{qc,e}(\gamma_i,\rho_i)$. So we have constructed a structurally compatible family $C, C_1, C_2, \ldots, C_m$ of m+1 binary Quasi-Cyclic Low Density Parity Check codes.

The universal encoder implementation scheme described previously can be applied here to devise a universal encoder that can adapt to encode every code in this structurally compatible family of codes. Consider next the previously described method for implementing a universal decoder that can serve to decode every code in this family. As described previously, let $V_i$ and $S_i$ denote the set of deleted columns and the set of deleted rows, respectively, for code $C_i$. Then the Tanner Graph $T_i$ of $C_i$ is a subgraph of the Tanner Graph T of C, which is obtained by: (1) deleting the variable nodes corresponding to the deleted columns in $V_i$ and the edges incident on these deleted variable nodes; and (2) deleting the check-sum nodes corresponding to the deleted rows in $S_i$ and the edges incident on these deleted check-sum nodes. Let D be the decoder built for the binary Quasi-Cyclic Low Density Parity Check code C given by the null space of $H_{qc,e}(\gamma,\rho)$. If we deactivate the (wire) connections in decoder D that correspond to the edges incident on the deleted variable nodes and deleted check-sum nodes, we obtain a subdecoder for decoding the code $C_i$. Consequently, the decoder D for C can be used to decode all the m+1 binary Quasi-Cyclic Low Density Parity Check codes, $C, C_1, \ldots, C_m$, given by the null spaces of the subarrays, $H_{qc,e}(\gamma,\rho), H_{qc,e}(\gamma_1,\rho_1), \ldots, H_{qc,e}(\gamma_m,\rho_m)$, of the array $H_{qc,e}$ of circulant permutation matrices constructed based on the chosen field GF(q).

For an example, consider the two binary Quasi-Cyclic Low Density Parity Check codes constructed based on the field $GF(2^5)$ given in Examples 6 and 7, which can be decoded with one decoder, the decoder for the (992, 750) code given in Example 6. The two binary Quasi-Cyclic Low Density Parity Check codes constructed based on the field GF(73) given in Examples 8 and 9 can also be decoded with one decoder, the decoder for the (5256, 4824) code given in Example 8. The two codes given in Examples 12 and 13 can also be decoded with one decoder.

Universal Coding Scheme Based on q-ary Regular Quasi-Cyclic Low Density Parity Check Codes The universal coding scheme discussed previously is based on binary Quasi-Cyclic Low Density Parity Check codes. In this section, we extend this universal forward error-correction coding system to implementations based on q-ary Quasi-Cyclic Low Density Parity Check codes where the symbols in each codeword take on values in a finite Galois field GF(q) with q elements and q>2. Nonbinary forward error-correction codes, such as the Reed Solomon codes where $q=2^m$, play an important role for burst error correction and application to systems employing multi-level signaling. Universal forward error-correction coding schemes based on q-ary Quasi-Cyclic Low Density Parity Check codes are designed for similar applications.

This general construction method of a universal forward error-correction coding system is then used to devise a structurally compatible family of q-ary regular Quasi-Cyclic Low Density Parity Check codes for a universal coding scheme. All the codes in a structurally compatible code family can be encoded using a single universal encoder and decoded using a single universal decoder.

Properties of q-ary Regular Low Density Parity Check Codes

Consider a Galois field GF(q) with q elements, where q>2. The concepts and properties of binary linear block codes discussed previously can be extended in a natural manner to q-ary linear block codes. In the q-ary case, a message block is represented by a k-tuple $u=(u_0, \ldots u_{k-1})$, where each message symbol $u_i$ is an element of GF(q). Each of the $q^k$ message blocks is encoded into a codeword which is an n-tuple $v=(v_0, \ldots v_{n-1})$, and each code symbol $v_j$ is an element of GF(q). The set of codewords of a q-ary (n,k) linear block code $C_q$ then forms a k-dimensional subspace of the vector space of all the n-tuples over the Galois field GF(q). The set of $q^k$ codewords in $C_q$ is the row space of a k×n generator matrix G over GF(q) given by equations (1) and (2). Moreover, corresponding to each generator matrix G, there is a (n−k)×n parity check H over GF(q) that satisfies equations (4) and (5). Therefore, the set of $q^k$ codewords in $C_q$ is also the null space of a parity check matrix H over GF(q). Finally, the weight of a q-ary n-tuple is equal to the number of non-zero elements in it. The minimum distance of a q-ary linear block code is then defined as the minimum weight over all non-zero codewords.

A q-ary (γ,ρ)-regular Low Density Parity Check code is given by the null space over GF(q) of a sparse parity check matrix $H=[h_{i,j}]$ over GF(q) with similar structural properties as required for a binary (γ,ρ)-regular Low Density Parity Check code defined above: (1) each row consists of ρ non-zero components in GF(q); (2) each column consists of γ non-zero components in GF(q); (3) no two rows (or two columns) of H have more than one position at which both have non-zero components in GF(q); and (4) both ρ and γ are small compared with the blocklength n of the code and the number of rows in H. Properties (1) and (2) say that the parity check matrix H has constant row and column weights ρ and γ, respectively. We call the Row-Column constraint of Property (3) the q-ary Row-Column constraint. Property (4) implies that the matrix H has a small density of non-zero elements; hence, it is a sparse matrix.

Various decoding algorithms similar to those given above can be used to decode these q-ary regular Low Density Parity Check codes. The Tanner Graph of a q-ary Low Density Parity Check code is constructed in the same way as for a binary Low Density Parity Check code, with variable-nodes corresponding to the columns of the parity check matrix H and check nodes corresponding to the rows of H. The j-th variable code is connected to the i-th check node with an edge if and only if the entry $h_{i,j}$ at the intersection of i-th row and j-th column of H is a non-zero element in GF(q). The q-ary Row-Column constraint ensures that the minimum distance of the code is at least γ+1 and the girth of its Tanner Graph is at least 6.

Definitions of q-ary M-Location Vector Representations of Elements of a Finite Field and q-ary α-Multiplied Circulant Permutation Matrices Again, we consider a finite field GF(q) where q is a power of a prime number. Let α be a primitive element in GF(q). Then $\alpha^{-\infty}=0$, $\alpha^0=1$, α, ..., $\alpha^{q-2}$ form all the elements of GF(q). Let $\alpha^i$ be a non-zero element in GF(q). Define the following (q−1)-tuples over GF(q):

$$z(\alpha^i)=(z_0,z_1,\ldots,z_{q-2}) \tag{63}$$

whose components correspond to the q−1 non-zero elements of GF(q), where the i-th component $z_i=\alpha^i$ and all of the other q−2 components are equal to 0. This (q−1)-tuple $z(\alpha^i)$ over GF(q) is called the q-ary M-location vector of the field element $\alpha^i$ with respect to the multiplicative group of GF(q). The q-ary M-location vector of the 0 element of GF(q) is again defined as the all-zero (q−1)-tuple. Let δ be a non-zero element in GF(q). Then the q-ary M-location vector z(αδ) of the field element αδ is the cyclic-shift (one place to the right) of the q-ary M-location vector z(δ) of δ multiplied by α. Note that δ, αδ, ..., $\alpha^{q-2}\delta$ form all the q−1 non-zero elements of GF(q). Form a (q−1)×(q−1) matrix A* over GF(q) with the q-ary M-location vectors of δ, αδ, ..., $\alpha^{q-2}\delta$ as the rows. Then A* is a special kind of circulant permutation matrix in which a row is the cyclic-shift of the row above it multiplied by the primitive element α, and the first row is the cyclic-shift of the last row multiplied by α. Every row (or column) has one and only one non-zero element in GF(q). Then A* can be expressed as the following product:

$$A^*=AZ, \tag{64}$$

where A is a binary (q−1)×(q−1) circulant permutation matrix, and Z is a (q−1)×(q−1) matrix over GF(q) with $\alpha^0\delta$, αδ, ..., $\alpha^{q-2}\delta$ as entries on its main diagonal and zero entries elsewhere, i.e.:

$$Z = \begin{bmatrix} \alpha^0\delta & 0 & 0 & \cdots & 0 \\ 0 & \alpha\delta & 0 & \cdots & 0 \\ 0 & 0 & \alpha^2\delta & \cdots & 0 \\ \vdots & \vdots & \vdots & \ddots & \vdots \\ 0 & 0 & 0 & \cdots & \alpha^{q-2}\delta \end{bmatrix} \tag{65}$$

We shall call A* a q-ary α-multiplied circulant permutation matrix.

Construction of q-ary Row-Column Constrained Arrays of q-ary α-Multiplied Circulant Permutation Matrices If we replace each entry in the matrix $G_i$ given by equation (54) with its q-ary M-location vector, we obtain the following (q−1)×q(q−1) matrix over GF(q):

$$B_i^*=[A_{i,-\infty}^* \; A_{i,0}^* \; A_{i,1}^* \ldots A_{i,q-2}^*] \tag{66}$$

which consists of q(q−1)×(q−1) submatrices $A_{i,j}^*$'s over GF(q). Each submatrix $A_{i,j}^*$ is formed by the q-ary M-location vectors of the q−1 entries of the j-th column of $G_i$ as rows and is a q-ary α-multiplied (q−1)×(q−1) circulant permutation matrix if the j-th column of $G_i$ is not the zero column of $G_i$. Otherwise, it is a (q−1)×(q−1) zero matrix. Therefore, $B_i^*$ consists of q−1 q-ary α-multiplied (q−1)×(q−1) circulant permutation matrices and a single (q−1)×(q−1) zero matrix. Form the following q×q array of (q−1)×(q−1) submatrices over GF(q):

$$H_{qc,3} = \begin{bmatrix} B_{-\infty}^* \\ B_0^* \\ B_1^* \\ \vdots \\ B_{q-2}^* \end{bmatrix} = \begin{bmatrix} A_{-\infty,-\infty}^* & A_{-\infty,0}^* & A_{-\infty,1}^* & \cdots & A_{-\infty,q-2}^* \\ A_{0,-\infty}^* & A_{0,0}^* & A_{0,1}^* & \cdots & A_{0,q-2}^* \\ A_{1,-\infty}^* & A_{1,0}^* & A_{1,1}^* & \cdots & A_{1,q-2}^* \\ \vdots & \vdots & \vdots & \ddots & \vdots \\ A_{q-2,-\infty}^* & A_{q-2,0}^* & A_{q-2,1}^* & \cdots & A_{q-2,q-2}^* \end{bmatrix} \quad (67)$$

The submatrices $A_{-\infty,-\infty}^*, A_{0,0}^*, A_{1,1}^*, \ldots, A_{q-2,q-2}^*$ on the main diagonal of $H_{qc,3}$ are (q−1)×(q−1) zero matrices, and all the other submatrices in $H_{qc,3}$ are q-ary α-multiplied circulant permutation matrices. Then $H_{qc,3}$ is a q(q−1)×q(q−1) matrix over GF(q) with both column and row weights equal to q−1. It follows from Lemma 1, the structural properties of matrices G and $G_i$'s and the definition of q-ary M-location vectors of field elements, that $H_{qc,3}$ satisfies the q-ary Row-Column constraint. Hence, its null space defines a q-ary regular Quasi-Cyclic Low Density Parity Check code whose associated Tanner Graph has a girth of at least 6 and is free of cycles of length 4. Similar to the approach above for designing efficiently implementable encoders for binary Quasi-Cyclic Low Density Parity Check codes, it can be shown that the circulant array structure of the matrix $H_{qc,3}$ allows efficiently implementable encoders for these q-ary regular Quasi-Cyclic Low Density Parity Check codes.

Structurally Compatible Families of q-ary Regular Quasi-Cyclic Low Density Parity Check Codes for Universal Coding Schemes For any pair (γ,ρ) of integers with 1≤γ, ρ≤q, let $H_{qc,3}(\gamma,\rho)$ be a γ×ρ subarray of the q-ary Row-Column constrained array $H_{qc,3}$ given by equation (67). Then $H_{qc,3}(\gamma,\rho)$ is a γ(q−1)×ρ(q−1) matrix over GF(q). If $H_{qc,3}(\gamma,\rho)$ does not contain any zero submatrix in $H_{qc,3}$, then it has constant column and row weights γ and ρ, respectively. Otherwise, it has two column weights γ−1 and γ or perhaps two row weights ρ−1 and ρ. Since $H_{qc,3}(\gamma,\rho)$ is a subarray of $H_{qc,3}$, it also satisfied the q-ary Row-Column constraint.

The null space over GF(q) of $H_{qc,3}(\gamma,\rho)$ gives a q-ary Quasi-Cyclic Low Density Parity Check code $C_{qc,3}$ with code symbols over GF(q) whose Tanner Graph has a girth of at least 6. The code rate and minimum distance of $C_{qc,3}$ are greater than or equal to (ρ−γ)/ρ and ρ+1 (or ρ), respectively. For $q=2^m$, the code $C_{qc,3}$ can be decoded with the q-ary Sum-Product Algorithm (QSum-Product Algorithm) or the Fast Fourier Transform Based q-ary Sum-Product Algorithm (FFT-QSum-Product Algorithm), which is simpler than the QSum-Product Algorithm.

For each field GF(q), we can construct a family of structurally compatible q-ary Quasi-Cyclic Low Density Parity Check codes with different blocklengths and code rates starting with a base code that has parity check matrix $H_{qc,3}(\gamma,\rho)$ given above. Specifically, the method described previously can be employed here to generate this structurally compatible family of codes as follows. Choose a sequence of m distinct pairs of positive integers, $(\gamma_i, \rho_i)$, with 1≤i≤m, such that $1 \leq \gamma_1 \leq \gamma_2 \leq \ldots \leq \gamma_m \leq \gamma$, $1 \leq \rho_1 \leq \rho_2 \leq \ldots \leq \rho_m \leq \rho$. Let $H_{qc,3}(\gamma_i,\rho_i)$ be the $\gamma_i \times \rho_i$ subarray of the base array $H_{qc,3}(\gamma,\rho)$ obtained by deleting (or puncturing) the last $\rho-\rho_i$ columns of the circulant permutation matrices and last $\gamma-\gamma_i$ rows of the circulant permutation matrices from $H_{qc,3}(\gamma,\rho)$. The deleted rows of circulant permutation matrices consist of $(\gamma-\gamma_i)(q-1)$ rows of $H_{qc,3}(\gamma,\rho)$. The deleted columns of circulant permutation matrices consist of $(\rho-\rho_i)(q-1)$ columns. A universal encoder can be implemented in a manner similar to the methods described previously that can adapt to serve as an encoder for each of the codes in this family of structurally compatible q-ary Quasi-Cyclic Low Density Parity Check codes. A universal decoder similar to that described previously can also be implemented based on the Tanner Graphs of the codes in the family.

EXAMPLE 14

Figure 27:
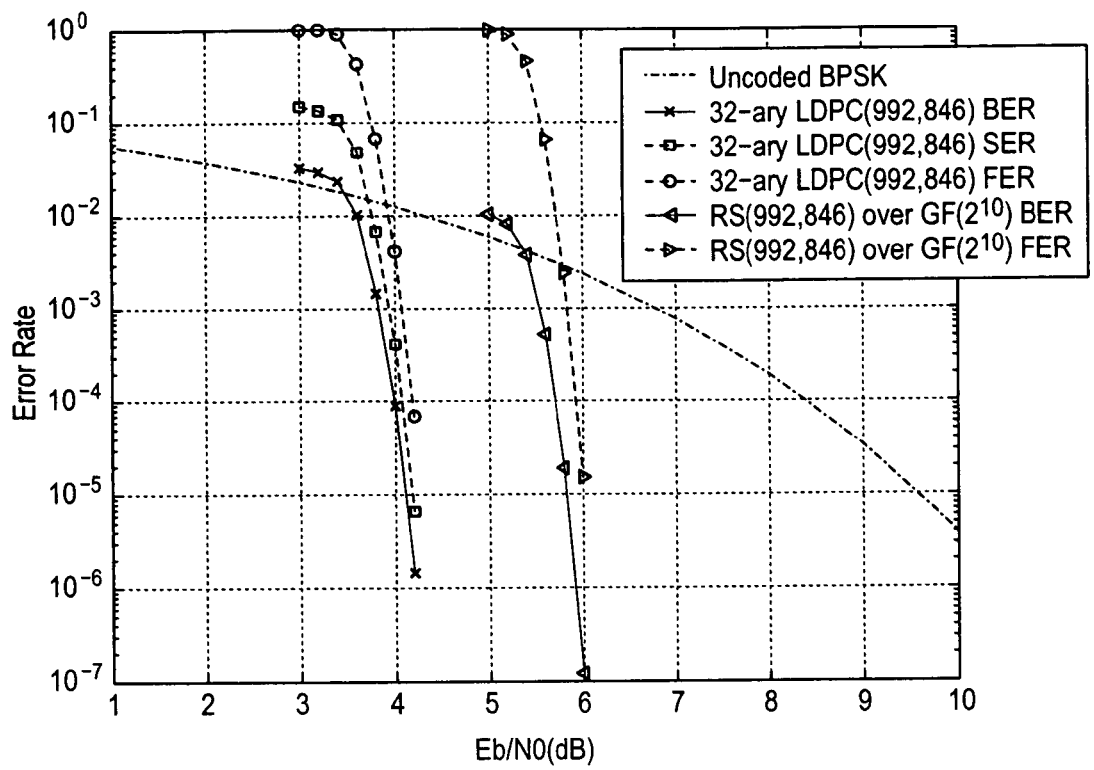
FIG. 27 illustrates the error performance of the (992, 846) 32-ary Low Density Parity Check code over the Additive White Gaussian Noise channel with Binary Phase Shift Keying signaling.

Let $GF(2^5)$ be the field for code construction. Let a be a primitive element of $GF(2^5)$. The 31 non-zero elements of $GF(2^5)$ are $\alpha^0=1, \alpha, \ldots, \alpha^{30}$. The 32-ary M-location vector of each non-zero element $\alpha^k$ is a 31-tuple:

$z(\alpha^k) = (z_0, z_1, \ldots z_{30})$, over $GF(2^5)$ with the i-th component $z_i = \alpha^i$ and all the other 30 components equal to zero. It follows from $G_i$ of equation (54), $B_i^*$ of equation (66), and $H_{qc,3}$ of equation (67) that we can construct a 32-ary Row-Column constrained 32×32 array $H_{qc,3}$ of 32-ary α-multiplied 31×31 circulant permutation matrices. Choose γ=6 and ρ=32. Take the first 6 rows of $H_{qc,3}$ to form a 6×32 subarray $H_{qc,3}$ (6,32). Then $H_{qc,3}$(6,32) is a 186×992 matrix over $GF(2^5)$ with row weight 31 and two column weights, 5 and 6. The null space of this matrix gives a 32-ary (992, 846) Quasi-Cyclic Low Density Parity Check code with a code rate of 0.8528. The performance of this code over the Additive White Gaussian Noise channel with BPSK signaling and decoded using the FFT-QSum-Product Algorithm with 50 iterations is shown in FIG. 27. Also included in FIG. 27 is the performance of the 1024-ary (992,846) shortened Reed Solomon (RS) code over $GF(2^{10})$ with minimum distance 147 (a very powerful code) decoded with the Berlekamp-Massey algorithm. We see that at the BER of $10^{-6}$, the 32-ary (992, 846) Quasi-Cyclic Low Density Parity Check code has a 1.7 dB coding gain over the 1024-ary (992, 846) shortened Reed Solomon code.

EXAMPLE 15

Figure 28:
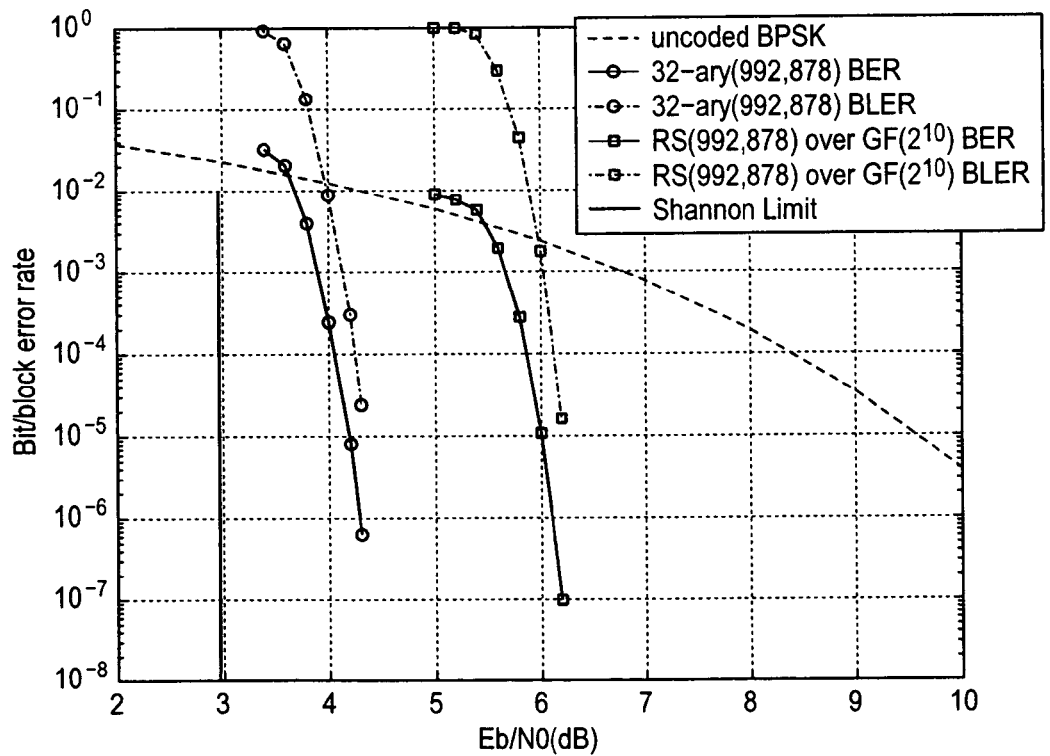
FIG. 28 illustrates the error performance of the (992, 887) 32-ary Low Density Parity Check code over the Additive White Gaussian Noise channel with Binary Phase Shift Keying signaling.

Again, let $GF(2^5)$ be the field for code construction and consider the 32×32 array $H_{qc,3}$ constructed above in Example 14. Suppose we choose γ=4 and ρ=32. Take the first 4 rows of the 32×32 array $H_{qc,3}$ to form a 4×32 subarray $H_{qc,3}$(4,32), which is a 124×992 matrix over $GF(2^5)$. The null space of $H_{qc,3}$(4,32) gives a 32-ary (992, 878) Quasi-Cyclic Low Density Parity Check code with a code rate of 0.885. The performance of this code with BPSK signaling over the Additive White Gaussian Noise channel decoded using the FFT-QSum-Product Algorithm with 50 iterations is shown in FIG. 28. Also included in FIG. 28 is the performance of the (992,878) Reed Solomon (RS) code over $GF(2^{10})$ decoded with the Berlekamp-Massey algorithm. We see that at the BER of $10^{-6}$, the 32-ary (992,878) Quasi-Cyclic Low Density Parity Check code achieves 1.8 dB coding gain over the 1024-ary (992,878) shortened Reed Solomon code.

Since both the (992,846) and (992,878) 32-ary Quasi-Cyclic Low Density Parity Check codes belong to the same structurally compatible family of 32-ary codes constructed based on the field $GF(2^5)$, they can be encoded with a single universal encoder and decoded with a single universal decoder.

What is claimed as new and desired to be protected by Letters Patent of the United States is:

1. A method for providing forward error-correction coding for data that is transmitted from a source to a destination over a communication medium, comprising:
encoding message blocks, u, of said data to codewords, v, as follows: v=uG, where G is a generator matrix; and
using a parity check matrix H to implement a Quasi-Cyclic Low Density Parity Check Code, such that every vector in the row space of the generator matrix G is orthogonal to the rows of parity check matrix H, and parity check matrix H is given as an array of sparse circulant matrices of the same size, comprising:
selecting the parity check matrix H to have constant row and column weights, the number of "1s" in common between any two columns is no greater than one, and the parity check matrix H has a small density of "1s."

2. The method for providing forward error-correction coding of claim 1 wherein the step of using comprises:
selecting said Quasi-Cyclic Low Density Parity Check Code as a linear code for which shifting a codeword a fixed number of bit positions results in another codeword.

3. The method for providing forward error-correction coding of claim 1 wherein a circulant is a square matrix in which each row is the cyclic shift one place to the right of the row above it and the first row is the cyclic shift of the last row.

4. A method for providing forward error-correction coding for data that is transmitted from a source to a destination over a communication medium, comprising:
encoding message blocks, u, of said data to codewords, v, as follows: v=uG, where G is a generator matrix, comprising:
dividing said data into message blocks of k bits each;
mapping each of the message blocks into a unique codeword which consists of a block of n bits, where k<n; and
making every codeword v a linear combination of k basis vectors: $v=u_0 g_0 + u_1 g_1 + \ldots + u_{k-1} g_{k-1}$ to form the k×n generator matrix G, using these linearly independent vectors $g_0 \ldots g_{k-1}$ as its rows; and
using a parity check matrix H to implement a Quasi-Cyclic Low Density Parity Check Code, such that every vector in the row space of the generator matrix G is orthogonal to the rows of parity check matrix H, and parity check matrix H is given as an array of sparse circulant matrices of the same size.

5. A method for providing forward error-correction coding for data that is transmitted from a source to a destination over a communication medium, comprising:
encoding message blocks, u, of said data to codewords, v, as follows: v=uG, where G is a generator matrix; and
using a parity check matrix H to implement a Quasi-Cyclic Low Density Parity Check Code, such that every vector in the row space of the generator matrix G is orthogonal to the rows of parity check matrix H, and parity check matrix H is given as an array of sparse circulant matrices of the same size, comprising:
selecting said Quasi-Cyclic Low Density Parity Check Code from a structurally compatible family of codes to provide code lengths, code rates, and coding gain performances that are adaptable to changing conditions, wherein said changing conditions include: channel and storage medium conditions, error performance requirements, and information message throughput requirements.

6. The method for providing forward error-correction coding of claim 5 wherein the step of selecting comprises:
defining said selected Quasi-Cyclic Low Density Parity Check Code $C_{qc}(c,t)$ as the null space of a parity check matrix $H_{qc}(c, t)$, which is a c×t array of b×b circulants over the binary Galois field GF(2) of the form given by:

$$H_{qc}(c, t) = \begin{bmatrix} A_{1,1} & A_{1,2} & \cdots & A_{1,t} \\ A_{2,1} & A_{2,2} & \cdots & A_{2,t} \\ \vdots & \vdots & \ddots & \vdots \\ A_{c,1} & A_{c,2} & \cdots & A_{c,t} \end{bmatrix};$$

choosing any sequence of m distinct pairs of positive integers, $(c_i, t_i)$, with $1 \le i \le m$, such that $1 \le c_1 \le c_2 \le \ldots \le c_m \le c$, and $1 \le t_1 \le t_2 \le \ldots \le t_m \le t$;
let $H_{qc}(c_i, t_i)$ be the $c_i \times t_i$ subarray of the array $H_{qc}(c, t)$ of circulants of said selected Quasi-Cyclic Low Density Parity Check Code obtained by deleting the last $t-t_i$ columns and the last $c-c_i$ rows of b×b circulant matrices; and
let $C(c_i, t_i)$ be the null space of the matrix $H_{qc}(c_i, t_i)$ for each of said sequence of m distinct pairs of positive integers, forming a member of said structurally compatible family $C_{qc}(c,t), C(c_1, t_1), \ldots, C(c_m, t_m)$ of codes for each of said sequence of m distinct pairs of positive integers.

7. The method for providing forward error-correction coding of claim 6 using a Quasi-Cyclic Low Density Parity Check Code $C_{qc}$ with parity check matrix $H_{qc}$ wherein said step of using comprises:
forming said generator matrix where the rank $r_H$ of $H_{qc}$ is equal to cb, assume that the columns of circulants of $H_{qc}$ are arranged in such a way that the rank of the following c×c subarray of $H_{qc}$, $$D = \begin{bmatrix} A_{1,t-c+1} & A_{1,t-c+2} & \cdots & A_{1,t} \\ A_{2,t-c+1} & A_{2,t-c+2} & \cdots & A_{2,t} \\ \vdots & \vdots & \ddots & \vdots \\ A_{c,t-c+1} & A_{c,t-c+2} & \cdots & A_{c,t} \end{bmatrix},$$

is equal to cb, the same as the rank $r_H$ of $H_{qc}$;
assume that the first (t−c)b columns of $H_{qc}$ correspond to the (t−c)b information bits;
wherein the desired generator matrix of the code $C_{qc}$ has the following systematic form:

$$G_{qc} = \begin{bmatrix} G_1 \\ G_2 \\ \vdots \\ G_{t-c} \end{bmatrix}$$

$$= \begin{bmatrix} I & O & \cdots & O & | & G_{1,1} & G_{1,2} & \cdots & G_{1,c} \\ O & I & \cdots & O & | & G_{2,1} & G_{2,2} & \cdots & G_{2,c} \\ \vdots & \vdots & \ddots & \vdots & | & \vdots & \vdots & \ddots & \vdots \\ O & O & \cdots & I & | & G_{t-c,1} & G_{t-c,2} & \cdots & G_{t-c,c} \end{bmatrix}$$

$$= [I_{(t-c)b} P],$$

where I is a b×b identity matrix, O is a b×b zero matrix, and $G_{i,j}$ with $1 \leq i \leq t-c$ and $1 \leq j \leq c$ is a b×b circulant; and
wherein for $G_{qc}$ to be a generator matrix of $C_{qc}$ is that $H_{qc}G_{qc}^T=[O]$, where [O] is a Cb×(t−c)b zero matrix.

8. A method for providing forward error-correction coding for data comprising an information sequence that is transmitted from a source to a destination over a communication medium, comprising:

encoding message blocks, u, of said information sequence a to codewords, v, as follows: v=uG, where G is a generator matrix; and using a parity check matrix H to implement a Quasi-Cyclic Low Density Parity Check Code, such that every vector in the row space of the generator matrix G is orthogonal to the rows of parity check matrix H, and parity check matrix H is given as an array of sparse circulant matrices of the same size, comprising:

dividing the information sequence a into (t−c) sections of equal length of b consecutive information bits;

selecting the codeword for the information sequence a as v=a $G_{qc}$, which has the following systematic form: v=(a, $p_1$, $p_2$, ..., $p_c$), where for $1 \leq j \leq c$, $p_j=(p_{j,1}, p_{j,2}, \ldots, p_{j,b})$ is a section of b parity-check bits, wherein it follows from v=a $G_{qc}$ that:

$$p_j = \sum_{i=1}^{t-c} a_i G_{i,j}$$

for $1 \leq j \leq c$, and for $0 \leq l \leq b$, let $g_{i,j}^{(l)}$ be the l-th (right) cyclic shift of the generator $g_{i,j}$, with $g_{i,j}^{(0)}=g_{i,j}^{(b)}=g_{i,j}$; then for $1 \leq i \leq t-c$, $a_i G_{i,j} = a_{(i-1)b+1} g_{i,j}^{(0)} + a_{(i-1)b+2} g_{i,j}^{(1)} + \ldots + a_{ib} g_{i,j}^{(b-1)}$, for $1 \leq k < t-c$, at the k-th step, the accumulated sum, $s_{k,j} = a_1 G_{1,j} + a_2 G_{2,j} + \ldots + a_k G_{k,j}$, is formed and stored in a register;

compute, at the (k+1)th step, the partial sum $a_{k+1} G_{k+1,j}$ from equation:

$a_{k+1}G_{k+1,j} = a_{kb+1}g_{k+1,j}^{(0)} + a_{kb+2}g_{k+1,j}^{(1)} + \ldots + a_{(k+1)b}g_{k+1,j}^{(b-1)}$, and add the partial sum to $s_{k,j}$ to form the next accumulated sum $s_{k+1,j}$; and at the end of (t−c)-th step, the accumulated sum $s_{t-c,j}$ gives the j-th parity section $p_j$.

9. A method for providing forward error-correction coding for data that is transmitted from a source to a destination over a communication medium, comprising:

encoding message blocks, u, of said data to codewords, v, as follows: v=uG, where G is a generator matrix; and using a parity check matrix H to implement a Quasi-Cyclic Low Density Parity Check Code, such that every vector in the row space of the generator matrix G is orthogonal to the rows of parity check matrix H, and parity check matrix H is given as an array of sparse circulant matrices of the same size, comprising:

decoding said coded data using a Bit Flipping decoding algorithm, comprising:

(a) Compute the parity check sums (syndrome bits), and if all the parity check equations are satisfied (i.e., all the syndrome bits are zero), stop the decoding;

(b) Find the number of unsatisfied parity check equations for each code bit position, denoted $f_i$, i=0, 1, ..., n−1;

(c) Identify the set of bits for which $f_i$ is the largest;

(d) Flip the bits in set, and (e) Repeat steps (a) to (d) until all the parity check equations are satisfied or a predefined maximum number of iterations is reached.

10. A method for providing forward error-correction coding for data that is transmitted from a source to a destination over a communication medium, comprising:

encoding message blocks, u, of said data to codewords, v, as follows: v=uG, where G is a generator matrix; and using a parity check matrix H to implement a Quasi-Cyclic Low Density Parity Check Code, such that every vector in the row space of the generator matrix G is orthogonal to the rows of parity check matrix H, and parity check matrix H is given as an array of sparse circulant matrices of the same size, comprising:

decoding said coded data using a Weighted Bit Flipping decoding algorithm, comprising:

denoting $z=(z_0, z_1, \ldots, z_{n-1})$ to be the hard decisions sequence obtained from the soft-decision received sequence $y=(y_0, y_1, \ldots, y_{n-1})$, where $$z_j = \begin{cases} 1, & \text{for } y_j > 0, \\ 0, & \text{for } y_j \leq 0, \end{cases}$$

(a) Compute the check sums, and if all the parity check equations are satisfied, stop the decoding;

(b) Compute $E_l$, for $0 \leq l \leq n-1$ for the soft-decision received sequence $y=(y_0, y_1, \ldots, y_{n-1})$:

$$E_l = \sum_{s_j^{(l)} \in S_l} (2s_j^{(l)} - 1) \cdot |y_j|_{min}^{(l)}$$

where $|y_j|_{min}^{(l)} = \min \{|y_i|: 0 \leq i \leq n-1, h_{j,i}^{(l)}=1\}$ and where $S_l$ is the set of check sums $s_j^{(l)}$ orthogonal on code bit-position l;

(c) Find the bit position l for which $E_l$ is the largest;

(d) Flip the bit $z_l$, and (e) Repeat steps (a) to (d), wherein this process of bit flipping continues until all the parity check equations are satisfied or a preset maximum number of iterations is reached.

11. A method for providing forward error-correction coding for data that is transmitted from a source to a destination over a communication medium, comprising:

encoding message blocks, u, of said data to codewords, v, as follows: v=uG, where G is a generator matrix; and using a parity check matrix H to implement a Quasi-Cyclic Low Density Parity Check Code, such that every vector in the row space of the generator matrix G is orthogonal to the rows of parity check matrix H, and parity check matrix H is given as an array of sparse circulant matrices of the same size, comprising:

decoding said coded data using a Sum-Product Algorithm decoding algorithm, comprising:

(a) Set i=0 and the maximum number of iterations to $I_{max}$;

(b) For every pair (j,l) such that $h_{j,l}=1$ with $1 \leq j \leq J$ and $0 \leq l \leq n-1$, set $q_{j,l}^{0,(0)}=p_l^0=Pr(v_l=0)$ and $q_{j,l}^{1,(0)}=p_l^1=Pr(v_l=1)$, (c) For $0 \leq l \leq n-1, 1 \leq j \leq J$ and each $h_l \in A_l$, compute the probabilities, $\sigma_{j,l}^{0,(i)}$ and $\sigma_{j,l}^{1,(i)}$, where $A_l$ is the set of rows of the parity check matrix H that are orthogonal to code bit $v_l$.

(d) For $0 \leq l \leq n-1, 1 \leq j \leq J$ and each $h_j \epsilon A_l$, compute the values of $q_{j,l}^{0,(i+1)}$ and $q_{j,l}^{1,(i+1)}$ and the values of $P^{(i+1)}(v_j=0|y)$ and $P^{(i+1)}(v_j=1|y)$; then form $z^{(i+1)}$, test $z^{(i+1)} \cdot H^T$, and if $z^{(i+1)} \cdot H^T = 0$ or the maximum iteration number $I_{max}$ is reached, go to Step (e); otherwise, set $i := i+1$ and go to Step (c), and (e) Output $z^{(i+1)}$ as the decoded codeword and stop the decoding process.

12. A method for providing forward error-correction coding for data that is transmitted from a source to a destination over a communication medium, comprising:

encoding message blocks, u, of said data to codewords, v, as follows: v=uG, where G is a generator matrix; and using a parity check matrix H to implement a Quasi-Cyclic Low Density Parity Check Code, such that every vector in the row space of the generator matrix G is orthogonal to the rows of parity check matrix H, and parity check matrix H is given as an array of sparse circulant matrices of the same size, comprising:

decoding said coded data using a Double-Weighted Bit Flipping decoding algorithm, comprising:

denoting $z=(z_0, z_1, \ldots, z_{n-1})$ to be the hard decisions sequence obtained from the soft-decision received sequence $y=(y_0, y_1, \ldots, y_{n-1})$, where $$z_j = \begin{cases} 1, & \text{for } y_j > 0, \\ 0, & \text{for } y_j \leq 0, \end{cases}$$

computing the syndrome $s=(s_0, s_1, \ldots, s_{n-1})$ for the sequence z given by $s=zH^T$, stop the decoding if all parity equations are satisfied, otherwise, $s \neq 0$, define $r=(r_0, r_1, \ldots, r_{n-1})$, where $r_j=|y_j|$, for each check-sum record the largest and the smallest values among the received soft-decision sequence y that is related to check-sum $s_j$, where $1 \leq j \leq J$, for $1 \leq j \leq J$, denote $K(j)=\{0 \leq i \leq n-1 : h_{j,i}=1\}$, and let $U_j = \max\{|y_i| : i \epsilon K(j)\}$ and $L_j = \min\{|y_i| : i \epsilon K(j)\}$ be the largest and the smallest soft-decision samples respectively corresponding to the check-sum $s_j$, calculate a weighted check sum $T_l$ for every bit position l, $0 \leq l \leq n-1$, by performing the following computation:

$$T_l = \sum_{j \in M(l)} T_{j,l} R_{j,l}$$

where $M(l)=\{1 \leq j \leq J : h_{j,l}=1\}$
where $$R_{j,l} = \left(1 + \exp\left(\frac{-4 \min_{i \in N(j)/l} |y_i|}{N_0}\right)\right)^{-1}$$

where $N(j)=\{i : h_{j,i}=1\}$ flip the bit in $z_j$ with smallest $T_j$ value, recompute the syndrome $s=zH^T$ for this bit-flipped sequence z, and if s=0, stop the decoding; otherwise, repeat this iteration step if the number of iterations is less than the preset maximum allowable number of iterations.

13. A method for providing forward error-correction coding for data that is transmitted from a source to a destination over a communication medium, comprising:

encoding message blocks, u, of said data to codewords, v, as follows: v=uG, where G is a generator matrix; and using a parity check matrix H to implement a Quasi-Cyclic Low Density Parity Check Code, such that every vector in the row space of the generator matrix G is orthogonal to the rows of parity check matrix H, and parity check matrix H is given as an array of sparse circulant matrices of the same size, comprising:

selecting, where q>2, said Quasi-Cyclic Low Density Parity Check Code as a q-ary linear code over the Galois field GF(q) for which shifting a codeword a fixed number of bit positions results in another codeword.

14. The method for providing forward error-correction coding of claim 13 wherein the step of using comprises:

selecting the q-ary parity check matrix H to have constant row and column weights, no two rows or two columns of the parity check matrix H have more than one position at which both have nonzero components in the Galois field GF(q), and the parity check matrix H has a small density of non-zero components.

15. The method for providing forward error-correction coding of claim 14 wherein said step of encoding comprises:

dividing said data into message blocks represented by a k-tuple $u=(u_0, \ldots, u_{k-1})$, where each message symbol $u_i$ is an element of the Galois field GF(q);

mapping each of the message blocks into a unique codeword which is an n-tuple $v=(v_0, \ldots, v_{n-1})$, and each code symbol $v_j$ is an element of the Galois field GF(q); and making the set of codewords v a k-dimensional subspace of the vector space of all the n-tuples over the Galois field GF(q) to form the k×n generator matrix G over the Galois field GF(q).

16. A method for providing forward error-correction coding for data that is transmitted from a source to a destination over a communication medium, comprising:

encoding message blocks, u, of said data to codewords, v, as follows: v=uG, where G is a generator matrix; and using a parity check matrix H to implement a Quasi-Cyclic Low Density Parity Check Code, such that every vector in the row space of the generator matrix G is orthogonal to the rows of parity check matrix H, and parity check matrix H is given as an array of sparse circulant matrices of the same size, comprising:

selecting, where q>2, said Quasi-Cyclic Low Density Parity Check Code as a q-ary linear code over the Galois field GF(q) from a structurally compatible family of codes, all of which can be encoded using one universal encoder and decoded using one universal decoder.

17. A method for providing forward error-correction coding for data that is transmitted from a source to a destination over a communication medium, comprising:

encoding message blocks, u, of said data to codewords, v, as follows: v=uG, where G is a generator matrix; and using a parity check matrix H to implement a Quasi-Cyclic Low Density Parity Check Code, such that every vector in the row space of the generator matrix G is orthogonal to the rows of parity check matrix H, and parity check matrix H is given as an array of sparse circulant matrices of the same size, comprising:

selecting said Quasi-Cyclic Low Density Parity Check Code from a structurally compatible family of codes, all of which can be encoded using one universal encoder and decoded using one universal decoder.

* * * * *